US009576917B1

(12) United States Patent
Huemoeller et al.

(10) Patent No.: US 9,576,917 B1
(45) Date of Patent: Feb. 21, 2017

(54) EMBEDDED DIE IN PANEL METHOD AND STRUCTURE

(71) Applicant: Amkor Technology, Inc., Chandler, AZ (US)

(72) Inventors: Ronald Patrick Huemoeller, Gilbert, AZ (US); Curtis Zwenger, Chandler, AZ (US); David Jon Hiner, Chandler, AZ (US); Corey Reichman, Mesa, AZ (US)

(73) Assignee: Amkor Technology, Inc., Tempe, AZ (US)

( * ) Notice: Subject to any disclaimer, the term of this patent is extended or adjusted under 35 U.S.C. 154(b) by 77 days.

(21) Appl. No.: 14/082,333

(22) Filed: Nov. 18, 2013

(51) Int. Cl.
*H01L 21/48* (2006.01)
*H01L 23/00* (2006.01)
*H01L 23/498* (2006.01)
*H01L 21/762* (2006.01)
*H01L 23/538* (2006.01)

(52) U.S. Cl.
CPC .............. *H01L 24/03* (2013.01); *H01L 21/48* (2013.01); *H01L 21/76251* (2013.01); *H01L 23/49816* (2013.01); *H01L 23/5383* (2013.01); *H01L 24/80* (2013.01)

(58) Field of Classification Search
CPC ........ H01L 21/48; H01L 23/48; H01L 23/485; H01L 23/488; H01L 23/5383; H01L 23/5384; H01L 24/03; H01L 24/80; H01L 24/81
See application file for complete search history.

(56) References Cited

U.S. PATENT DOCUMENTS

| 7,982,297 | B1* | 7/2011 | Heo | H01L 21/565 257/684 |
| 2007/0056766 | A1* | 3/2007 | Sunohara | H01L 23/5385 174/260 |
| 2009/0000109 | A1* | 1/2009 | Ozono | H01L 21/67132 29/740 |
| 2009/0200662 | A1* | 8/2009 | Ng | H01L 21/486 257/723 |
| 2010/0052186 | A1* | 3/2010 | Appelt | H01L 25/105 257/777 |
| 2011/0241197 | A1* | 10/2011 | Theuss | B81C 1/00238 257/693 |
| 2012/0228754 | A1* | 9/2012 | Liu et al. | H01L 23/13 257/676 |
| 2012/0267782 | A1* | 10/2012 | Chen | H01L 23/3128 257/738 |

* cited by examiner

Primary Examiner — Michele Fan
(74) Attorney, Agent, or Firm — McAndrews, Held & Malloy, Ltd.

(57) ABSTRACT

Methods for an embedded die panel are disclosed and may include fabricating a first layered structure by: forming first redistribution layers on a first carrier, forming a first dielectric layer on the first redistribution layers and carrier, forming a mask pattern on the first dielectric layer exposing a portion of the first dielectric layer, forming a second dielectric layer on the exposed portion of the first dielectric layer, forming vias in the first and second dielectric layers, and forming second redistribution layers on the second dielectric layer. The mask pattern may be removed forming a die cavity defined by the second dielectric layer. A second layered structure coupled to the first layered structure may be formed comprising a second carrier, a third dielectric layer, third and fourth redistribution layers on opposite surfaces of the third dielectric layer, and a semiconductor die.

20 Claims, 75 Drawing Sheets

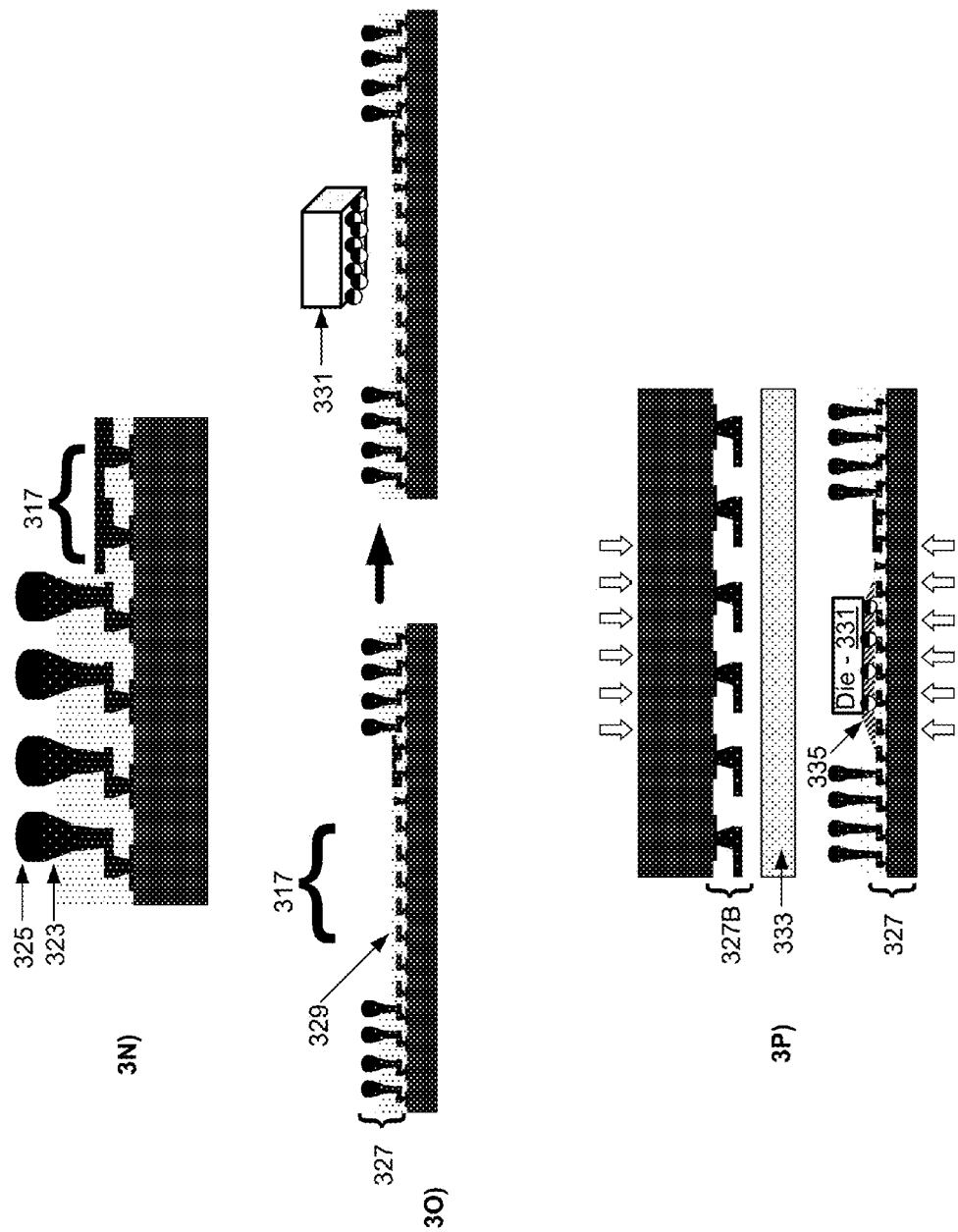

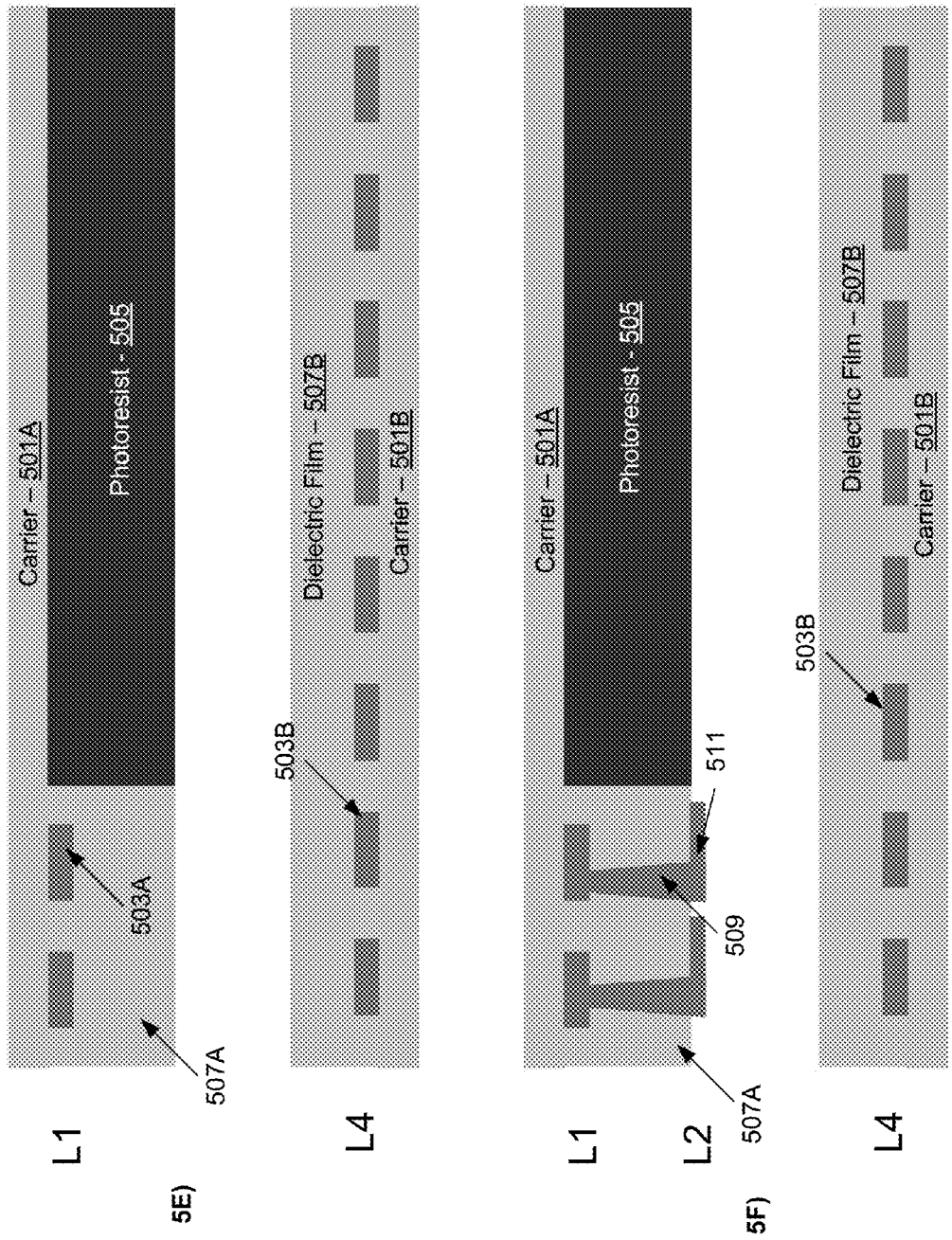

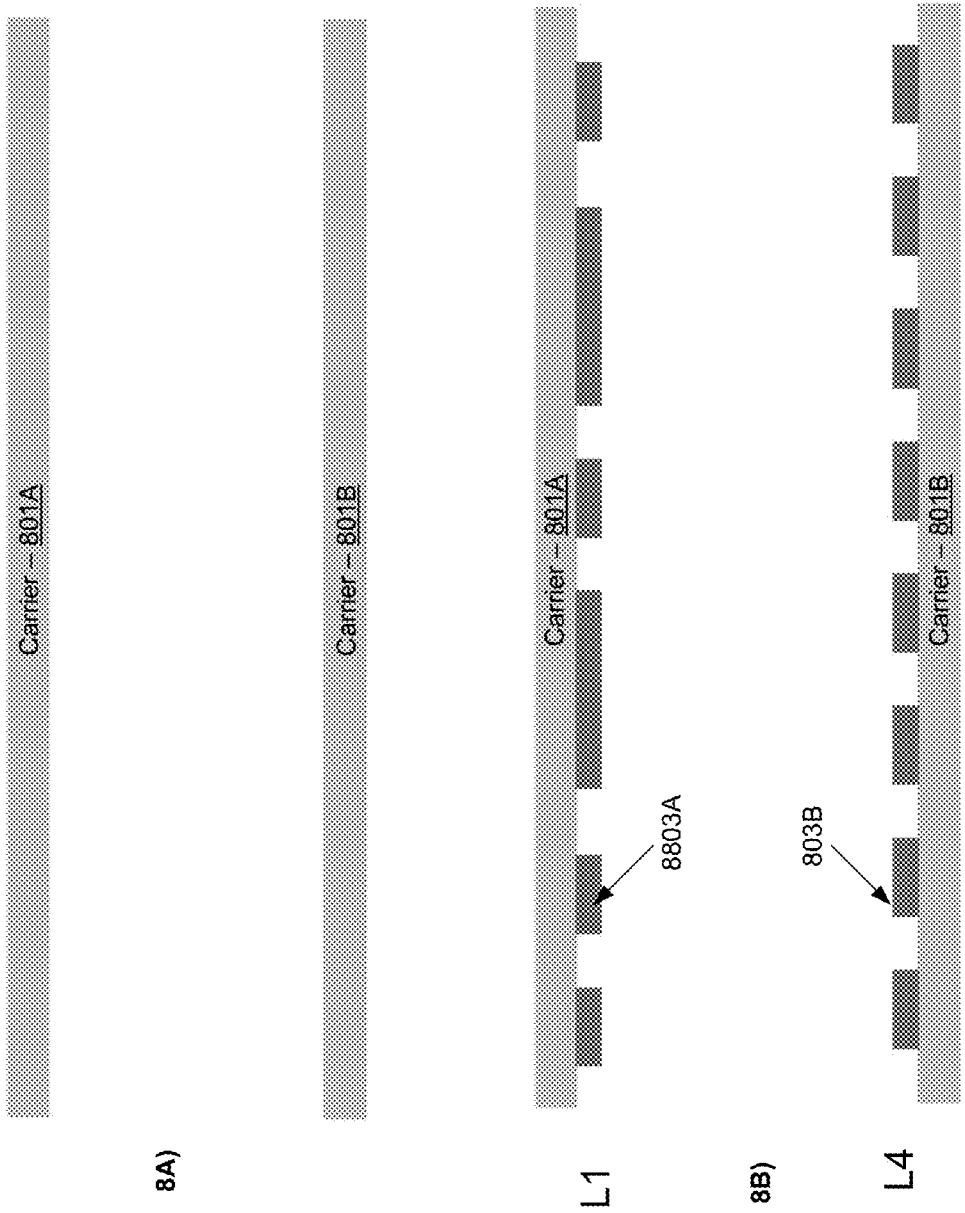

EMBEDDED DIE IN PANEL METHOD AND STRUCTURE

FIELD OF THE INVENTION

Certain embodiments of the invention relate to semiconductor chip packaging. More specifically, certain embodiments of the invention relate to an embedded die in panel method and structure.

BACKGROUND OF THE INVENTION

Semiconductor packaging protects integrated circuits, or chips, from physical damage and external stresses. In addition, it can provide a thermal conductance path to efficiently remove heat generated in a chip, and also provide electrical connections to other components such as printed circuit boards, for example. Materials used for semiconductor packaging typically comprise ceramic or plastic, and form-factors have progressed from ceramic flat packs and dual in-line packages to pin grid arrays and leadless chip carrier packages, among others.

Further limitations and disadvantages of conventional and traditional approaches will become apparent to one of skill in the art, through comparison of such systems with the present invention as set forth in the remainder of the present application with reference to the drawings.

DETAILED DESCRIPTION OF THE INVENTION

Certain aspects of the invention may be found in an embedded die in panel method and structure. Example aspects of the invention may comprise fabricating a first layered structure by: forming first redistribution layers on a first carrier, forming a first dielectric layer on the first redistribution layers and carrier, forming a mask pattern on the first dielectric layer exposing a portion of the first dielectric layer, forming a second dielectric layer on the exposed portion of the first dielectric layer, forming vias in the first and second dielectric layers, forming second redistribution layers on the second dielectric layer, wherein the vias couple the first redistribution layers to the second redistribution layers; and removing the mask pattern thereby forming a die cavity defined by the second dielectric layer. A second layered structure may be formed comprising a second carrier, a third dielectric layer, third redistribution layers on a first surface of the third dielectric layer and fourth redistribution layers on a second surface of the third dielectric layer. A semiconductor die may be bonded to the second layered structure. The first layered structure may be coupled to the second layered structure, thereby embedding the semiconductor die in the formed cavity in the first layered structure. The carrier may be removed from the first layered structure and the second carrier may be removed from the second layered structure. The semiconductor die may be electrically coupled to the second layered structure utilizing the third redistribution layers on the third dielectric layer. The second layered structure may be bonded to the first layered structure utilizing an adhesive layer. The first layered structure may be electrically coupled to the second layered structure utilizing copper pillars formed on the second redistribution layers on the first layered structure. The first layered structure may be electrically coupled to the second layered structure utilizing copper pillars formed on the third redistribution layers on the second layered structure. The first and second carriers may comprise a conductive plate, or an etchable or peelable material. The first, second, and third dielectric layers may be ablated to form the vias and second and third redistribution layers. The first and third dielectric layers may comprise one or more of a glass cloth film and a deposited dielectric material. The second dielectric layer may comprise a pre-formed dielectric film. The redistribution layers may comprise electroless copper.

Figure 1:
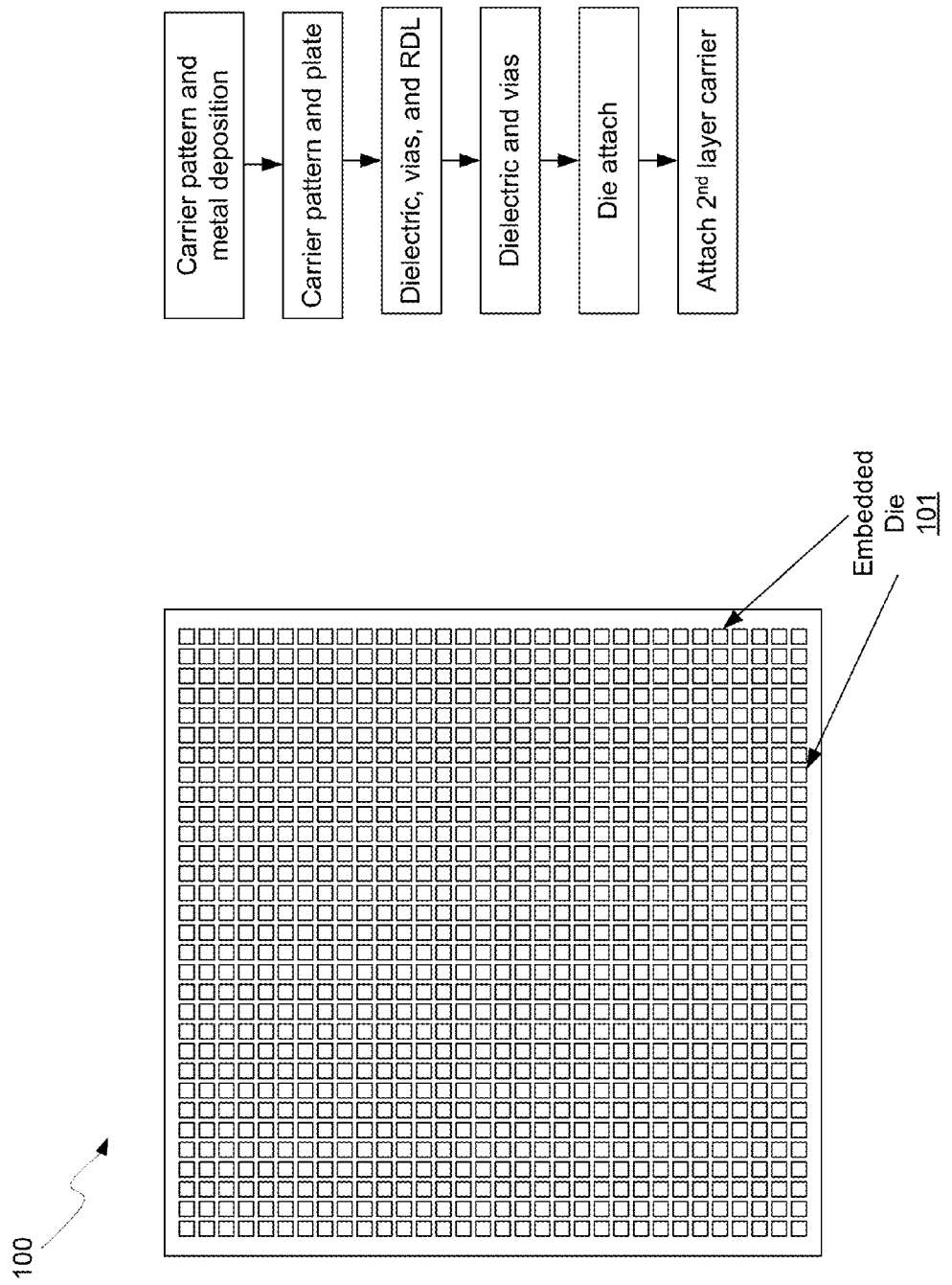
FIG. 1 is a drawing illustrating integrated circuit die embedded in a panel, in accordance with an example embodiment of the invention.

FIG. 1 is a drawing illustrating integrated circuit die embedded in a panel, in accordance with an example embodiment of the invention. Referring to FIG. 1, there is shown a panel 100 comprising a plurality of embedded die 101.

The embedded die 101 may comprise integrated circuit die that have been separated from one or more semiconductor wafers, where the separated die are embedded in a package platform, or layered structure, without the need for an interposer. The embedded die 101 may comprise electrical circuitry such as digital signal processors (DSPs), network processors, power management units, audio processors, RF circuitry, wireless baseband system-on-chip (SoC) processors, sensors, and application specific integrated circuits, for example.

The packaging platform or layered structure may be formed according to the flow chart in FIG. 1, starting with a carrier that may be patterned and plated with a plate barrier metal. The carrier may comprise a conductive plate or an etchable or peelable material, for example. A dielectric layer may be deposited or placed thereon and vias may be ablated into the dielectric layer before redistribution layers (RDLs) may be formed on the ablated dielectric. Another dielectric layer may be deposited and vias and a die open area may be formed therein. The die may then be attached and another carrier with a formed layered structure may be sandwiched on the formed structure with the attached die, resulting in the panel 100. These process steps are shown further with respect to FIGS. 2-4.

Figure 2A:
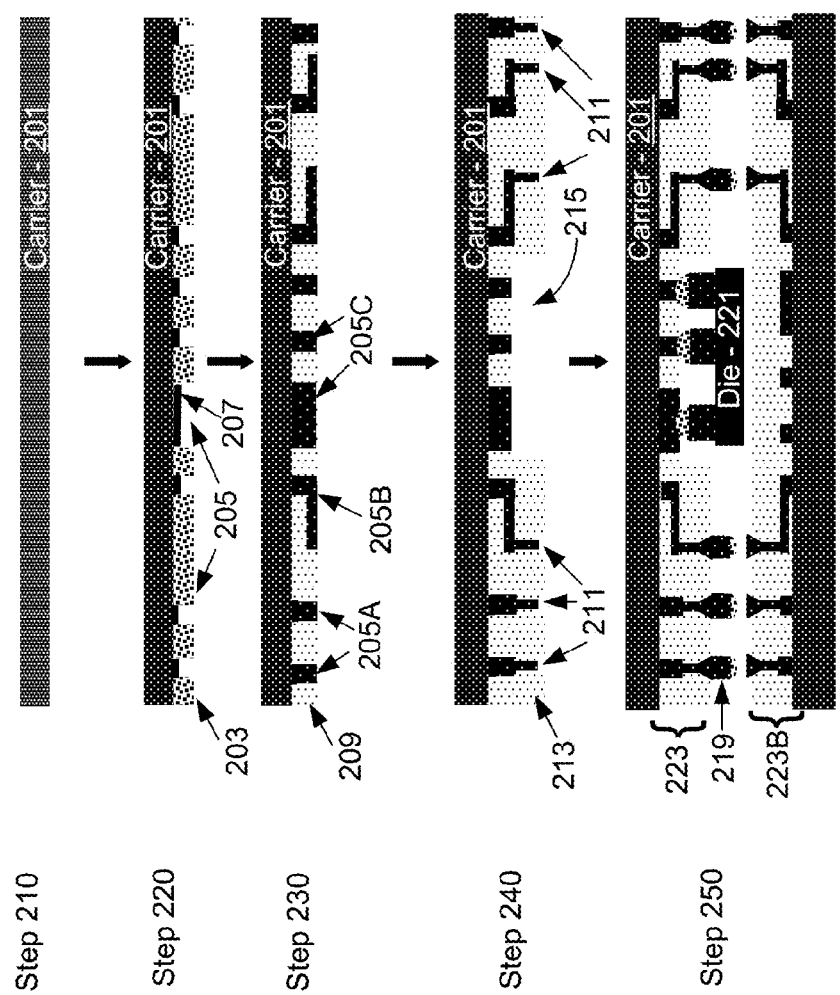
FIG. 2A is a drawing illustrating exemplary steps in fabricating an embedded die in panel structure, in accordance with an example embodiment of the invention.

FIG. 2A is a drawing illustrating exemplary steps in fabricating an embedded die in panel structure, in accordance with an example embodiment of the invention. Referring to FIG. 2A, there are shown packaging process steps 210-250 for generating an embedded die in panel structure.

The process may begin in step 210 with a carrier 201, which may comprise a conductive plate of material such as copper or aluminum, for example. In instances where the carrier 201 is non-conductive, a metal path may be created by forming a hole in the carrier 201 via laser, punch or mechanical means, and then metalized to create a "rivet" structure that provides a conductive path. In step 220, a photoresist layer 203 may be deposited and patterned, such as with a photolithography process, for example, to form exposed regions 205. The exposed regions 205 may be plated with metal to form a plate barrier layer 207, which may comprise nickel or tin, for example.

In step 230, a dielectric layer 209 may be deposited or attached as a polymer film, for example, to provide structural support and electrical isolation between various conductive layers. The dielectric layer 209 may be patterned utilizing a photolithography process, for example, to expose the plate barrier layers 207 and to provide paths for the redistribution layers (RDLs) 205B to be formed. The vias 205A, RDLs 205B, and bonding pads 205C may be deposited or plated on the dielectric layer 209 and on the plate barrier layer 207. The vias 205A, RDLs 205B, and bonding pads 205C may comprise electroless copper and/or plate copper layers that may be reduced at the surface of the dielectric layer 209 utilizing chemical etching or mechanical polishing, for example.

In step 240, another dielectric layer 213 may be deposited or placed on the dielectric layer 209. The dielectric layer 213 may be patterned utilizing photolithography and/or laser ablation to form openings for the vias 211 and the open die area 215 in which one or more semiconductor die may subsequently be placed. Another electroless copper and/or plate copper layer may be formed in the openings formed in the dielectric layer 213, thereby forming the extended vias 211. The surface copper may again be reduced utilizing chemical etching or mechanical polishing so that the exposed surface of the metal may be within the dielectric layer 213, i.e. above the bottom surface of the dielectric layer 213 in FIG. 2. In addition, laser ablation may be utilized to form openings for the vias 211, or may be utilized to ablate the dielectric layer 213 below the tops of the extended vias 211.

In step 250, a non-conductive paste may be utilized to bond a semiconductor die 221 comprising conductive bumps to the bonding pads 205C. Similarly, conductive bumps 219 may be formed on the vias 211 resulting in the layered structure 221. The conductive bumps 219 may be for making electrical contact to another layered structure 223B, which may be similar to the layered structure 223 formed in steps 210-240. The layered structure 223B may be affixed to the layered structure 223 utilizing a non-conductive film.

Figure 2B:
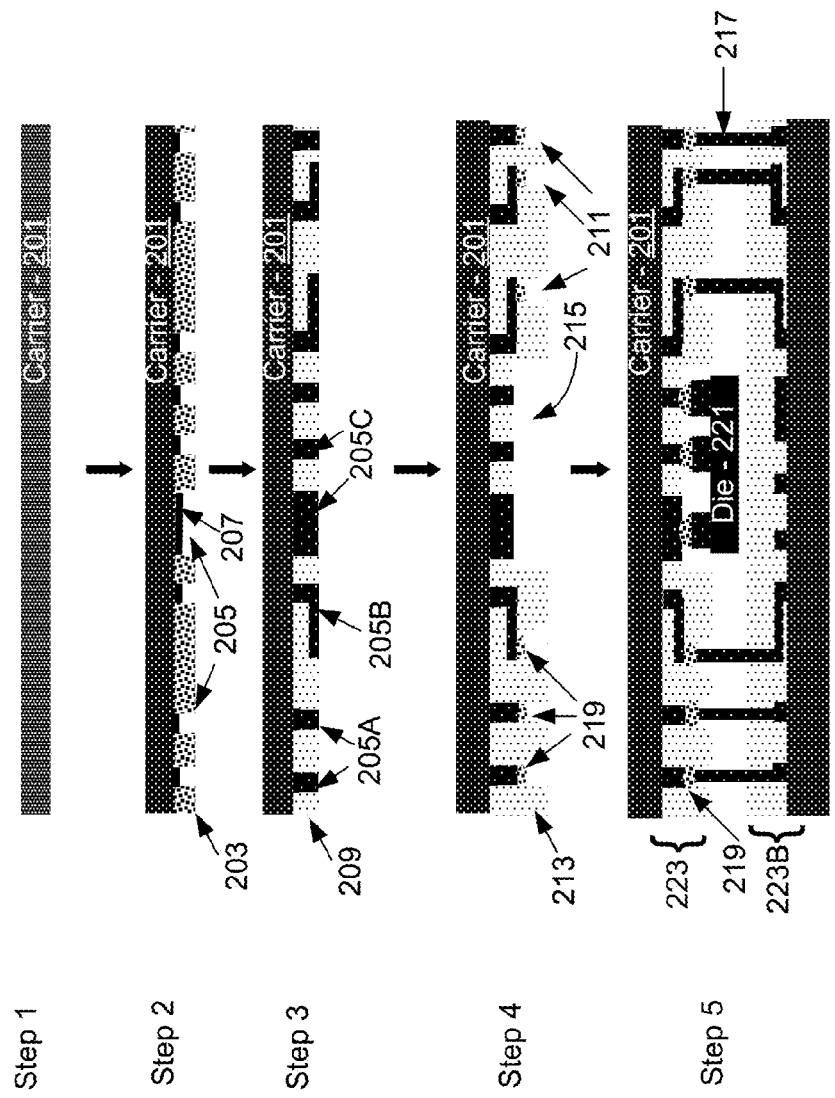
FIG. 2B is a drawing illustrating exemplary steps for fabricating an alternative embodiment of embedded die in a panel structure, in accordance with an example embodiment of the invention.

FIG. 2B is a drawing illustrating exemplary steps for fabricating an alternative embodiment of embedded die in a panel structure, in accordance with an example embodiment of the invention. Referring to FIG. 2B, there are shown packaging process steps 1-5 for generating an embedded die in panel structure.

The process may begin in step 1 with a carrier 201, which may comprise a conductive plate of material such as copper or aluminum, for example, as described with respect to FIG. 2A. In step 2, a photoresist layer 203 may be deposited and patterned, such as with a photolithography process, for example, to form exposed regions 205. The exposed regions 205 may be plated with metal to form a plate barrier layer 207, which may comprise nickel or tin, for example.

In step 3, a dielectric layer 209 may be deposited or attached as a polymer film, for example, to provide structural support and electrical isolation between various conductive layers. The dielectric layer 209 may be patterned utilizing a photolithography process, for example, to expose the plate barrier layers 207 and to provide paths for the redistribution layers (RDLs) 205B to be formed. The vias 205A, RDLs 205B, and bonding pads 205C may be deposited or plated on the dielectric layer 209 and on the plate barrier layer 207. The vias 205A, RDLs 205B, and bonding pads 205C may comprise electroless copper and/or plate copper layers that may be reduced at the surface of the dielectric layer 209 utilizing chemical etching or mechanical polishing, for example.

In step 4, another dielectric layer 213 may be deposited or placed on the dielectric layer 209. The dielectric layer 213 may be patterned utilizing photolithography and/or laser ablation to form openings, or wells 211 for the vias 205A and the open die area 215 in which one or more semiconductor die may subsequently be placed. In an another example scenario, the dielectric layer 213 may comprise a pre-formed material with openings corresponding to the vias 205A, RDLs 205B, and bonding pads 205C. In addition conductive bumps 219 may be formed on the vias 205A and RDLs 205B. The conductive bumps 219 may be for making electrical contact to another layered structure 223B, In step 5, a non-conductive paste may be utilized to bond a semiconductor die 221 comprising conductive bumps to the bonding pads 205C, which may be similar to the layered structure 223 formed in steps 1-4, but with extended pillars 217. The layered structure 223B may be affixed to the layered structure 223 utilizing a non-conductive film, for example.

The example embodiment shown in FIG. 2B may be an alternative to the process steps shown with respect to FIG. 2A, in that copper pillars may not be formed on the first layered structure 223, but instead on the layered structure 223B, whereas wells 211 formed in the dielectric layer 213 are provided for the extended pillars 217 to make electrical contact to the layered structure 223.

Figure 2C:
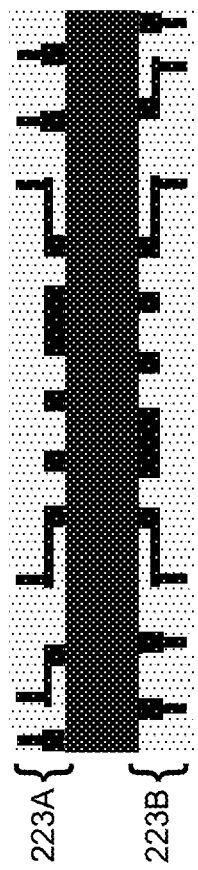
FIG. 2C illustrates a dual-side processed panel structure, in accordance with an embodiment of the invention.

FIG. 2C illustrates a dual-side processed panel structure, in accordance with an embodiment of the invention. In the example scenario shown, layered structures 223A and 223B comprising dielectric and metal layers, similar to the layered structure 223 shown in FIGS. 2A and 2B, may be formed on both sides of the metal carrier 201. In this manner, a high density of embedded die structures may be processed concurrently, reducing manufacturing costs and cycle times.

Figures 2D, 2E:
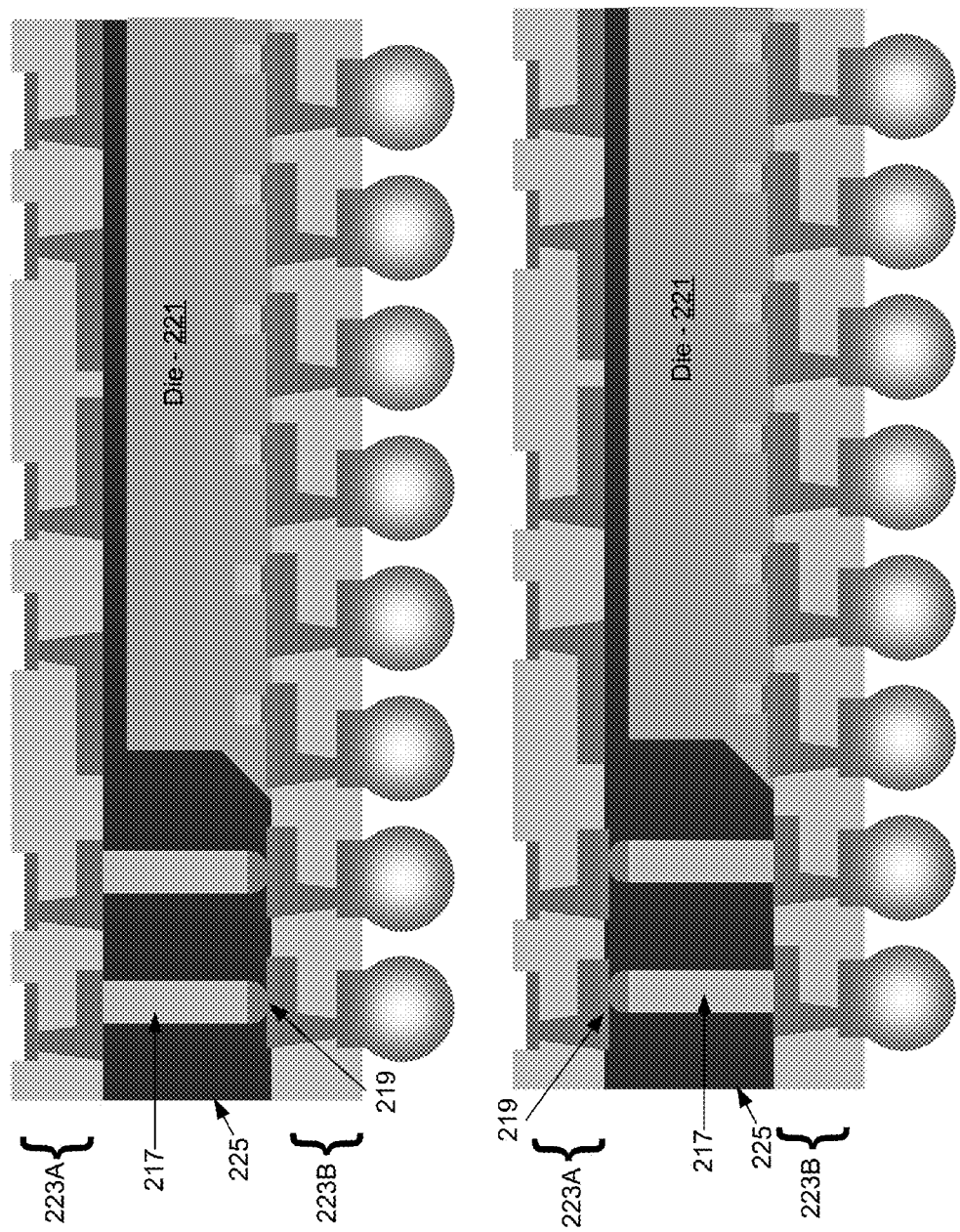
FIGS. 2D-2F illustrate alternative no-cavity embedded die structures, in accordance with an example embodiment of the invention.

FIGS. 2D and 2E illustrate alternative no-cavity embedded die structures, in accordance with an example embodiment of the invention. Referring to FIGS. 2C and 2D, there are shown panel structures comprising layered structures 223A and 223B coupled by copper pillars 217. In FIG. 2D, the copper pillars 217 are formed on the top layered structure 223A and conductive bumps 219 may be formed on the layered structure 223B, whereas in FIG. 2E, the copper pillars 217 may be formed on the bottom layered structure 223B and the conductive bumps 219 may be formed on the top layered structure 223A.

FIGS. 2D and 2E illustrate no-cavity structures, in that dielectric layers, such as the dielectric layers 209 and 213 with a cavity may not be formed on the layered structure that the die 221 is bonded to, but instead a non-conductive pre-formed laminate dielectric film 225 may be placed on the die 221 and the layered structured 223B to ensure a strong physical bond and insulating properties. In these example scenarios, the die 221 is mounted first, before the preformed laminate dielectric film 225 is placed on the die 221 and the layered structure 223B.

Figure 2F:
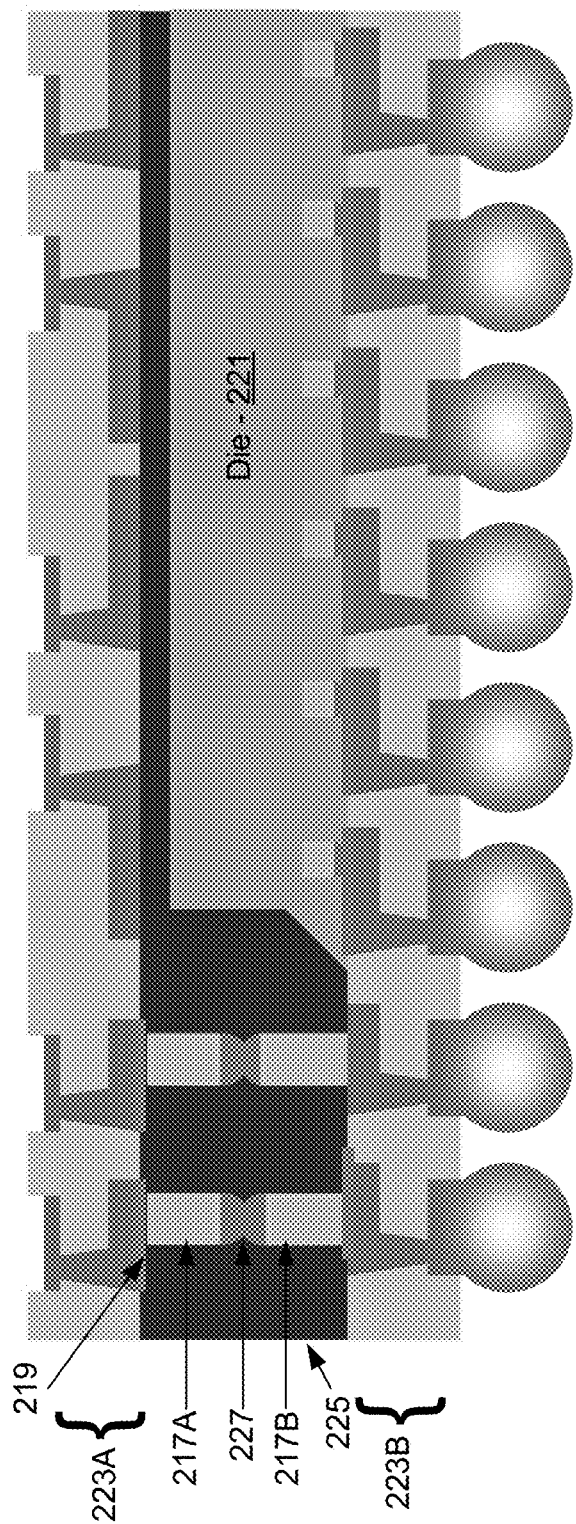

FIG. 2F illustrates another example no-cavity structure, with copper pillars 217A and 217B on both layered structures 223A and 223B so that they may be half the height of the copper pillars 217 shown in FIGS. 2D and 2E. The copper pillars 217A and 217B may also comprise solder caps 227 for coupling the copper pillars 217A and 217B.

Figures 3A, 3B, 3C, 3D:
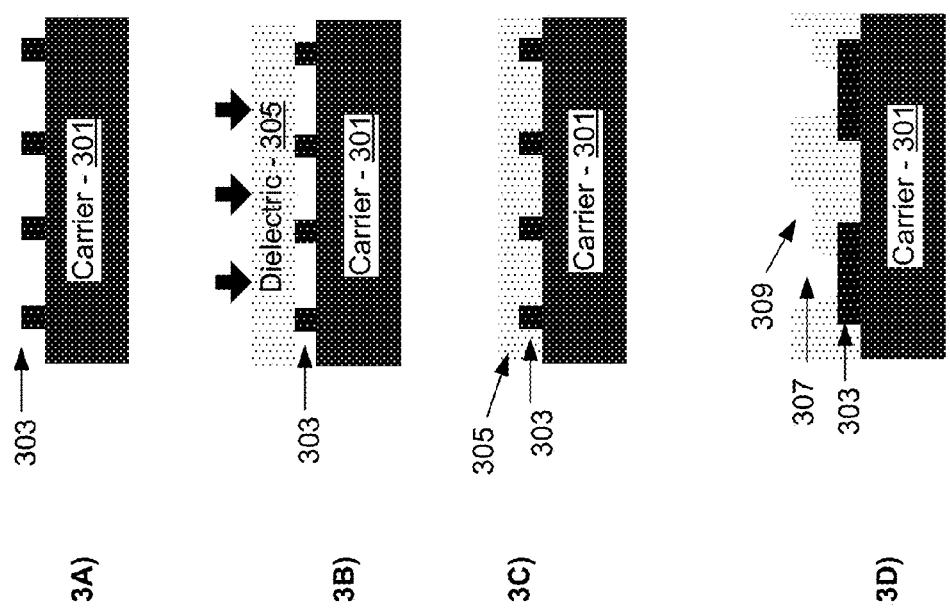
FIGS. 3A-3R illustrate example process steps in fabricating an embedded die panel, in accordance with an embodiment of the invention.
Figures 3E, 3F, 3G, 3H:
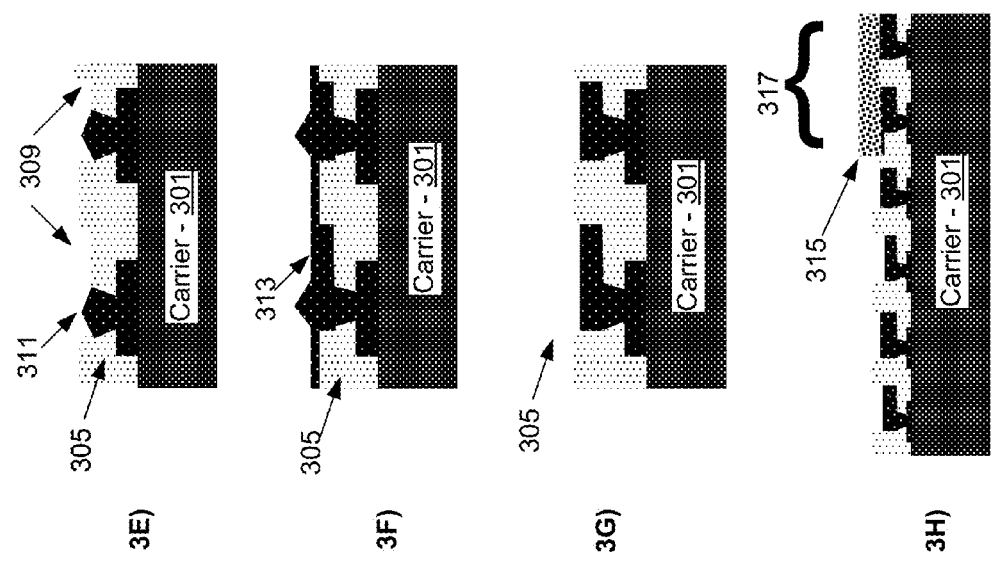
FIGS. 3S-3V illustrate alternative bottom-cavity embedded die panel structures, in accordance with example embodiments of the invention.
Figures 3I, 3J, 3K, 3L, 3M:
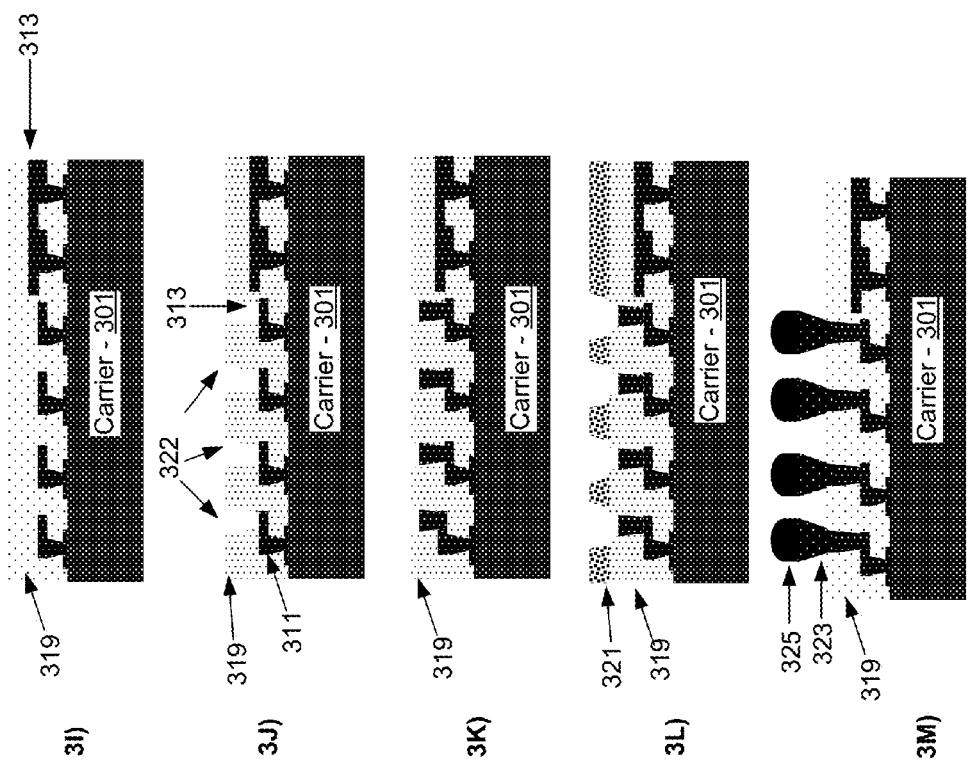
Figures 3Q, 3R:
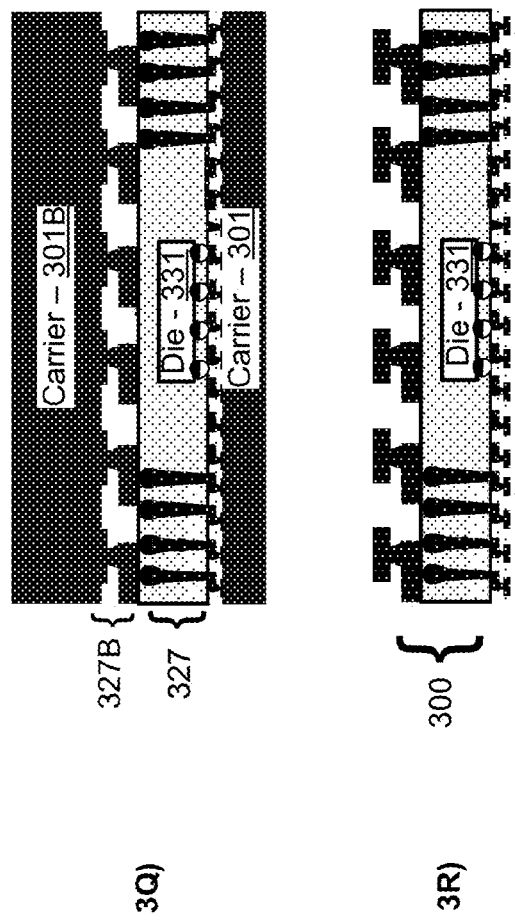

FIGS. 3A-3R illustrate example process steps in fabricating an embedded die panel, in accordance with an embodiment of the invention. Referring to FIG. 3A, there is shown a carrier 301 that may comprise a conductive plate, a flexible film, or an etchable or peelable material, for example. Metal pads 303, which may be known as land pads or base pads, may be formed on the carrier 301 through a metal deposition and patterning process or selective deposition, for example. In instances where an etchable material is used for the carrier 301, tin or nickel may be deposited before depositing copper for the metal pads 303 to provide an etch stop. In an example scenario, the metal pads 303 may be on the order of 10 microns tall.

As shown in FIG. 3B, a dielectric 305 may be placed on the carrier 301 and metal pads 303. In an example scenario, the dielectric 305 may comprise a 40 micron glass cloth film dielectric layer that may be pressed onto the carrier 301, thereby providing electrical isolation between the metal pads 303 and subsequent metal layers. The resulting structure is shown in FIG. 3C.

In FIG. 3D, a close-up view of the structure is shown where vias 307 and trenches 309 may be ablated in the dielectric 305, thereby enabling the subsequent forming of metal vias and RDLs on the metal pads 303. In an example scenario, the vias may be on the order of 30 microns deep and the traces may be 5 microns deep from the top surface of the dielectric 305.

The vias 307 may be partially filled using via metal 311 as shown in FIG. 3E, resulting in a pointed or rounded dome shape above the metal pads 303. This may be followed by an electroless copper and plate copper deposition to fill the trenches 309 forming the RDL 313, as shown in FIG. 3F. While the metal deposited in the trenches 309 is labeled as RDL 313, the deposited metal may be any conductive trace for providing electrical conductivity in a horizontal direction. The copper surface may be reduced via etching to lower the surface of the metal below the top surface of the dielectric 305, as shown in FIG. 3G.

As shown in FIG. 3H, a portion of the surface may be masked off utilizing a photoresist material 315, for example, and the exposed region may be etched to further reduce the copper surface. The masked off region may comprise a die land area 317, where one or more semiconductor die may be subsequently bonded, whereas the exposed area may comprise an area where copper pillars or metal vias and further dielectric layers may be formed to provide electrical to another layered structure.

The photoresist material 315 may be removed and another dielectric layer 319 may be formed through the placement of a laminate film or via deposition, for example, resulting in the structure shown in FIG. 3I. The relative height differences shown for the RDLs 313 are due to the etching for the die land area, for example, which would not likely be present if no semiconductor die is to be mounted on the layered structure. In FIG. 3J, vias 322 may be ablated in the dielectric layer 319 to enable electrical contact to the RDLs 313, and/or via metal 311s when not coupled to an RDL.

FIG. 3K illustrates the vias 322 partially plated with copper, for example, forming the lower region of subsequently formed copper pillars. An electroless seed copper layer may be deposited followed by the deposition of photoresist 321 that may be patterned to mask regions for copper pillar formation, as shown in FIG. 3L.

The unmasked portions may be filled with copper to form copper pillars that are wider above the top surface of the dielectric layer 319, as enabled by the patterned photoresist 321. The photoresist 321 may be stripped and solder caps 325 may be placed on the copper pillars 323, resulting in the structure shown in FIG. 3M. The solder caps 325 may be for subsequent contact with another layered structure. The seed copper may also be etched following removal of the photoresist 321.

The die land area 317 may be ablated to open an area for attaching one or more semiconductor die, as illustrated in FIGS. 3N and 3O. In addition, the copper seed layer may be removed from the metal pads that are to receive the semiconductor die. Ablating the die land area 317 enables semiconductor die to be attached to the layered structure while still being lower than the solder caps 325 on the copper pillars 323. In this manner another layered structure may be coupled to the layered structure 327 via the solder caps 325.

FIG. 3O illustrates a semiconductor die 331 being affixed to the die land area 317 of the layered structure 327 utilizing conductive bumps on the die 329 and bonding pads 329 on the layered structure 327. The semiconductor die 331 may be bonded using a thermo compression bond process, for example, although other bonding techniques may be utilized. In addition, a non-conductive paste 335, shown in FIG. 3P, may be utilized to mechanically affix the semiconductor die 331 to the layered structure 327.

The layered structure 327 with affixed die 331 may be bonded to a second layered structure 327B, as illustrated in FIG. 3P. In this example, the layered structure 327B is flipped so that its contact pads are facing the layered structure 327. A laminate adhesive dielectric layer 333 may be placed on the layered structure 327 and pressure may be applied to the back surface of the layered structure 327B thereby affixing the two layered structures 327 and 327B together, as illustrated in FIG. 3Q.

The carriers 301 and 301B may then be removed by chemical etching or a peel removal, for example, depending on the material used for the carriers, resulting in the completed embedded die structure 300 shown in FIG. 3R, which illustrates only a portion of an embedded die panel, where a plurality of such embedded die structures 300 comprise an embedded die panel, as shown in FIG. 1.

Figure 3S:
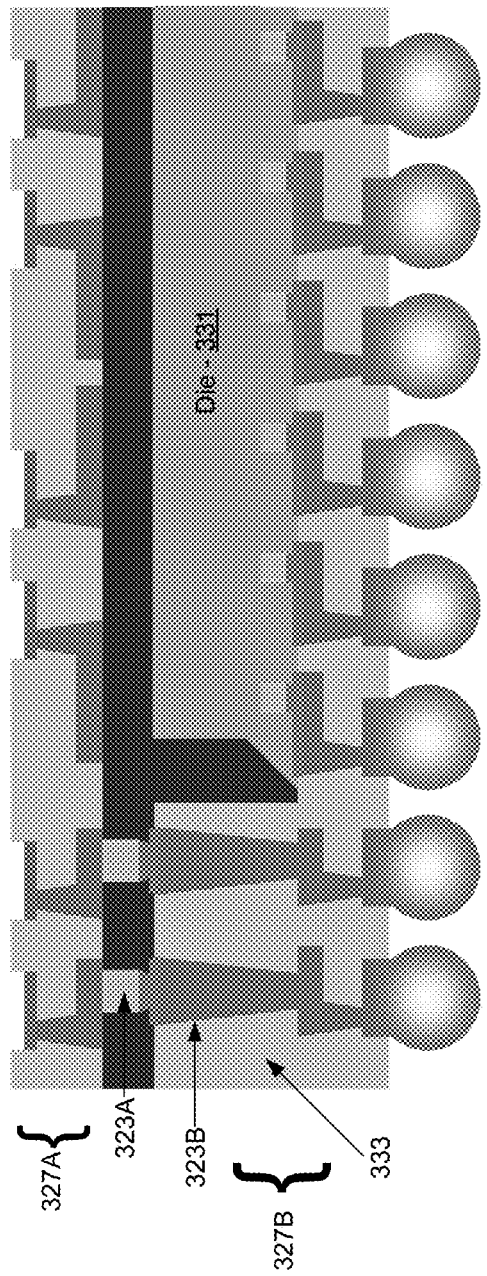
Figure 3T:
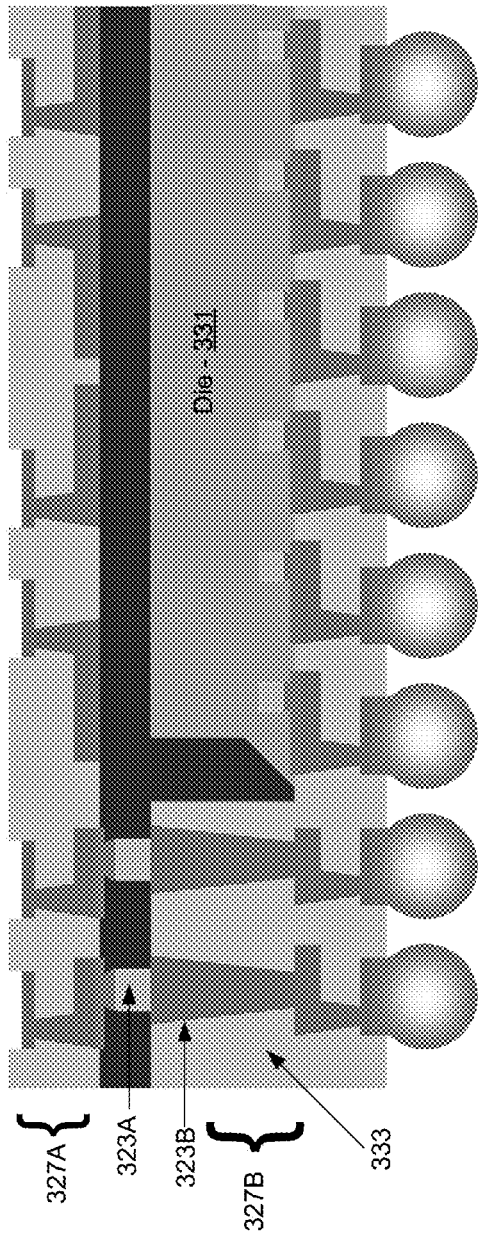
Figures 3U, 3V:
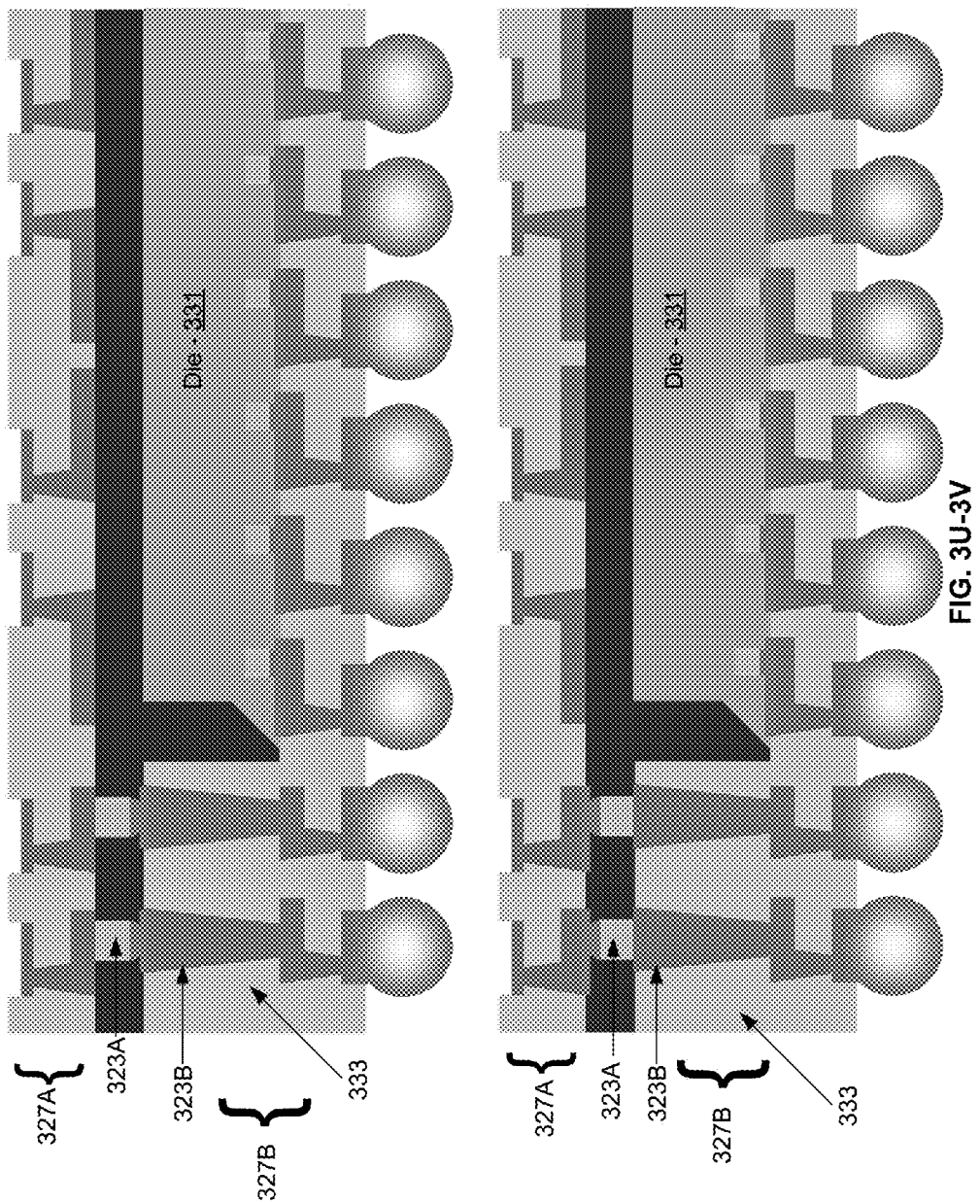

FIGS. 3S-3V illustrate alternative bottom-cavity embedded die panel structures, in accordance with example embodiments of the invention. Referring to FIGS. 3S-3V, there are shown the layered structures 327A and 327B, the affixed die 331, and the adhesive layer 333 sandwiched between. There is also shown the dielectric layers 319, and copper pillars 323A and 323B. The example embodiments shown in FIGS. 3S-3V are similar but differentiated by the placement of the copper pillars 323A and 323B, on the upper layered structure 327A as in FIGS. 3S and 3U or on the lower layered structure 327B as shown in FIGS. 3T and 3V, and whether the die 331 is affixed first or last in the process.

FIGS. 3S and 3T both show bottom cavity layered structures, where the cavity for the die 331 is in the lower layered structure 327B, and the copper pillars 323A are formed on the top layered structure 327A in FIG. 3S but on the bottom layered structure 327B in FIG. 3T. In addition, the die 331 may be affixed before the pre-formed dielectric layer 319 in both FIGS. 3S and 3T.

In contrast, as shown in FIGS. 3U and 3V, the die 331 may be affixed last after a cavity is formed in the pre-laminated dielectric layer 333. While various methods of forming a cavity for the die in the layered structures has been shown, the invention is not limited to these techniques, as other techniques may be utilized such as etching or selective deposition, for example.

Figure 4:
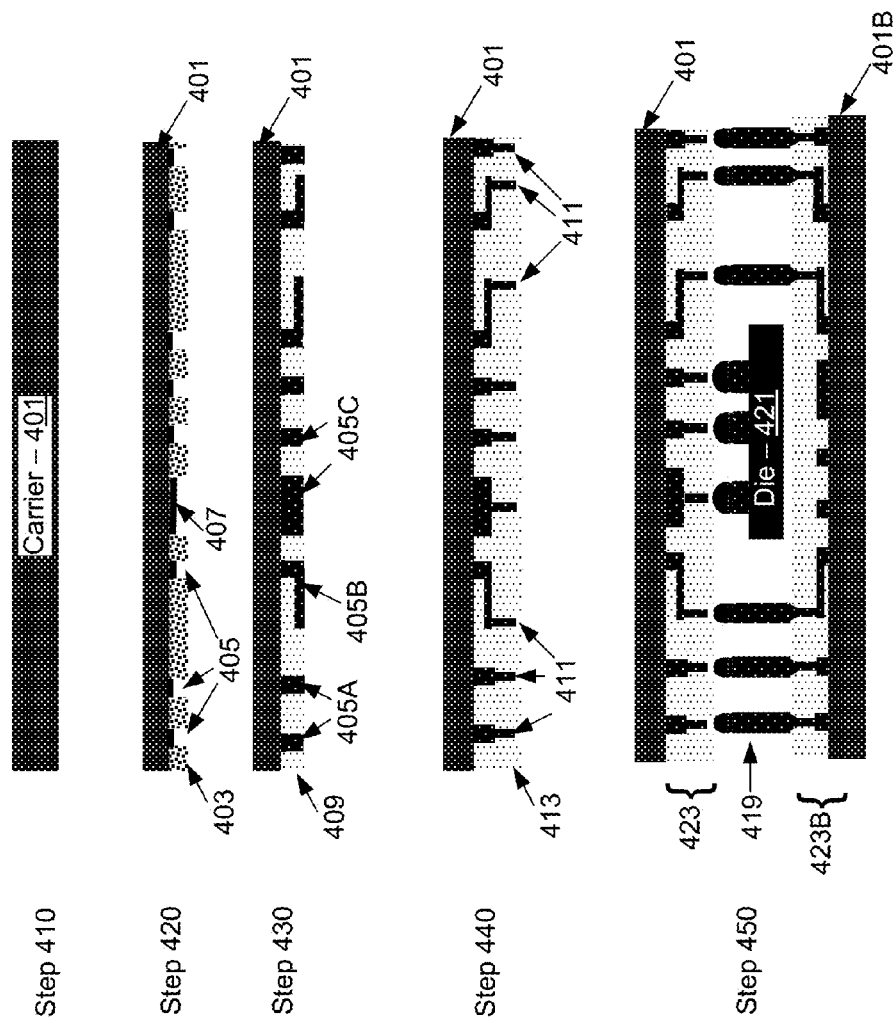
FIG. 4 is a drawing illustrating exemplary steps in an alternative process for fabricating an embedded die in a panel structure, in accordance with an example embodiment of the invention.

FIG. 4 is a drawing illustrating exemplary steps in an alternative process for fabricating an embedded die in a panel structure, in accordance with an example embodiment of the invention. Referring to FIG. 4, there are shown packaging process steps 410-450 for generating an embedded die in panel structure.

The process may begin in step 410 with a carrier 401, which may comprise a conductive plate of material such as copper or aluminum, for example. In another example scenario, the carrier 401 may comprise an etchable or peelable material. In step 420, a photoresist layer 403 may be deposited and patterned, such as with a photolithography process, for example, to form exposed regions 405. The exposed regions 405 may be plated with metal to form a plate barrier layer 407, which may comprise nickel or tin, for example.

In step 430, a dielectric layer 409 may be deposited or attached as a polymer film, for example, to provide structural support and electrical isolation between various conductive layers. The dielectric layer 409 may be patterned utilizing a photolithography process, for example, to expose the plate barrier layers 407 and to provide paths for the redistribution layers (RDLs) 405B to be formed. The vias 405A, RDLs 405B, and bonding pads 405C may be deposited or plated on the dielectric layer 409 and on the plate barrier layer 407. The vias 405A, RDLs 405B, and bonding pads 405C may comprise electroless copper and/or plate copper layers that may be reduced at the surface of the dielectric layer 409 utilizing chemical etching or mechanical polishing, for example.

In step 440, another dielectric layer 413 may be deposited or placed on the dielectric layer 409. The dielectric layer 413 may be patterned utilizing photolithography and/or laser ablation to form openings for the vias 411. In another example scenario, the dielectric layers 409 and 413 may comprise pre-formed dielectric films. The surface copper may again be reduced utilizing chemical etching or mechanical polishing so that the top of the metal is within the dielectric layer 213, i.e. above the bottom surface of the dielectric layer 413 in FIG. 4. In addition, laser ablation may be utilized to form openings for the vias 411.

In step 450, a non-conductive paste may be utilized to bond a semiconductor die 421 comprising conductive bumps that may be electrically coupled to the vias 411. In comparison to the example process of FIG. 2A, the copper pillars 419 may be tall enough to allow for the placement of the die 421 between the two layered structures 423 and 423B, as opposed to extended vias being formed in the upper layer structure 423, as was done with the extended vias 211 for the layered structure 223 in FIG. 2A.

The layered structure 423B may be similar to the layered structure 423 formed in steps 410-440, and may be electrically coupled to the layered structure 221 utilizing a non-conductive film and/or a non-conductive paste. The die 421 may be affixed to the layered structure 423 utilizing a non-conductive paste. The carriers 401 and 401B may be removed utilizing an etching process or a peeling process.

Figures 5A, 5B:
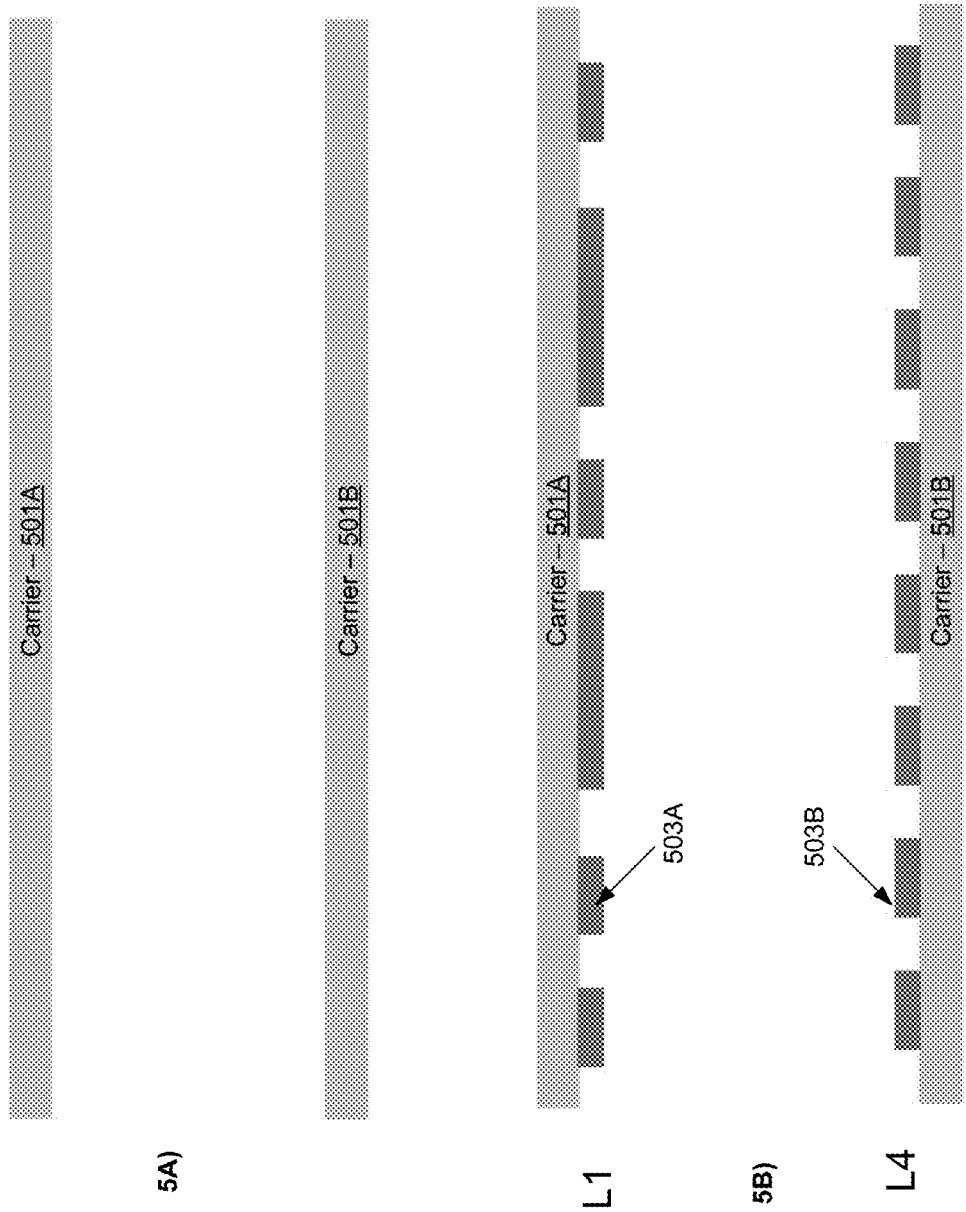
FIGS. 5A-5R illustrate example process steps in fabricating a top cavity structure with a single top-half dielectric layer, in accordance with an example embodiment of the invention.
Figures 5C, 5D:
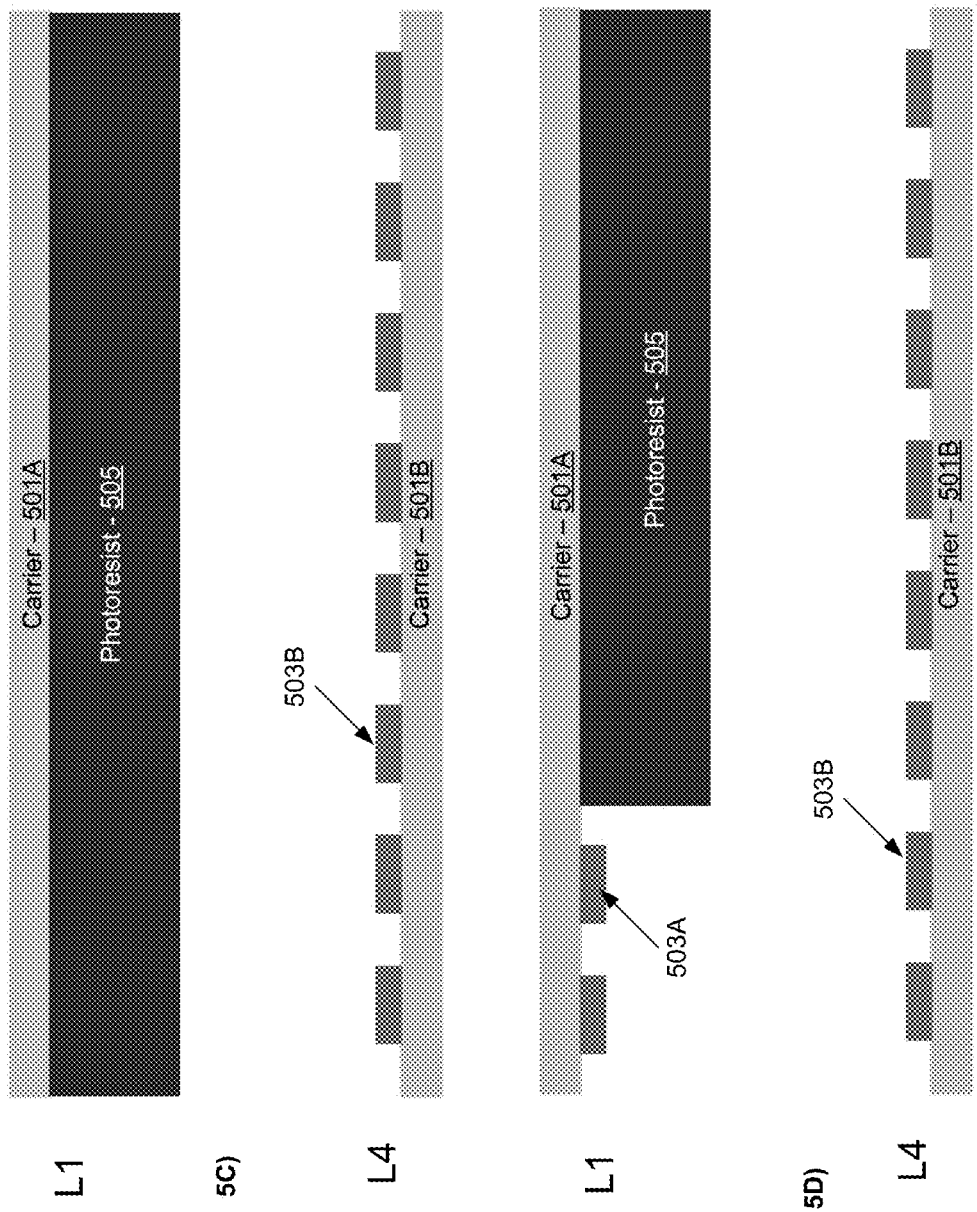
Figure 5G:
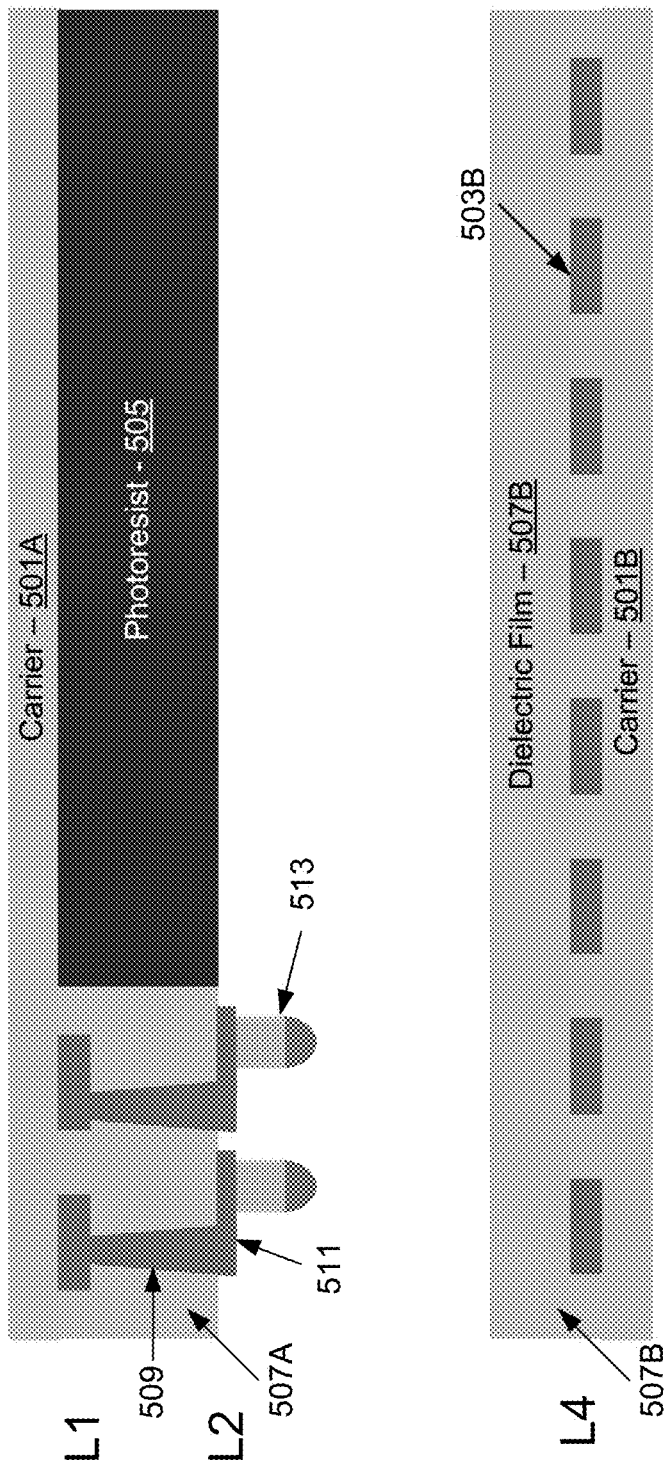
Figure 5H:
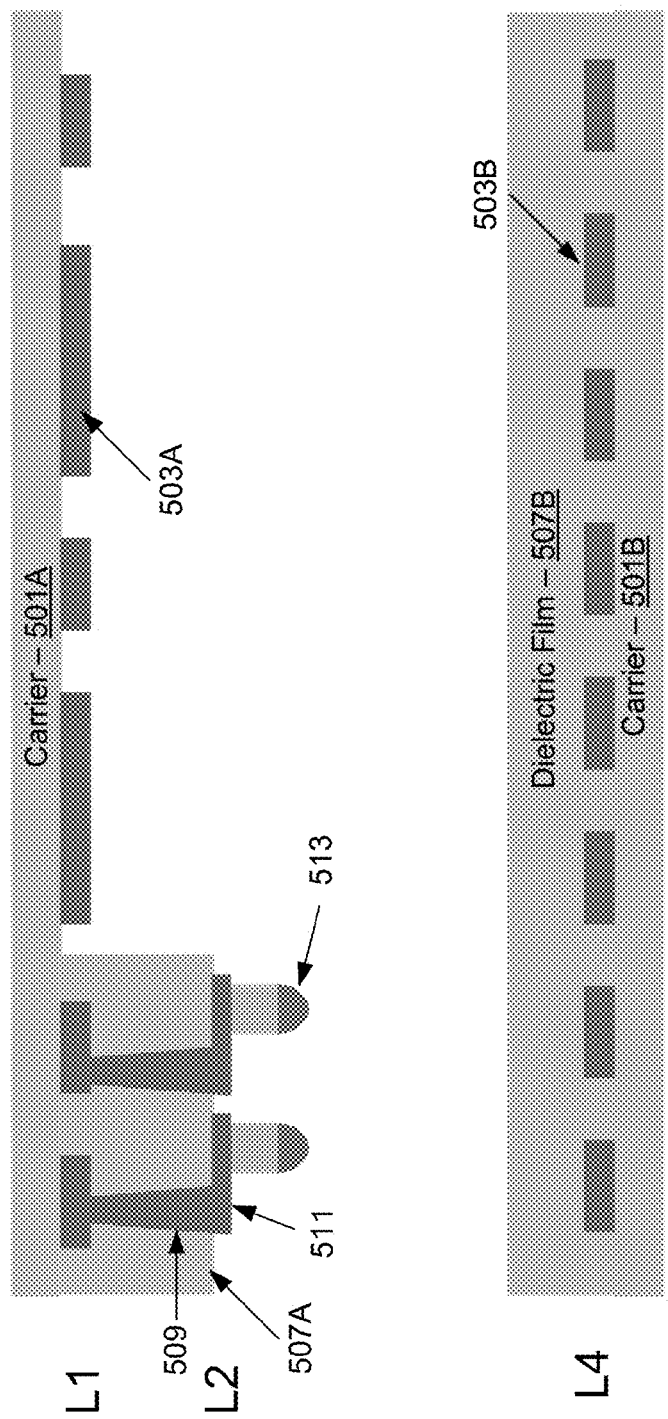
Figure 5I:
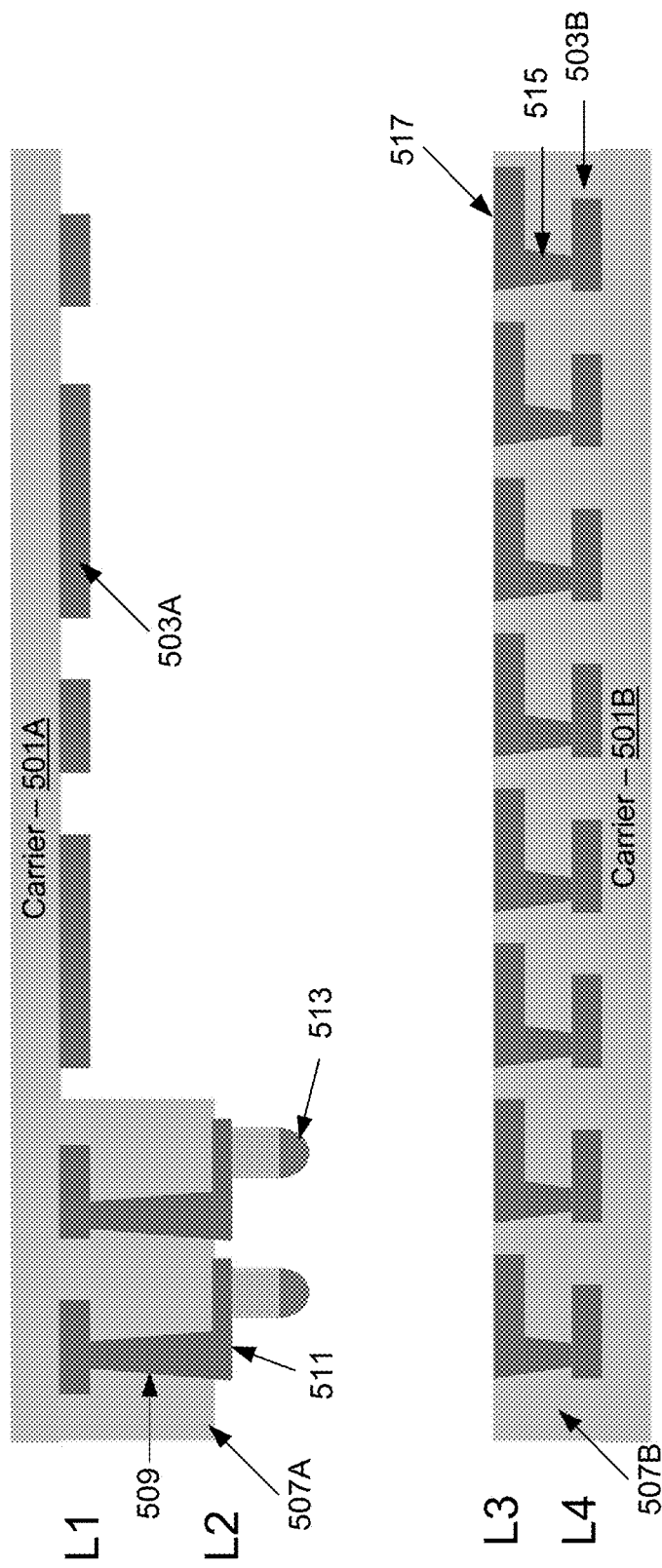
Figure 5J:
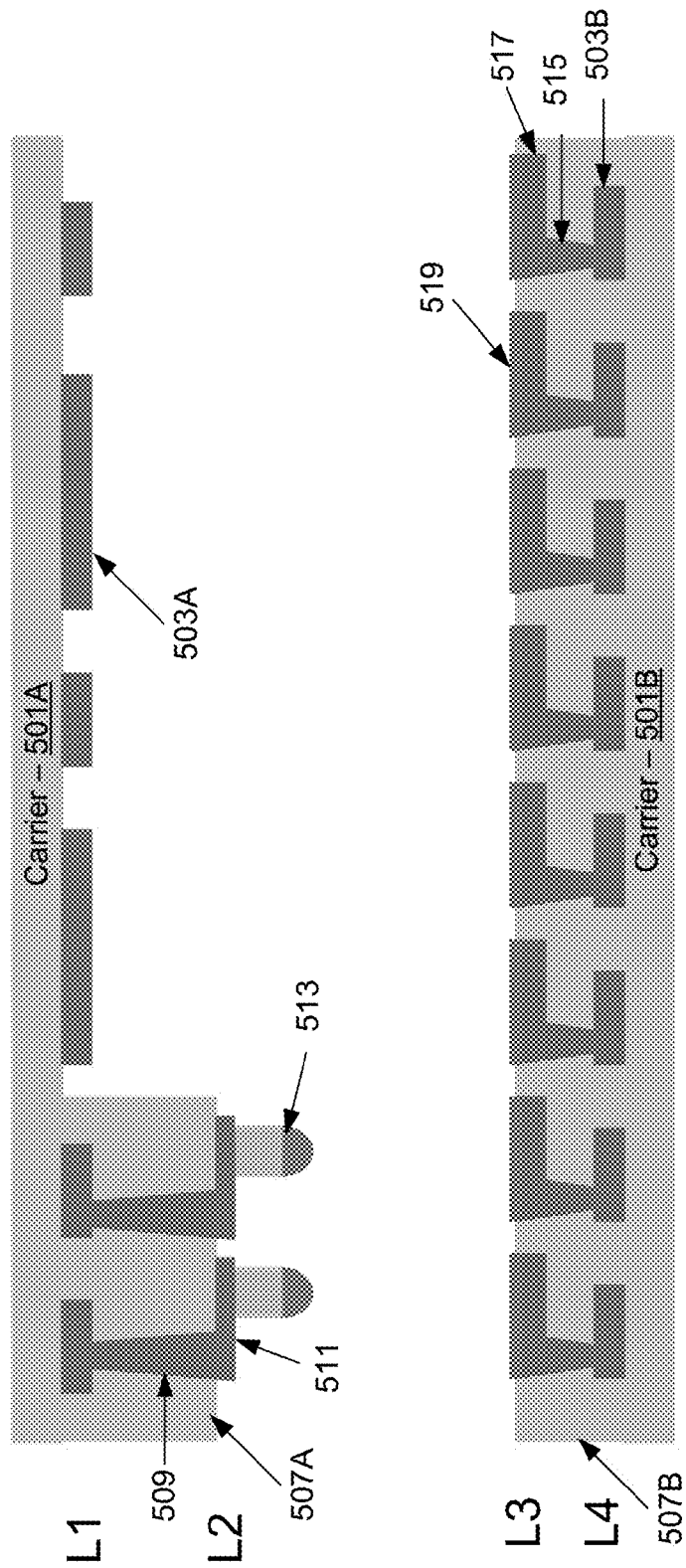
Figure 5K:
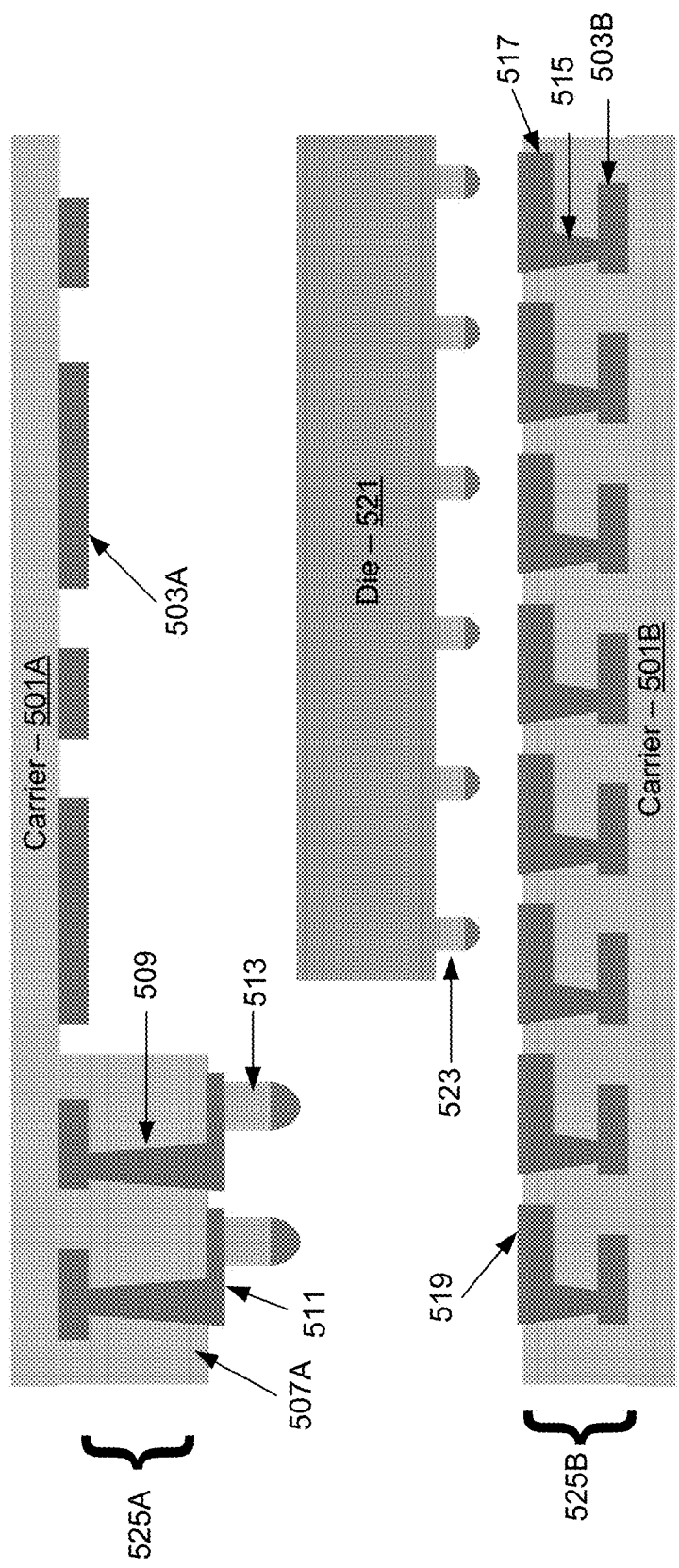
Figure 5L:
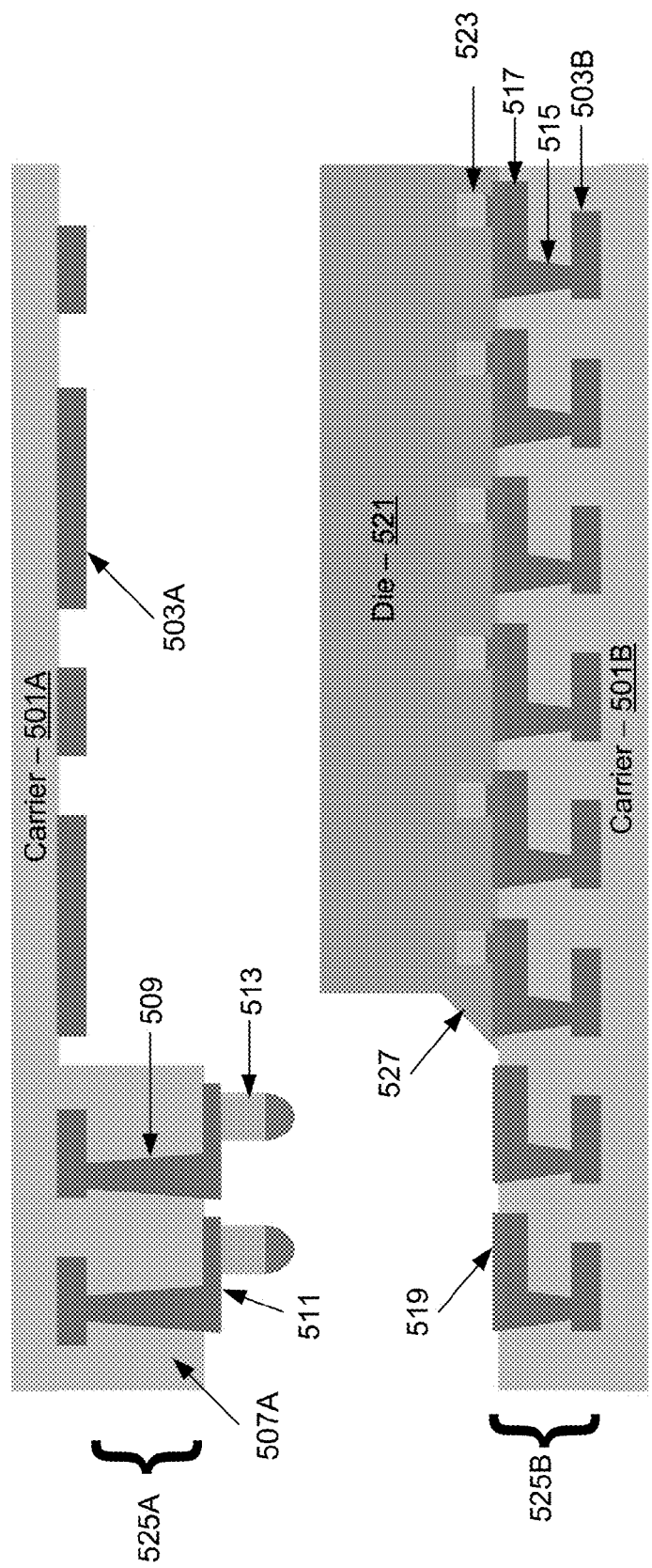
Figure 5M:
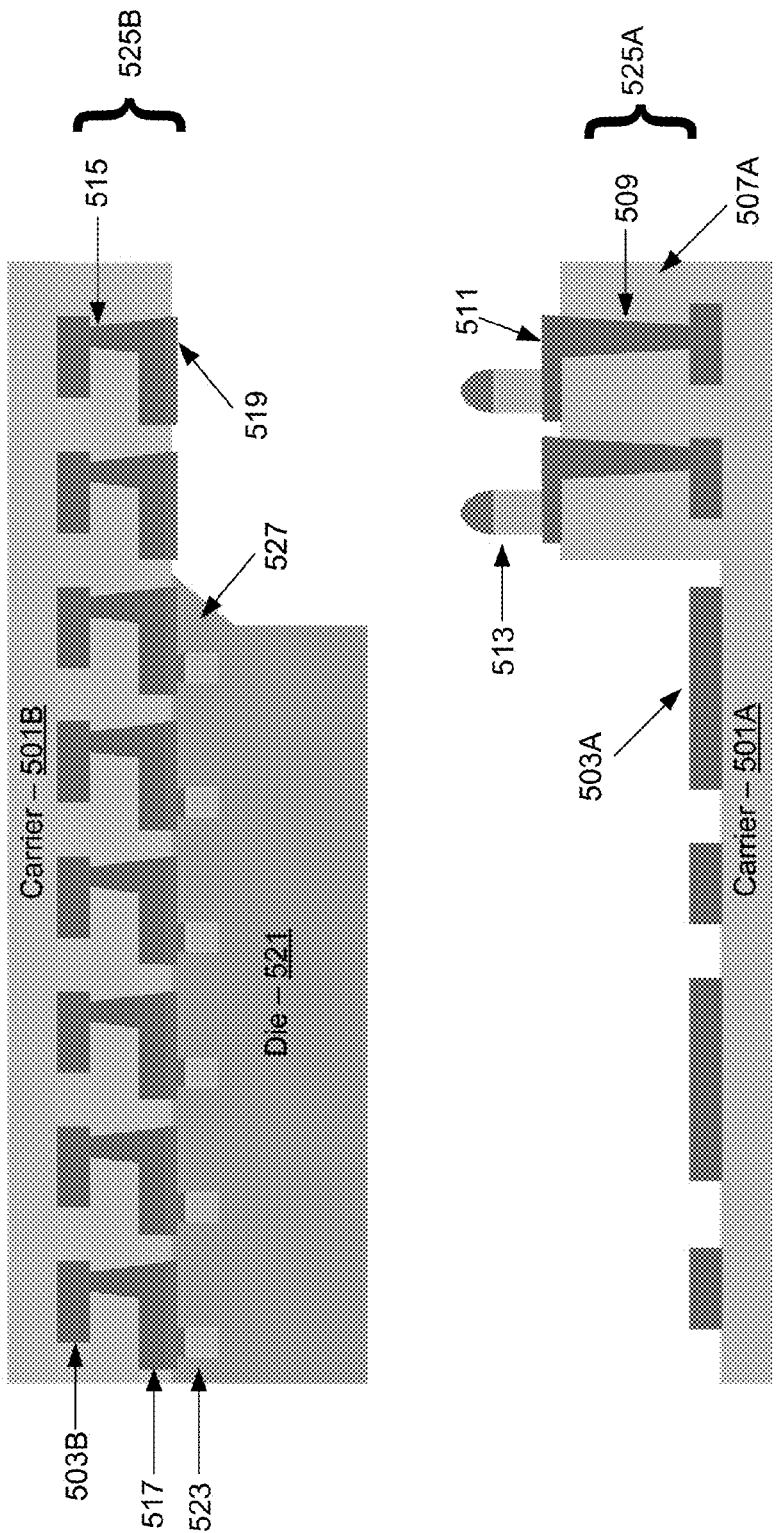
Figure 5N:
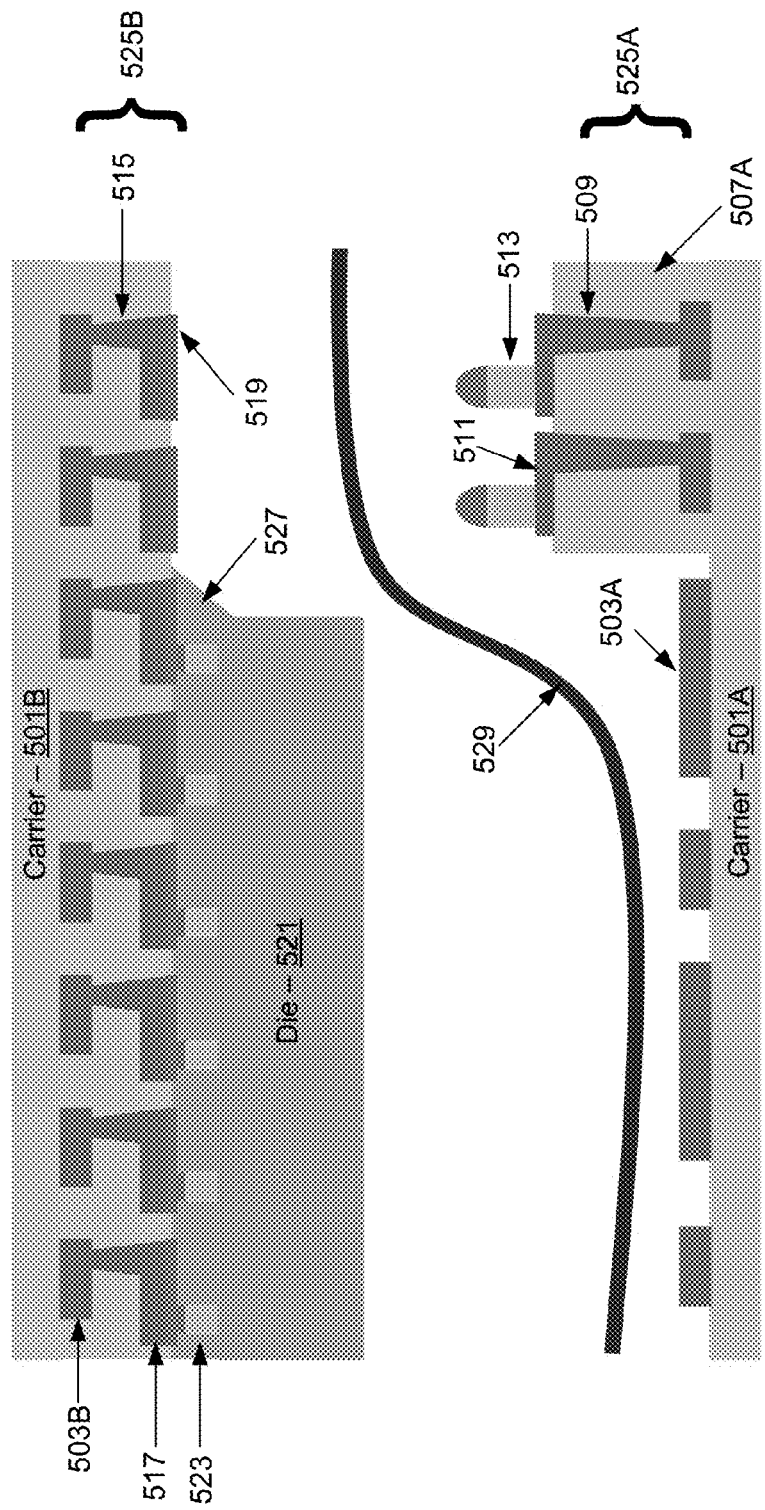
Figure 5O:
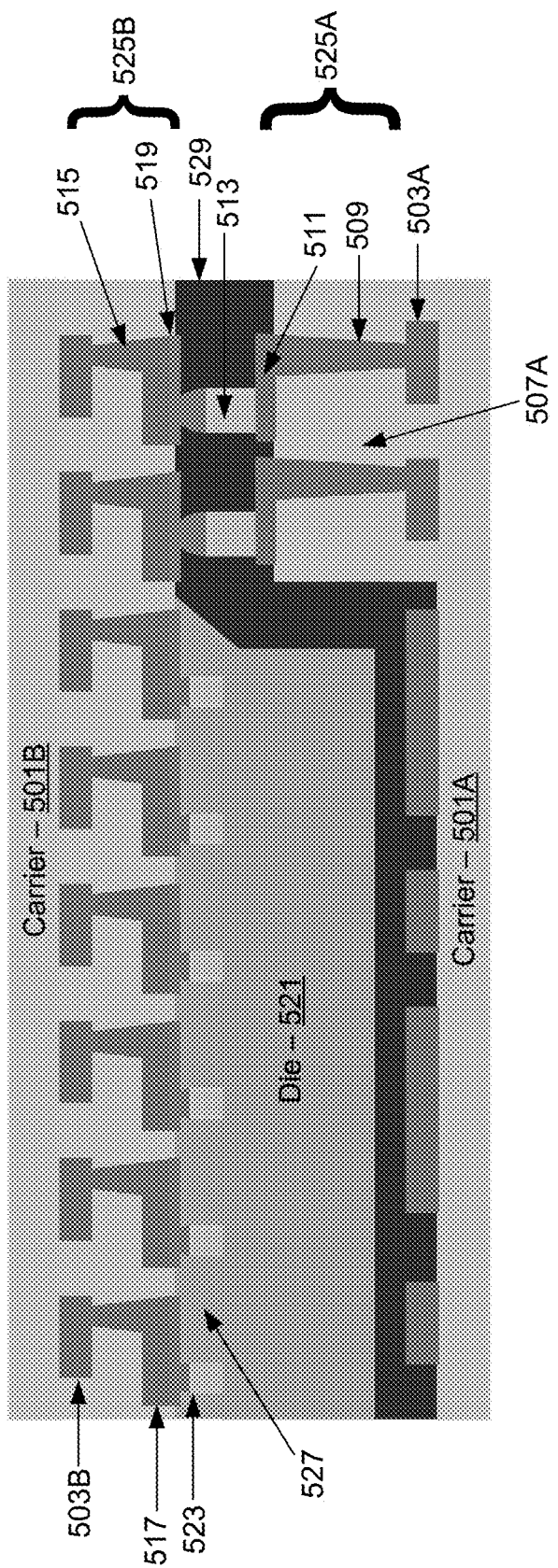
Figure 5P:
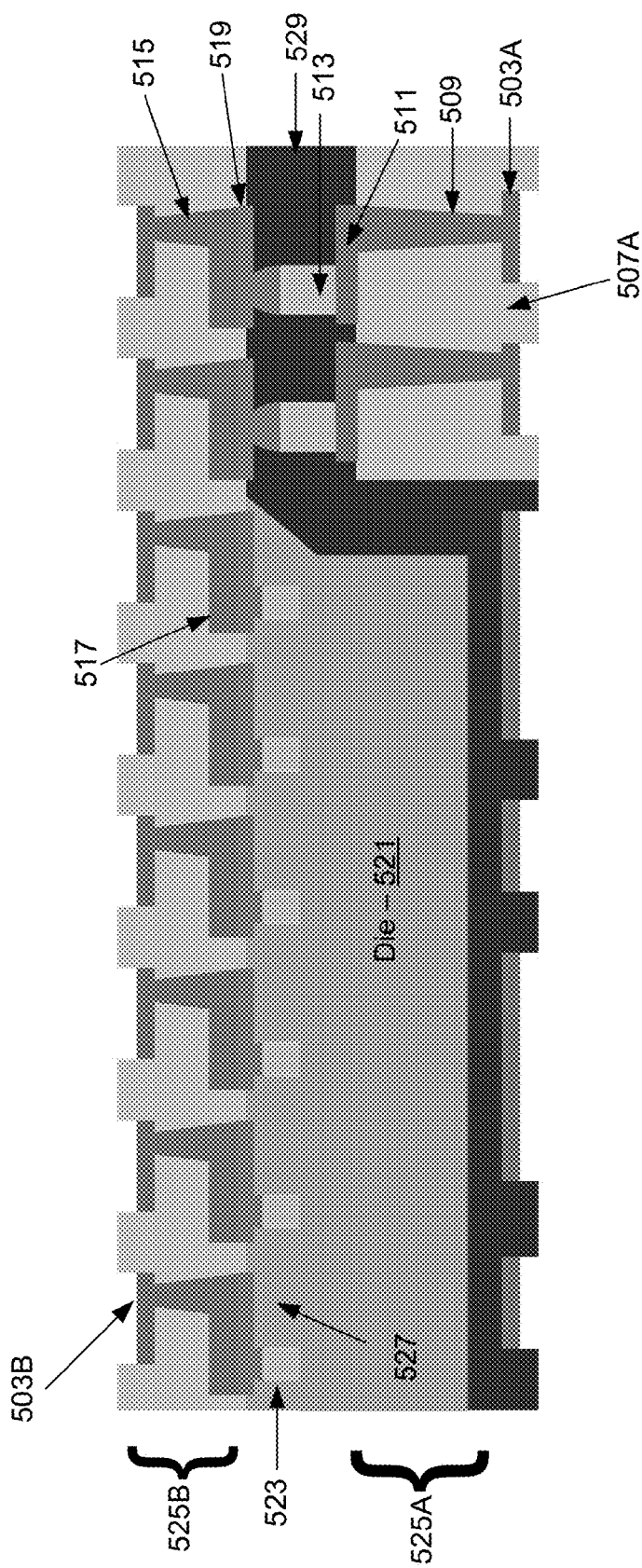
Figure 5Q:
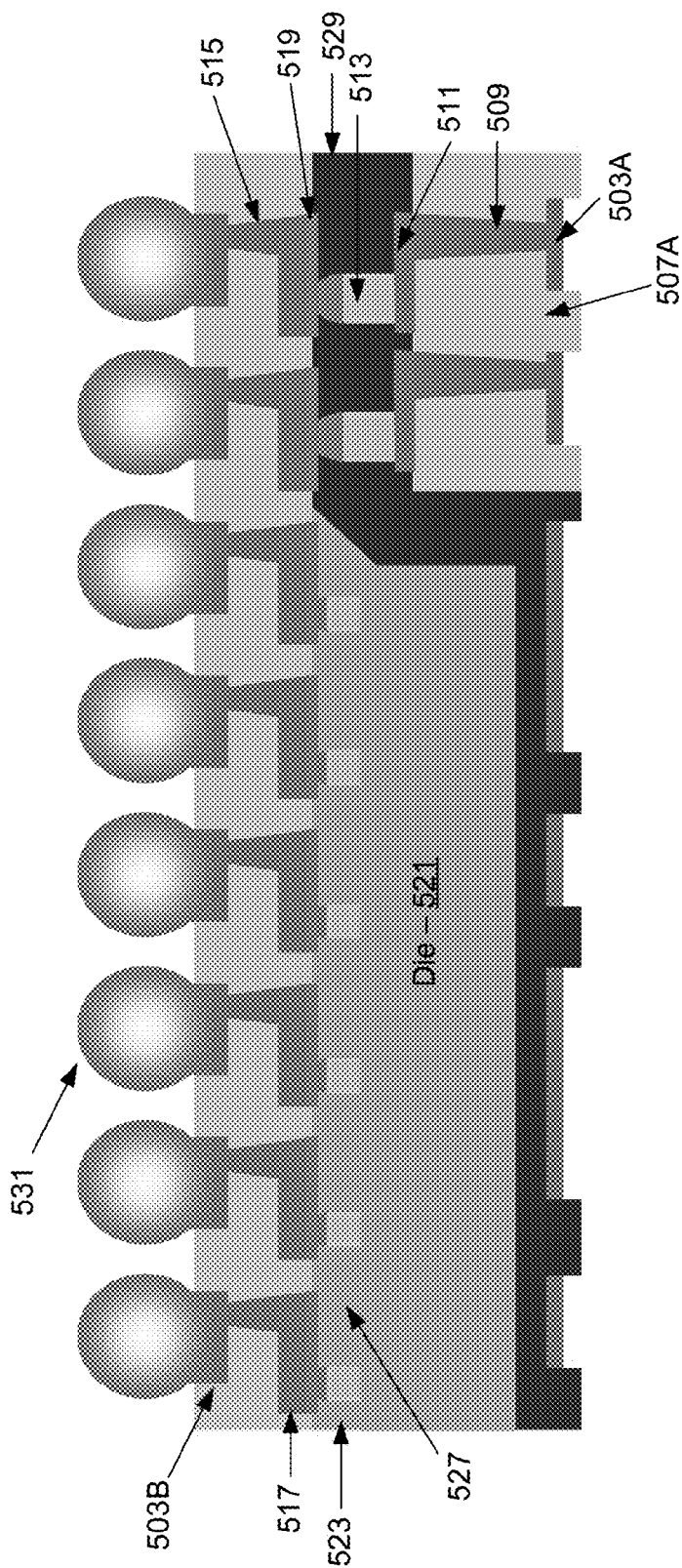
Figure 5R:
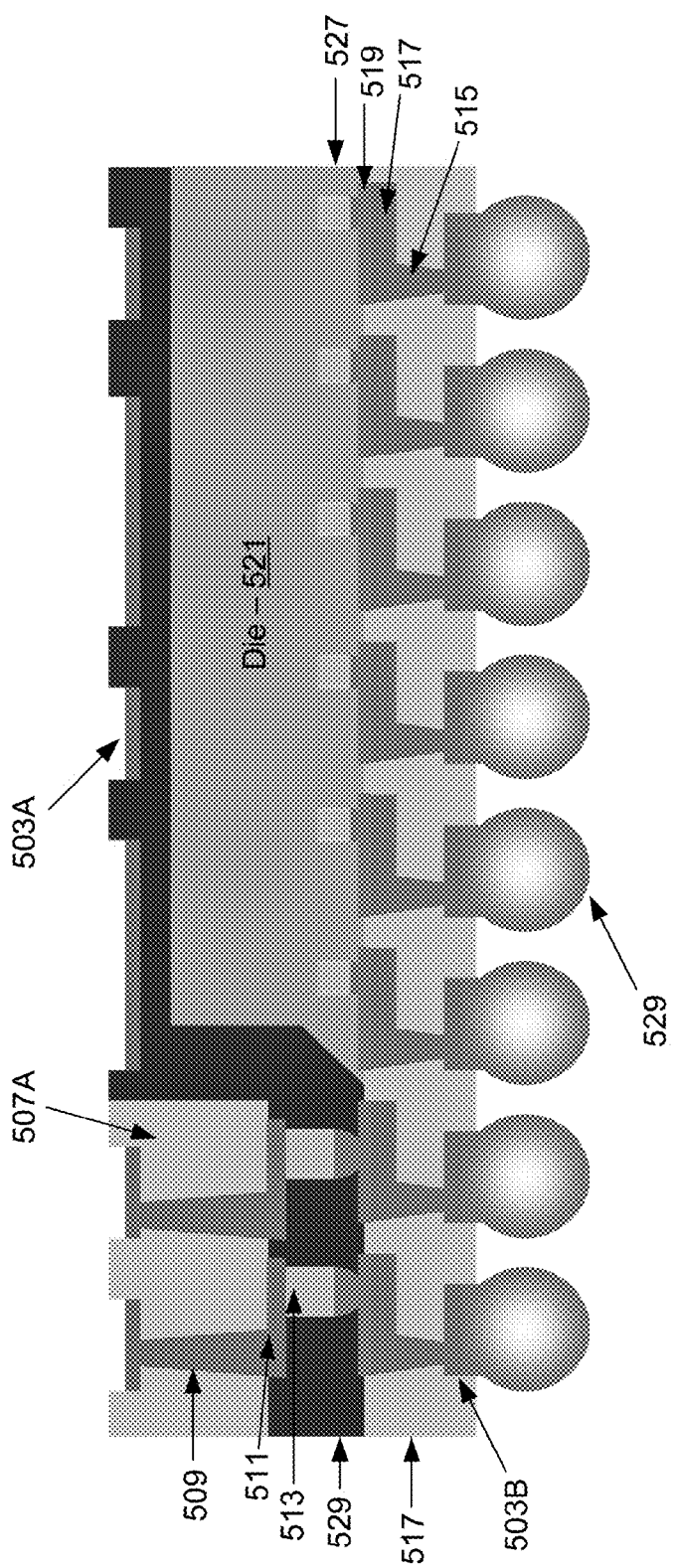

FIGS. 5A-5R illustrate example process steps in fabricating a top cavity structure, in accordance with an example embodiment of the invention. Referring to FIG. 5A there is shown two carriers 501A and 501B, which may comprise metal carriers, for example, for supporting layered structures during processing.

In FIG. 5B, layer 1 and 4 copper RDLs 503A and 503B may be formed on the metal carriers 501A and 501B. FIG. 5C illustrates a photoresist layer 505 formed on the carrier 501A. The photoresist layer 505 may comprise a laminate structure or a spin-in photoresist material, for example.

FIG. 5D illustrates the patterning of the photoresist layer 505 exposing a subset of the RDL 503A where the remaining portion of the photoresist layer 505 may comprise a block for a subsequently formed cavity. Dielectric films 507A and 507B may be formed on the carriers 501A and 501B, covering the exposed RDLs 503A and 503B, as shown in FIG. 5E. In an example scenario, the dielectric films 507A and 507B may comprise laminate films, where an opening may be punched or ablated in the dielectric layer 507A prior to placement to allow for the photoresist layer 505 remaining on the carrier 501A.

FIG. 5F illustrates vias 509 and RDLs 511 formed in and on the dielectric film 507A. In an example scenario, the vias 509 may be formed by drilling or ablating the dielectric film 507A and depositing copper to fill the hole and form the RDLs 511. In addition, the RDLs may be formed after plating the entire surface and then patterning and etching the copper into RDL traces.

FIG. 5G illustrates the formation of copper bumps 513 on the RDLs 511. The copper bumps 513 may provide electrical contact to the RDLs 503B when the two structures supported by the carriers 501A and 501B are bonded together. The photoresist layer 505 may then be stripped to open a cavity for subsequent die placement, resulting in the structure shown in FIG. 5H.

As with the vias 509 and RDLs 511, trenches and vias in the dielectric film 507B may be formed via lasing and drilling, respectively, followed by copper plating to form the vias 515 and the RDLs 517, as shown in FIG. 5I. The RDLs 517 may provide electrical contact to the copper bumps 513 as well as one or more semiconductor die to be affixed to the layered structure being formed on the carrier 501B.

FIG. 5J illustrates the layered structure on the carrier 501B with a solderable surface plate layer 519 formed thereon to protect the surface from excessive oxidation that could reduce contact quality. This protective layer may help provide good contact with the copper bumps 513 and one or more semiconductor die to be subsequently affixed, as illustrated in FIG. 5K.

FIG. 5K illustrates the layered structures 525A and 525B formed on the carriers 501A and 501B, respectively, with a semiconductor die 521 with copper pillars 523 to be affixed to the lower layered structure making electrical contact to the RDLs 517 via the solderable surface plate layer 519. FIG. 5L illustrates the die 521 bonded to the layered structure on the carrier 501B utilizing thermal compression and with underfill 527, which may comprise a non-conductive paste, or utilizing a mass reflow with capillary underfill process, in which case underfill 527 comprises a capillary underfill material.

FIG. 5M illustrates the layered structures 525A and 525B in an inverted orientation before bonding. To enable bonding, a non-conductive film 529 may be placed between the layered structures 525A and 525B, as shown in FIG. 5N. The non-conductive film 529 is shown as a thin curved line in FIG. 5N merely for illustration purposes, and in application comprises a layer thick enough to fill the space between the layered structures 525A and 525B, as shown in FIG. 5O.

The metal carriers 501A and 501B may be removed, such as by etching or peeling away, for example, resulting in the bonded layered structures 525A and 525B with exposed RDLs 503A and 503B, as shown in FIG. 5P. While various methods of forming a cavity for the die in the layered structures has been shown, the invention is not limited to these techniques, as other techniques may be utilized such as etching or selective deposition, for example.

FIG. 5Q illustrates the bonded layered structures 525A and 525B with solder balls 531 bonded to the RDLs 503B utilizing flux print, solder attach, reflow, and clean processes, followed by a singulation step where the substrate may be diced into individual packages, each comprising a die and layered structures 525A and 525B. At this point the structure may still be in panel form, comprising a plurality of layered structures and embedded die, that may be diced into individual structures. The resulting structure is shown in FIG. 5R.

Figures 6A, 6B:
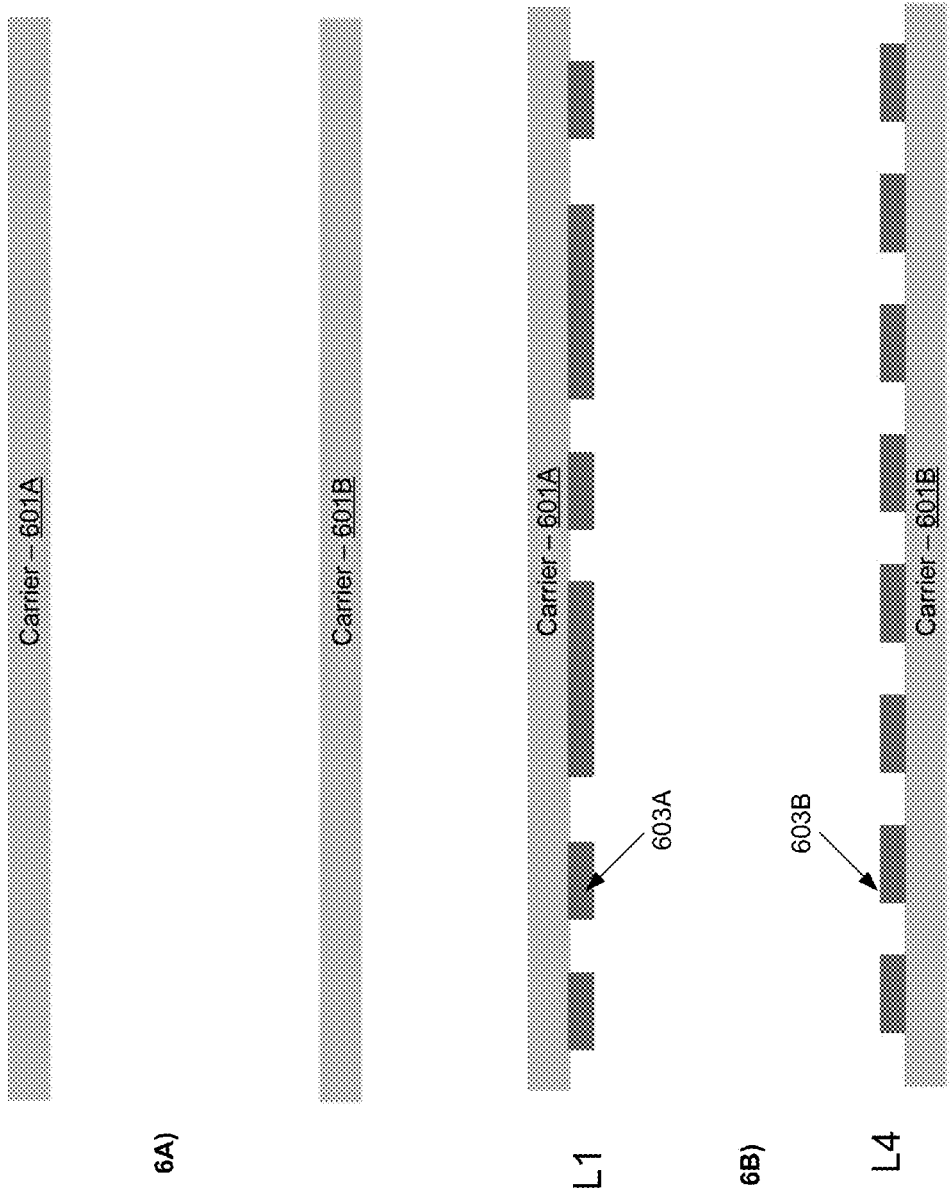
FIGS. 6A-6S illustrate example process steps in fabricating a top cavity structure with dual top-half dielectric layer, in accordance with an example embodiment of the invention.
Figures 6C, 6D:
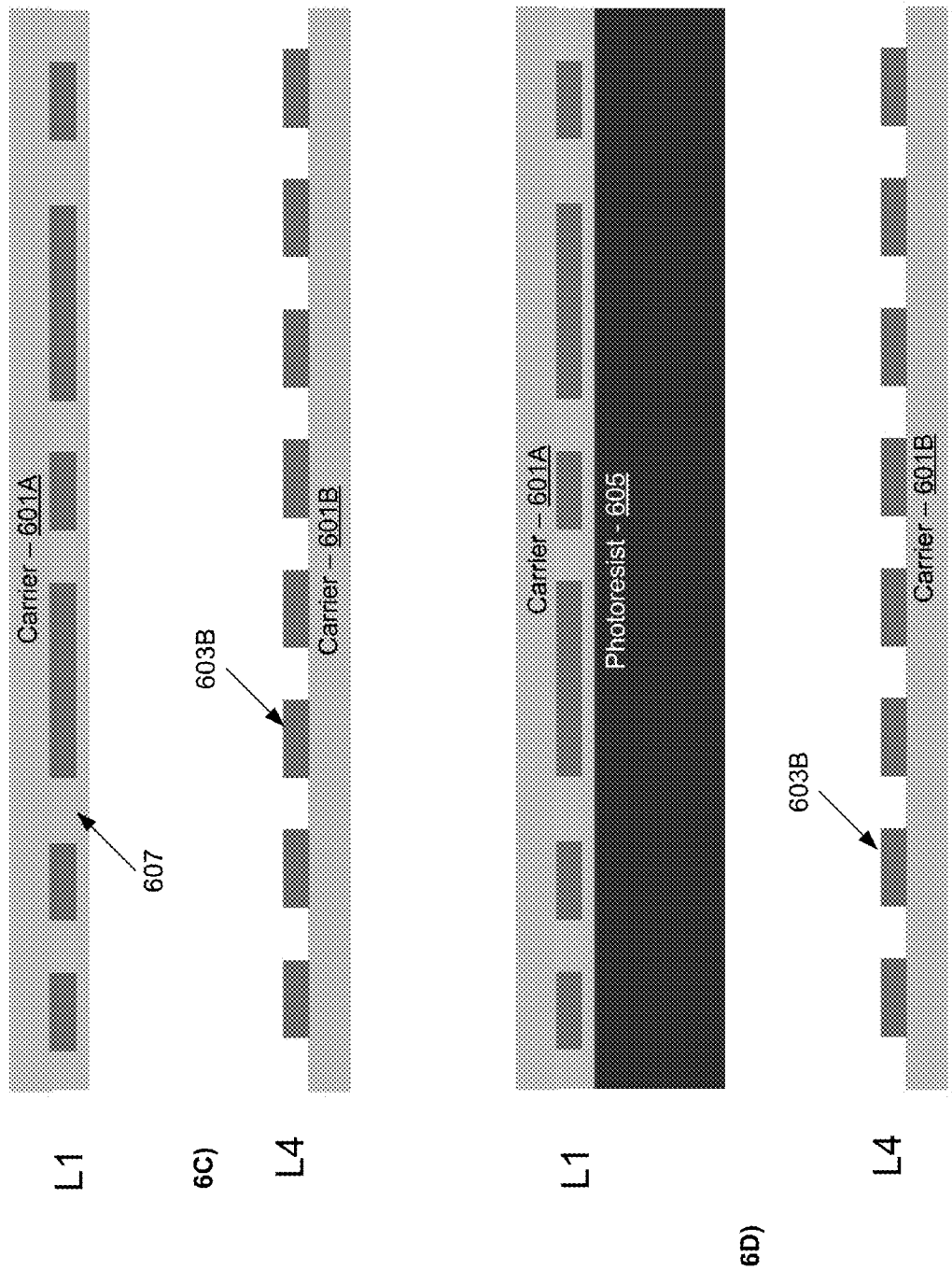
Figures 6E, 6F:
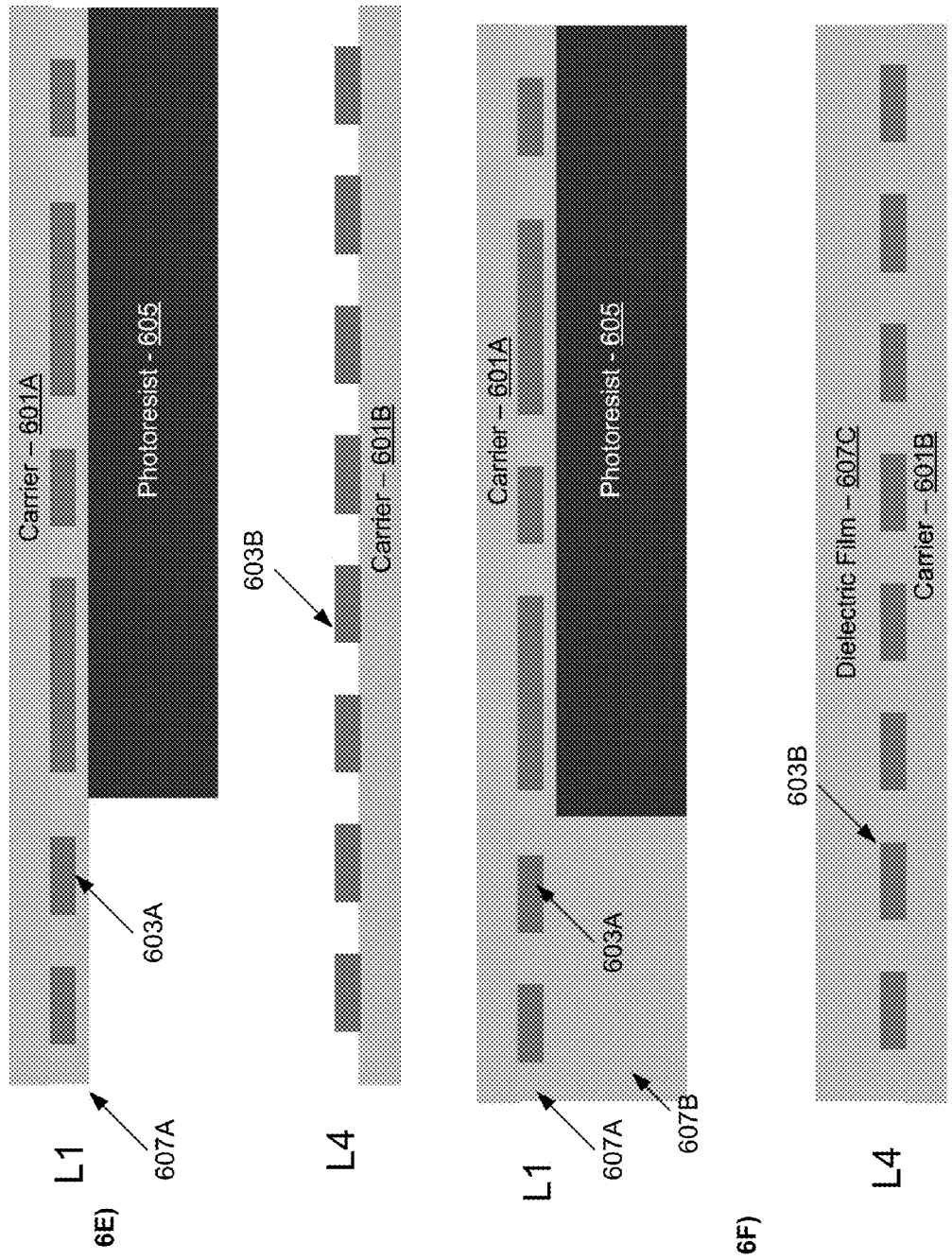
Figure 6G:
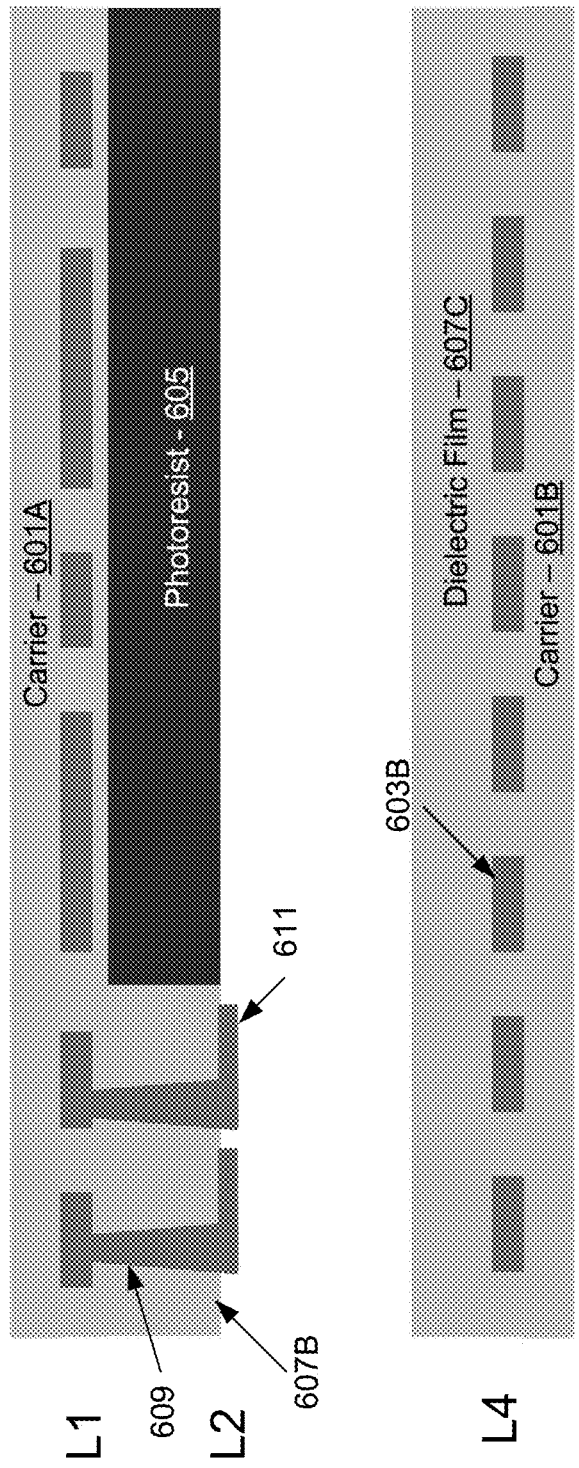
Figure 6H:
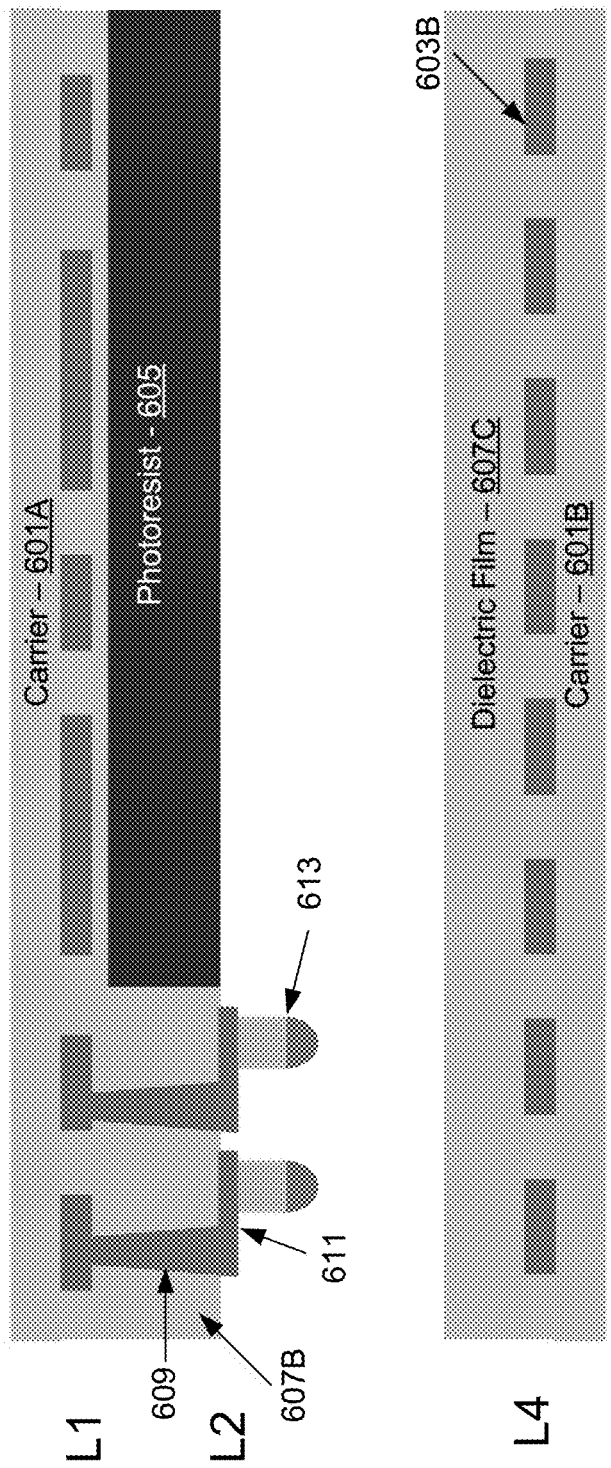
Figure 6I:
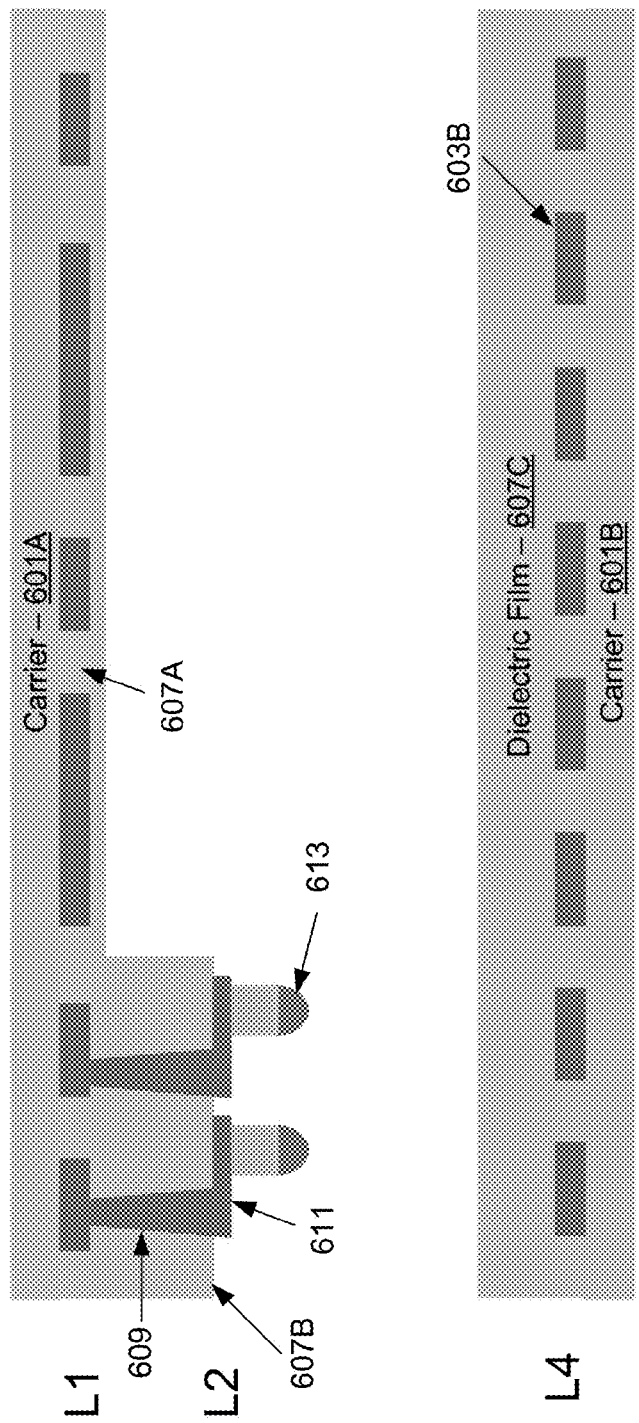
Figure 6J:
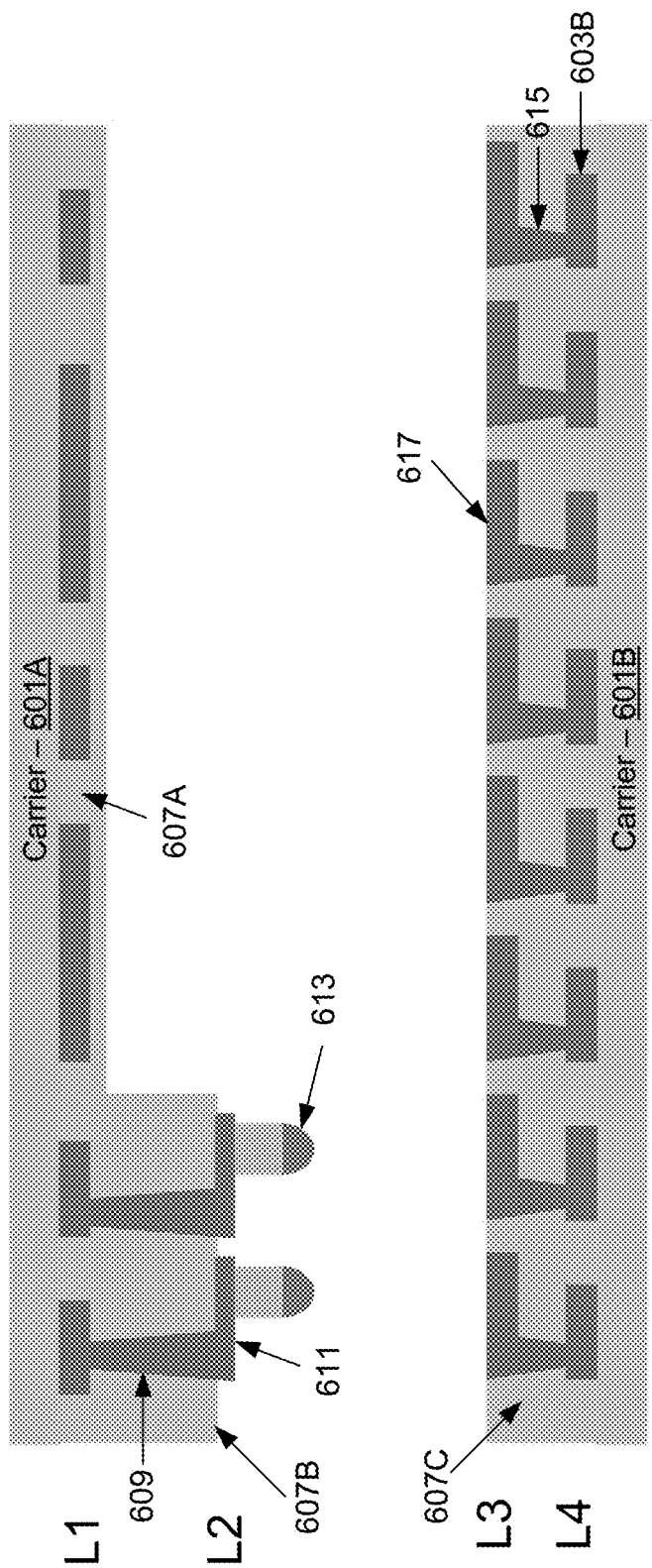
Figure 6K:
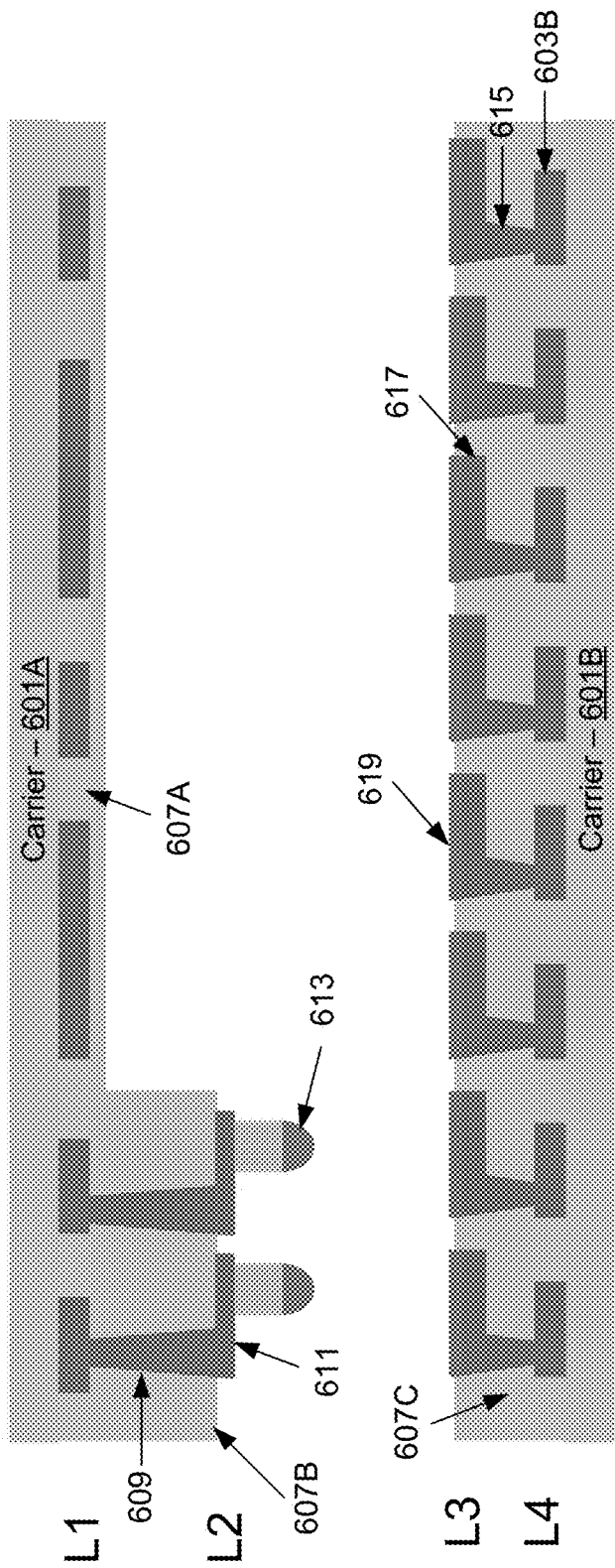
Figure 6L:
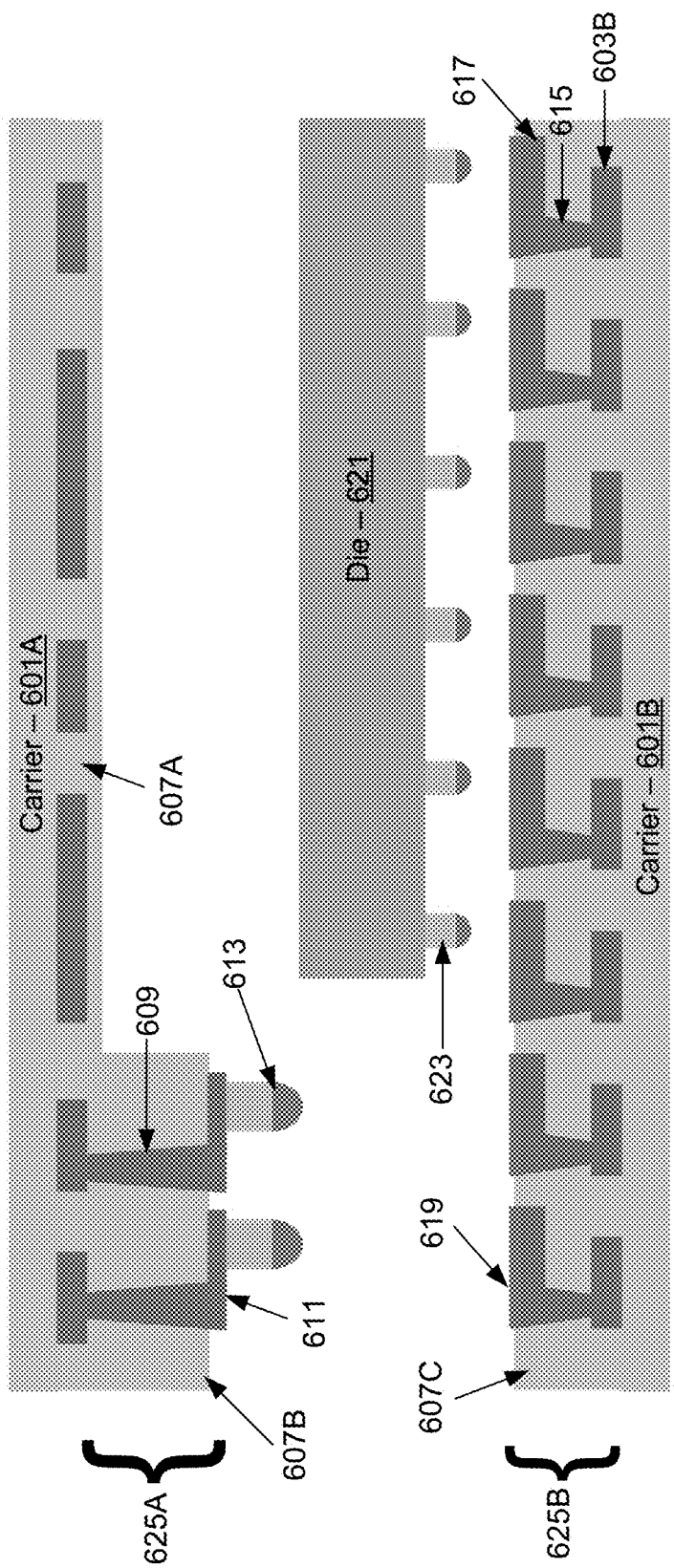
Figure 6M:
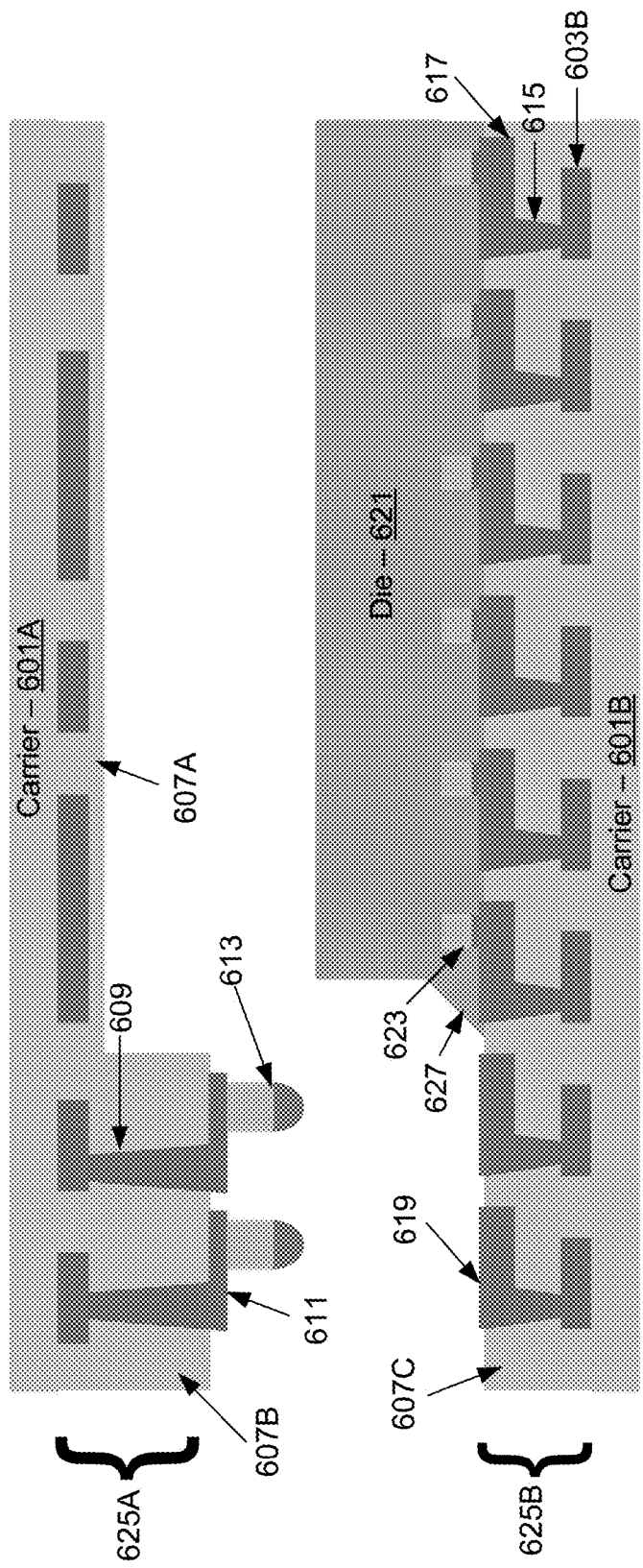
Figure 6N:
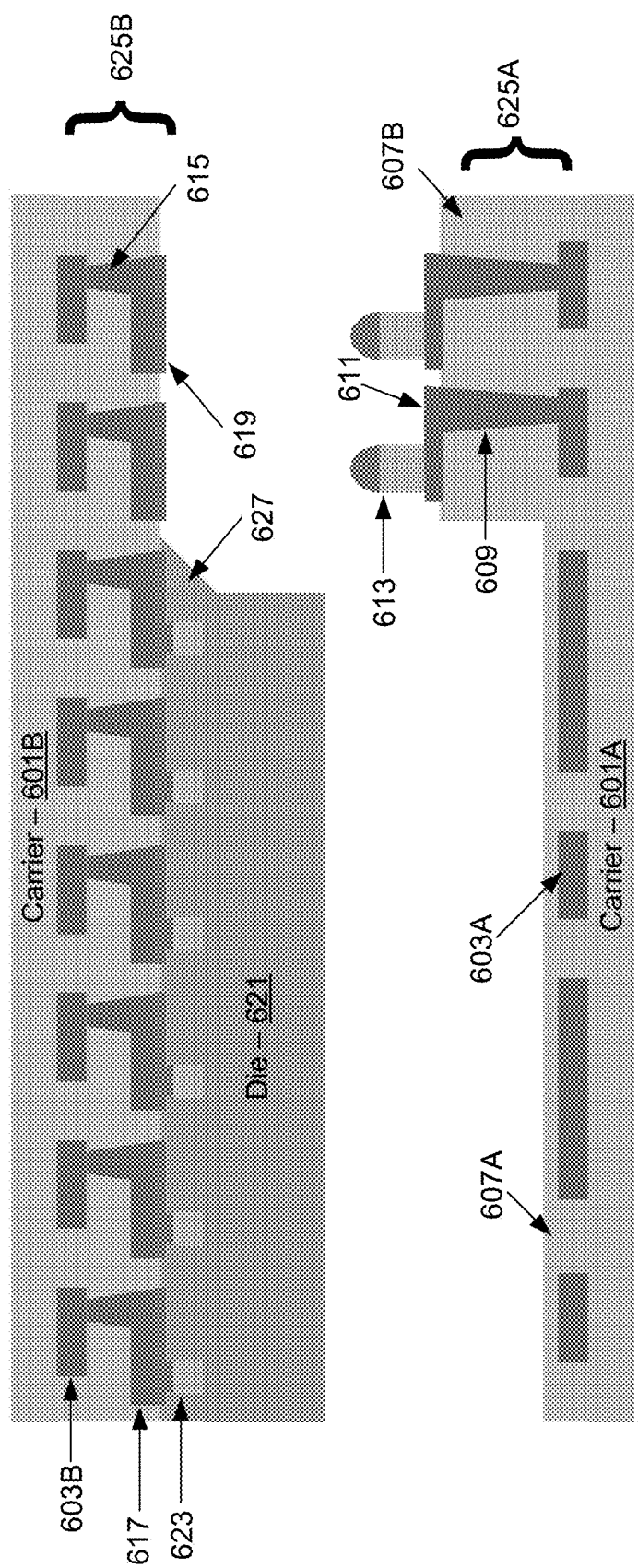
Figure 6O:
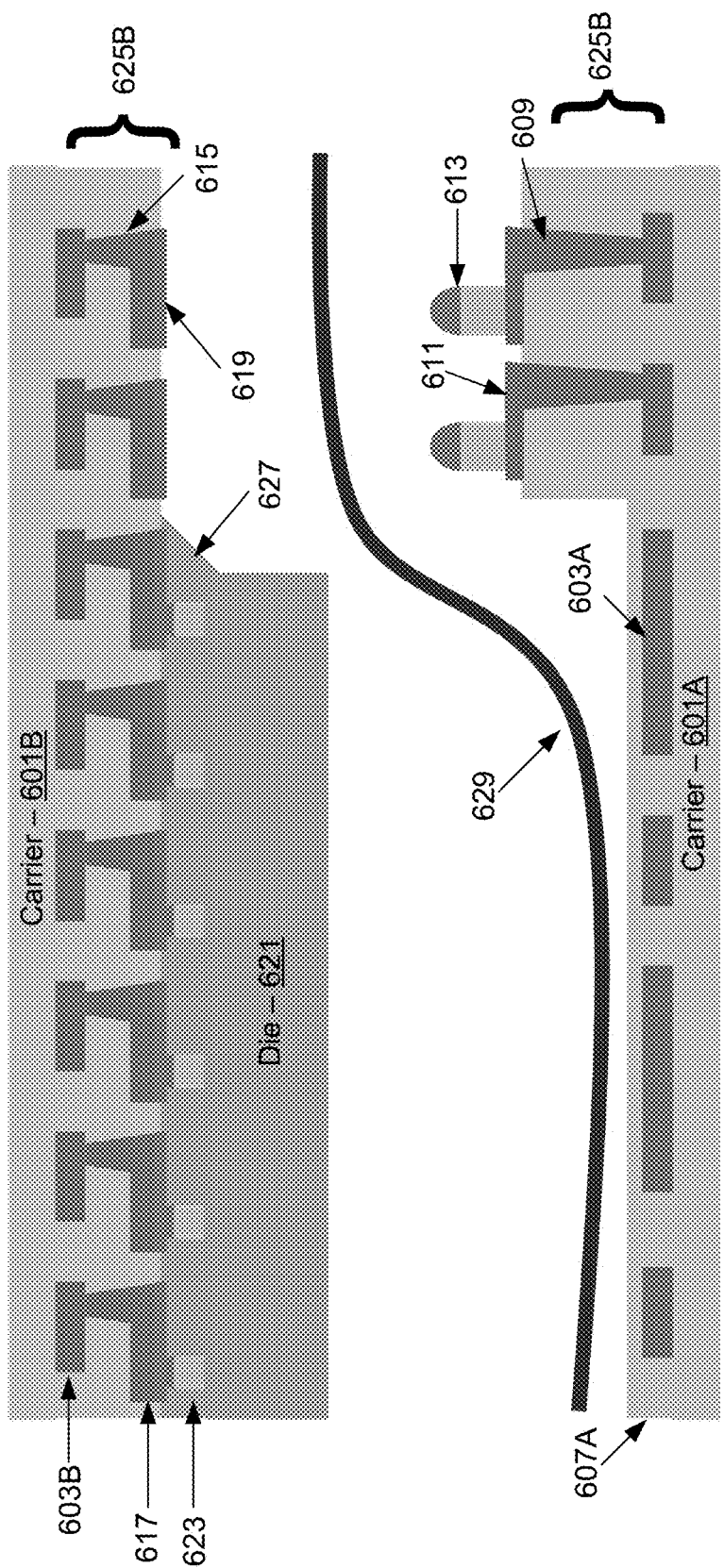
Figures 6P, 6Q:
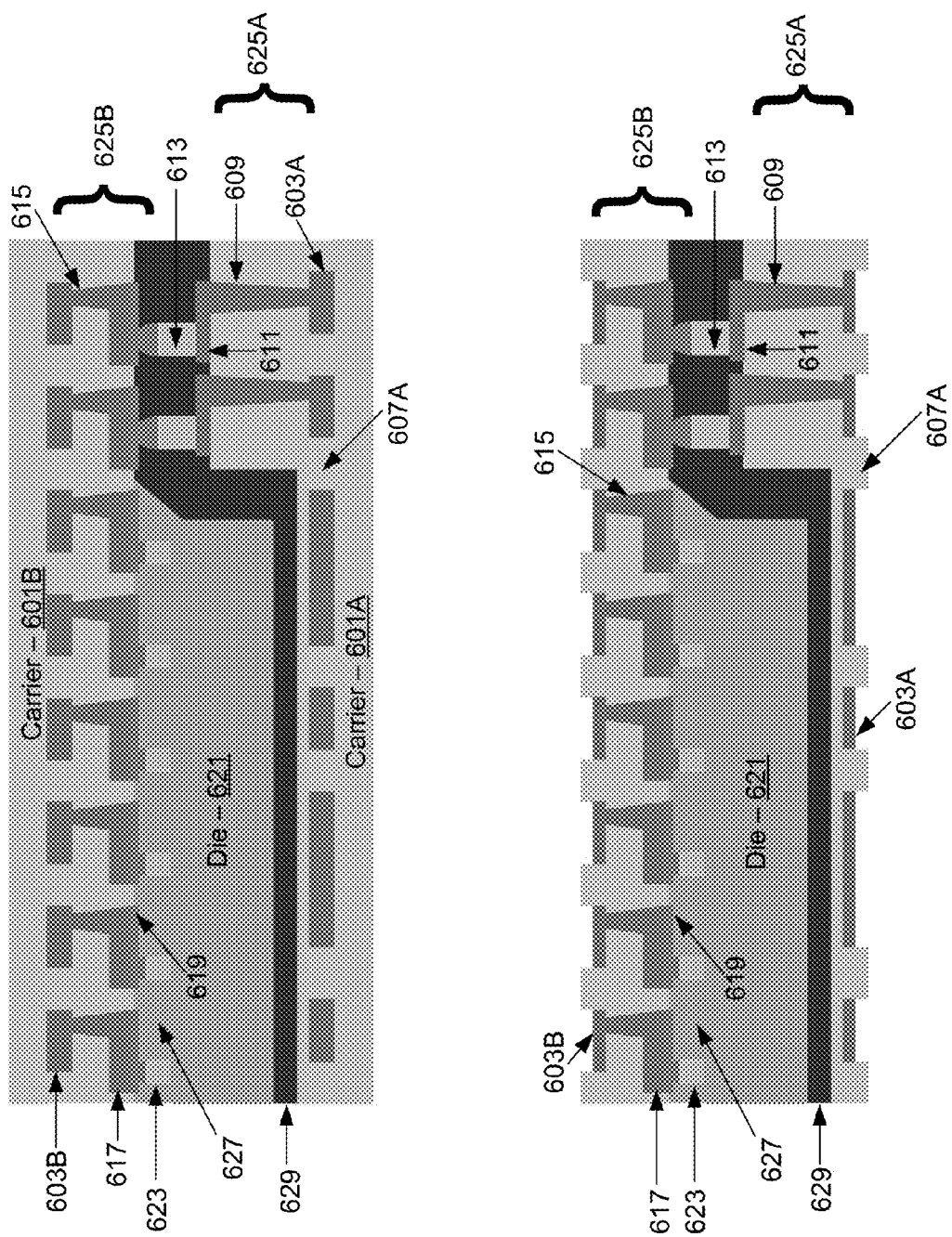
Figures 6R, 6S:
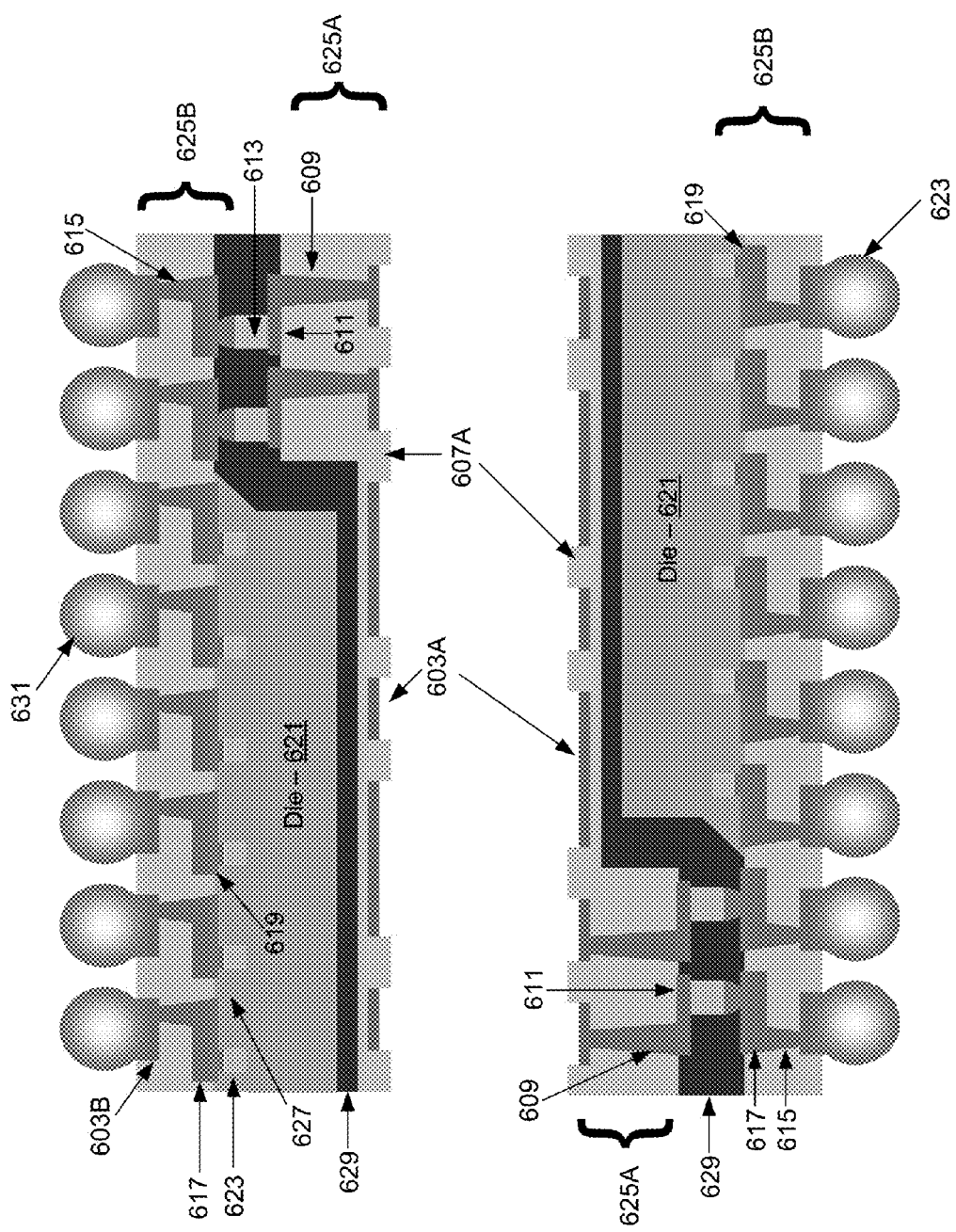

FIGS. 6A-6S illustrate example process steps in fabricating a top cavity structure with dual top-half dielectric layer, in accordance with an example embodiment of the invention. Referring to FIG. 6A there is shown two carriers 601A and 601B, which may comprise metal carriers, for example, for supporting layered structures during processing.

In FIG. 6B, layer 1 and 4 copper RDLs 603A and 603B may be formed on the metal carriers 601A and 601B. FIG. 6C illustrates a dielectric layer 607A formed on the carrier 601A. The dielectric layer 607A may comprise a laminate structure or deposited film, for example.

FIG. 6D illustrates a photoresist layer 605 formed on the carrier 601A and covering the dielectric layer 607. The photoresist layer 605 may be patterned exposing a subset of the RDL 503A, as shown in FIG. 6E, where the remaining portion of the photoresist layer 605 may comprise a block for a subsequently formed cavity.

Additional dielectric films 607B and 607C may be formed on the carriers 601A and 601B, covering the exposed RDLs 603A and 603B, as shown in FIG. 6F. In an example scenario, the dielectric films 607B and 607C may comprise laminate films, where an opening may be punched or ablated in the dielectric layer 607B prior to placement to allow for the photoresist layer 605 remaining on the carrier 601A.

FIG. 6G illustrates vias 609 and RDLs 611 formed in and on the dielectric film 607B. In an example scenario, the vias 609 may be formed by drilling or ablating the dielectric film 607A and depositing copper to fill the hole and form the RDLs 611. In addition, the RDLs may be formed after plating the entire surface and then patterning and etching the copper into RDL traces.

FIG. 6H illustrates the formation of copper bumps 613 on the RDLs 611. The copper bumps 613 may provide electrical contact to the RDLs 603B when the two structures supported by the carriers 601A and 601B are bonded together. The photoresist layer 605 may then be stripped to open a cavity for subsequent die placement, resulting in the structure shown in FIG. 6I.

As with the vias 609 and RDLs 611, trenches and vias in the dielectric film 607C may be formed via lasing and drilling, respectively, followed by copper plating to form the vias 615 and the RDLs 617, as shown in FIG. 6J. The RDLs 617 may provide electrical contact to the copper bumps 613 as well as one or more semiconductor die to be affixed to the layered structure being formed on the carrier 601B.

FIG. 6K illustrates the layered structure on the carrier 601B with a solderable surface plate layer 619 formed thereon to provide good contact with the copper bumps 613 and one or more semiconductor die to be subsequently affixed, as illustrated in FIG. 6L. In an example scenario, the solderable surface plate layer 619 may be formed on any redistribution layer in the structures for improved contact to copper bumps or other contact types.

FIG. 6L illustrates the layered structures 625A and 625B formed on the carriers 601A and 601B, respectively, with a semiconductor die 621 with copper pillars 623 to be affixed to the lower layered structure 625B making electrical contact to the RDLs 617 via the solderable surface plate layer 619. FIG. 6M illustrates the die 621 bonded to the layered structure 625B utilizing thermal compression and with non-conductive paste 627. The cavity created by the patterned or pre-formed second dielectric layer 607B enables the die 621 to be bonded to the layered structure 625B and the layered structure 625A bonded to the layered structure 625B with shorter copper pillars for the copper pillars 613 and 623, as these pillars would have to be much higher, and thus wider, without the cavity.

FIG. 6N illustrates the layered structures 625A and 625B in an inverted orientation before bonding. To enable bonding, a non-conductive film 629 may be placed between the layered structures 625A and 625B, as shown in FIG. 6O. The non-conductive film 629 is shown as a thin curved line in FIG. 6O merely for illustration purposes, and in application comprises a layer thick enough to fill the space between the layered structures 625A and 625B, as shown in FIG. 6P.

The metal carriers 601A and 601B may be removed, such as by etching or peeling away, for example, resulting in the bonded layered structures 625A and 625B with exposed RDLs 603A and 603B, as shown in FIG. 6Q. While various methods of forming a cavity for the die in the layered structures has been shown, the invention is not limited to these techniques, as other techniques may be utilized such as etching or selective deposition, for example.

FIG. 6R illustrates the bonded layered structures 625A and 625B with solder balls 631 bonded to the RDLs 603B utilizing flux print, solder attach, reflow, and clean processes, followed by a singulation step where the substrate may be diced into individual packages, each comprising a die and layered structures 625A and 625B. The resulting structure is shown in FIG. 6S.

Figures 7A, 7B:
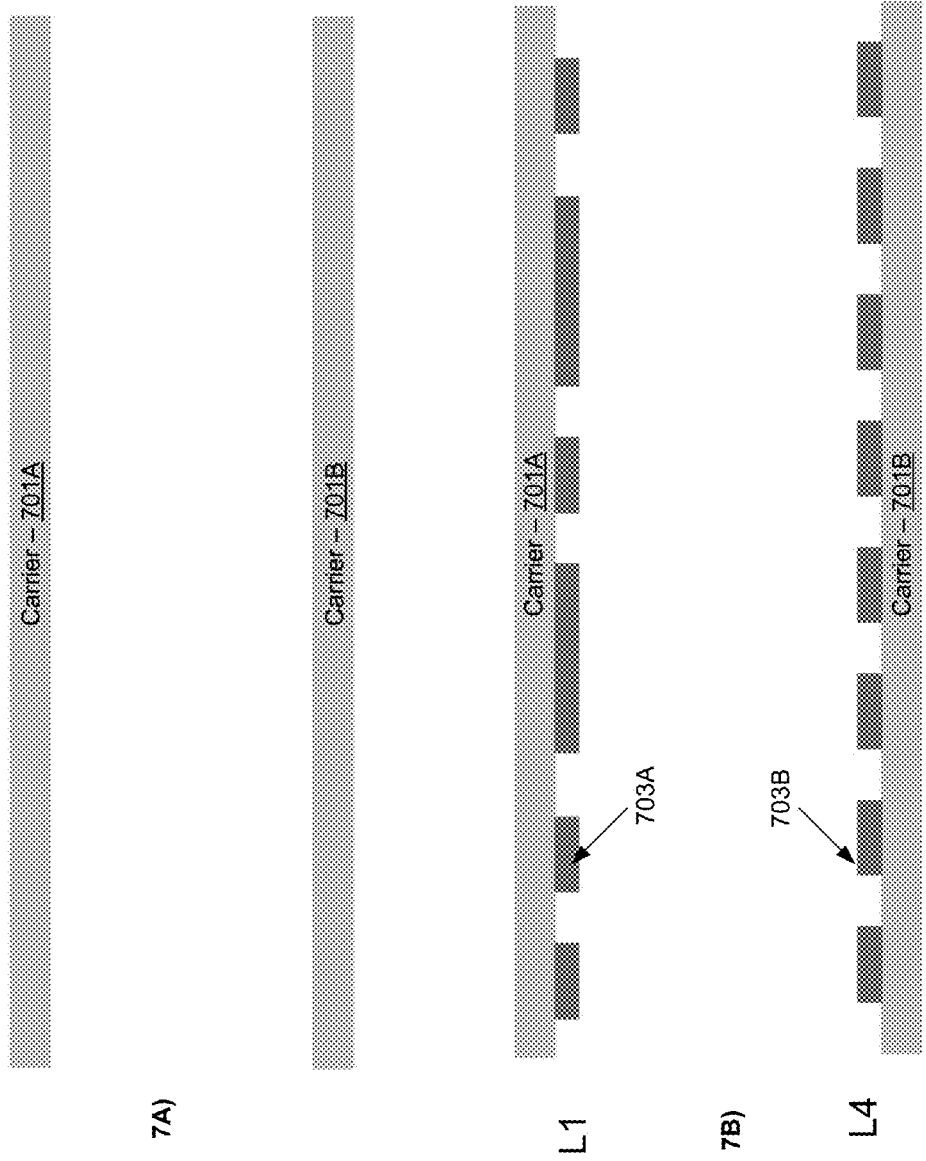
FIGS. 7A-7S illustrate example process steps in fabricating a bottom cavity structure with single top-half dielectric layer, in accordance with an example embodiment of the invention.
Figures 7C, 7D:
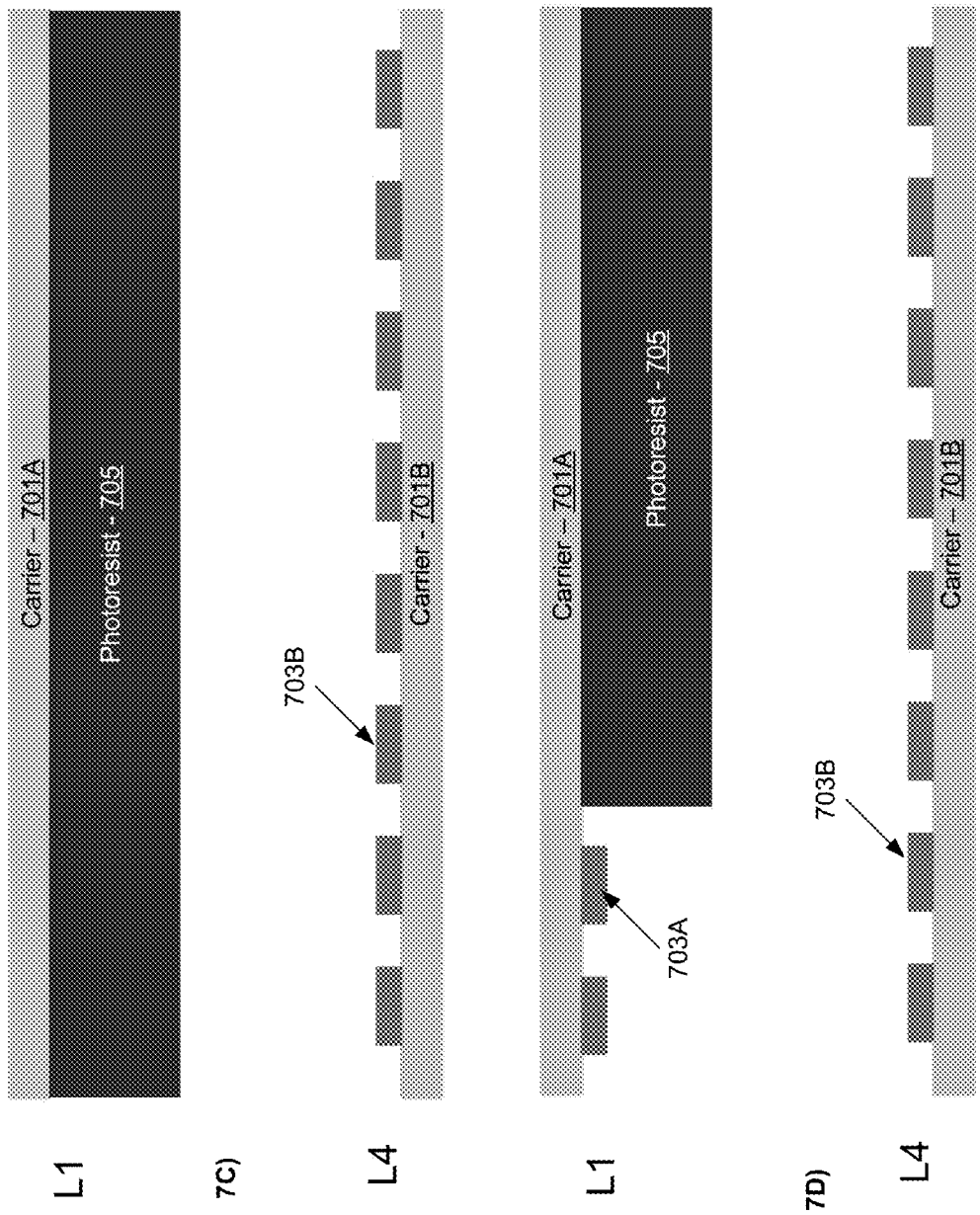
Figures 7E, 7F:
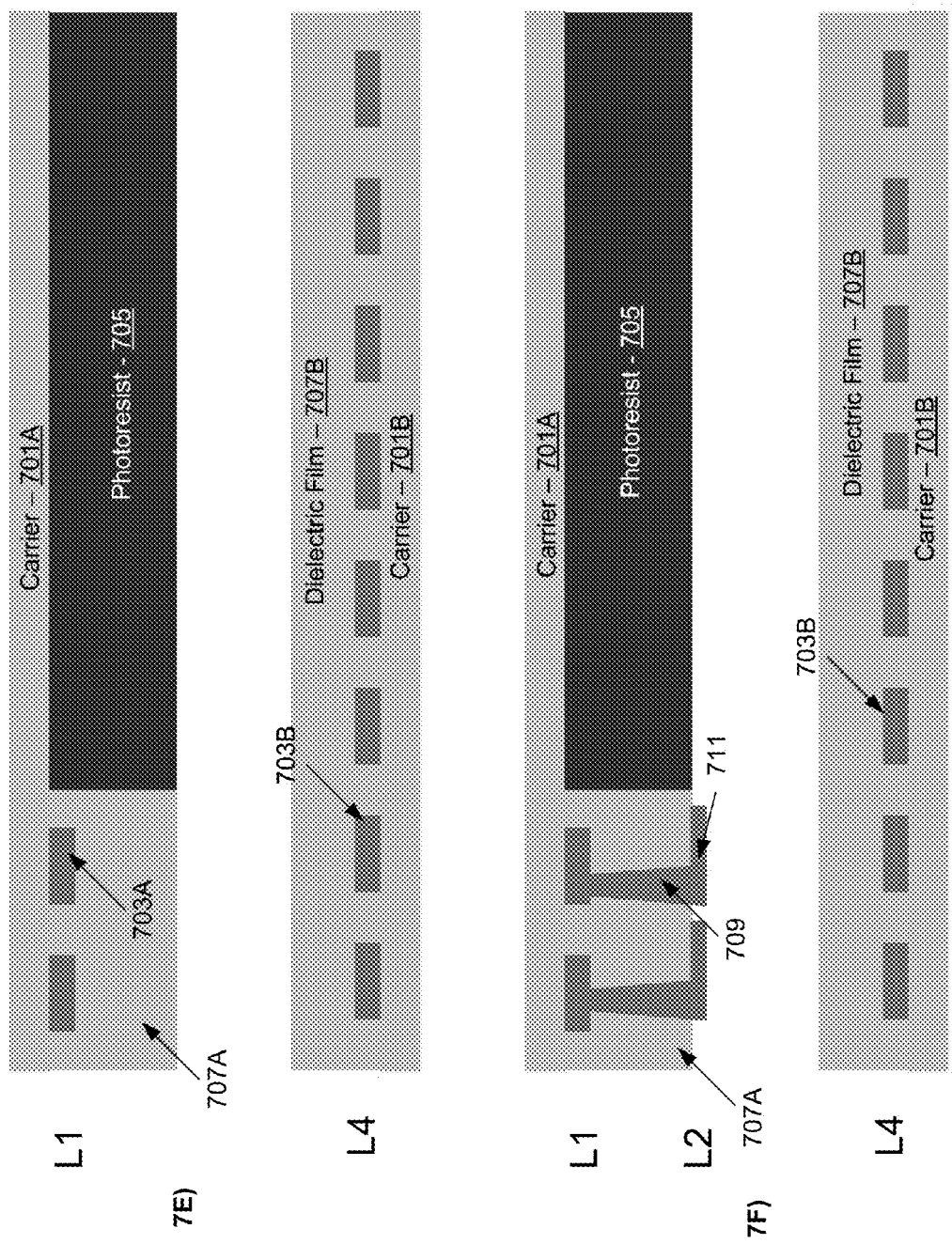
Figure 7G:
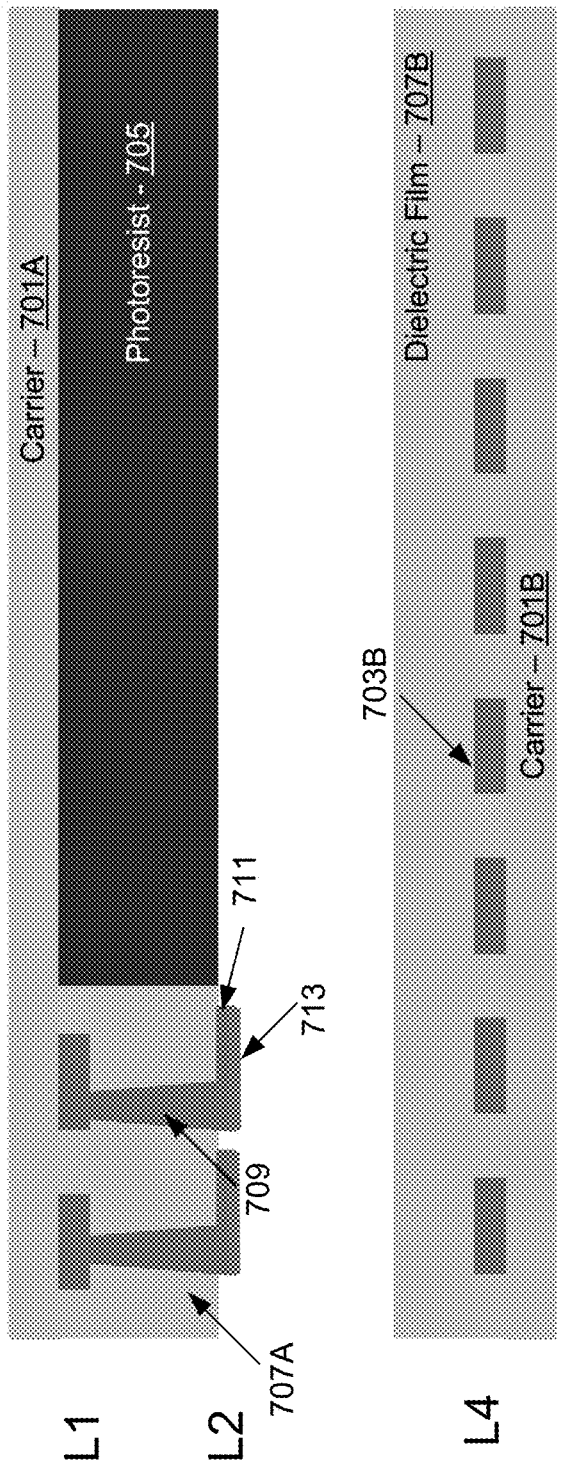
Figure 7H:
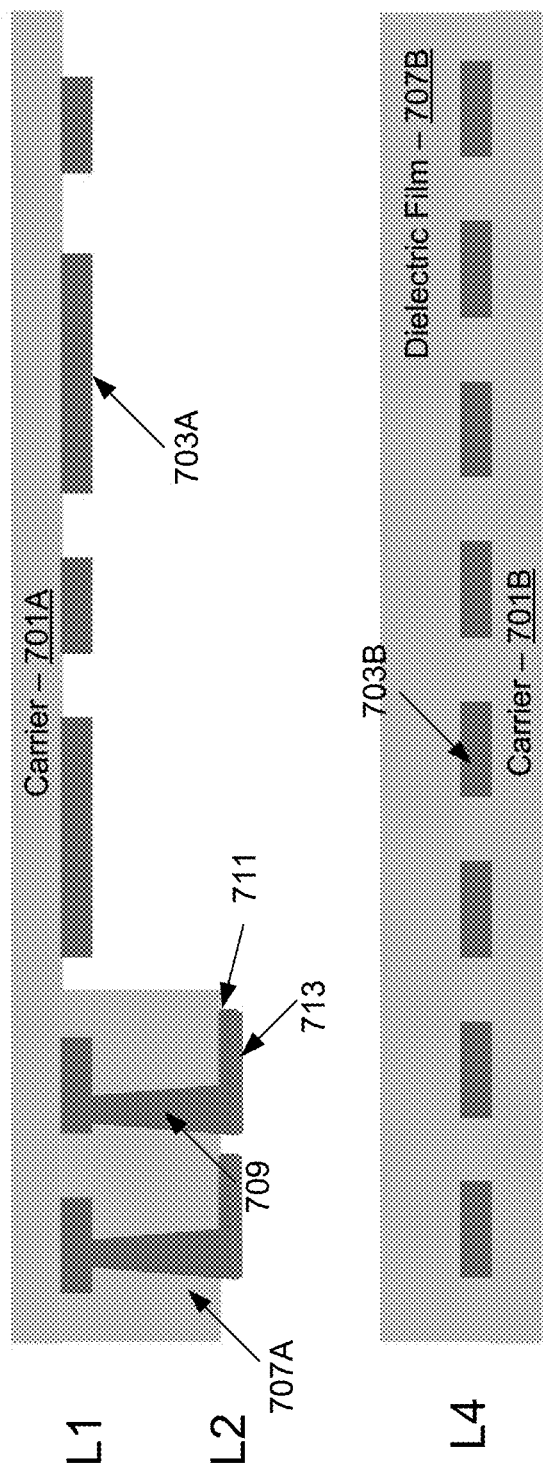
Figure 7I:
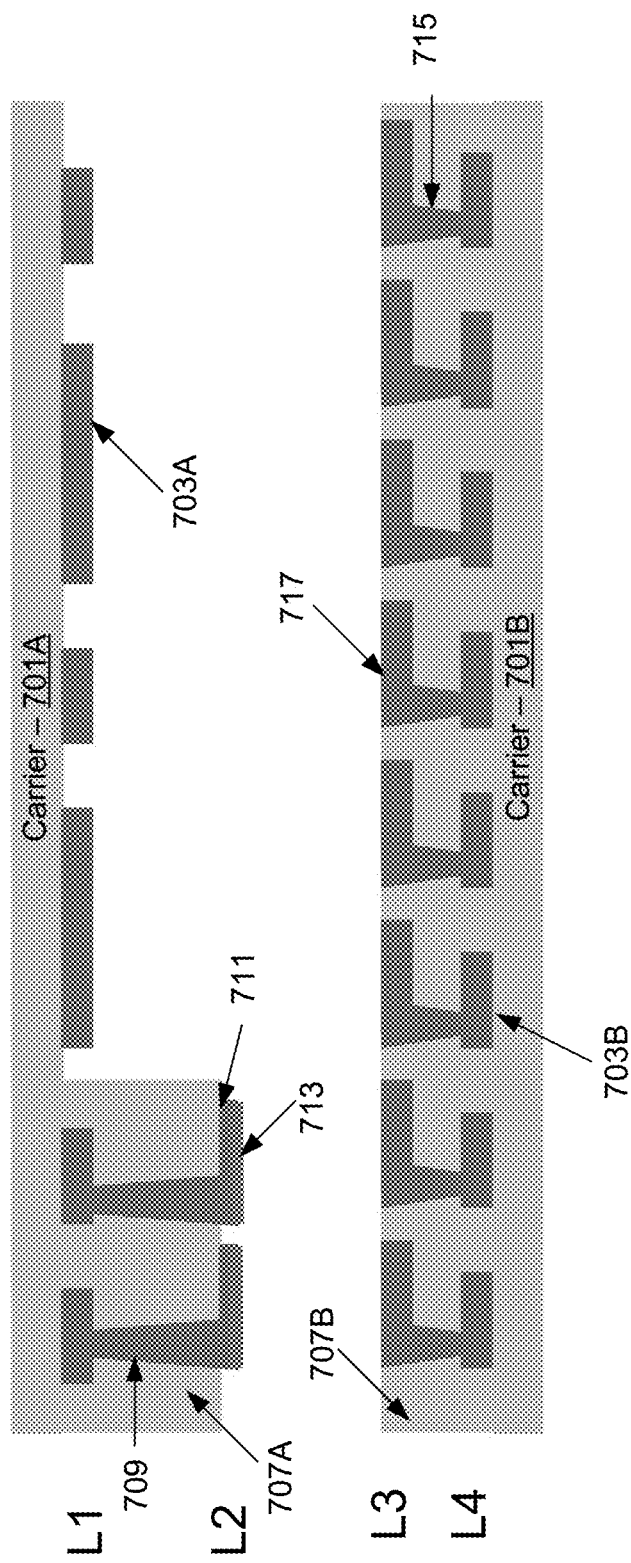
Figure 7J:
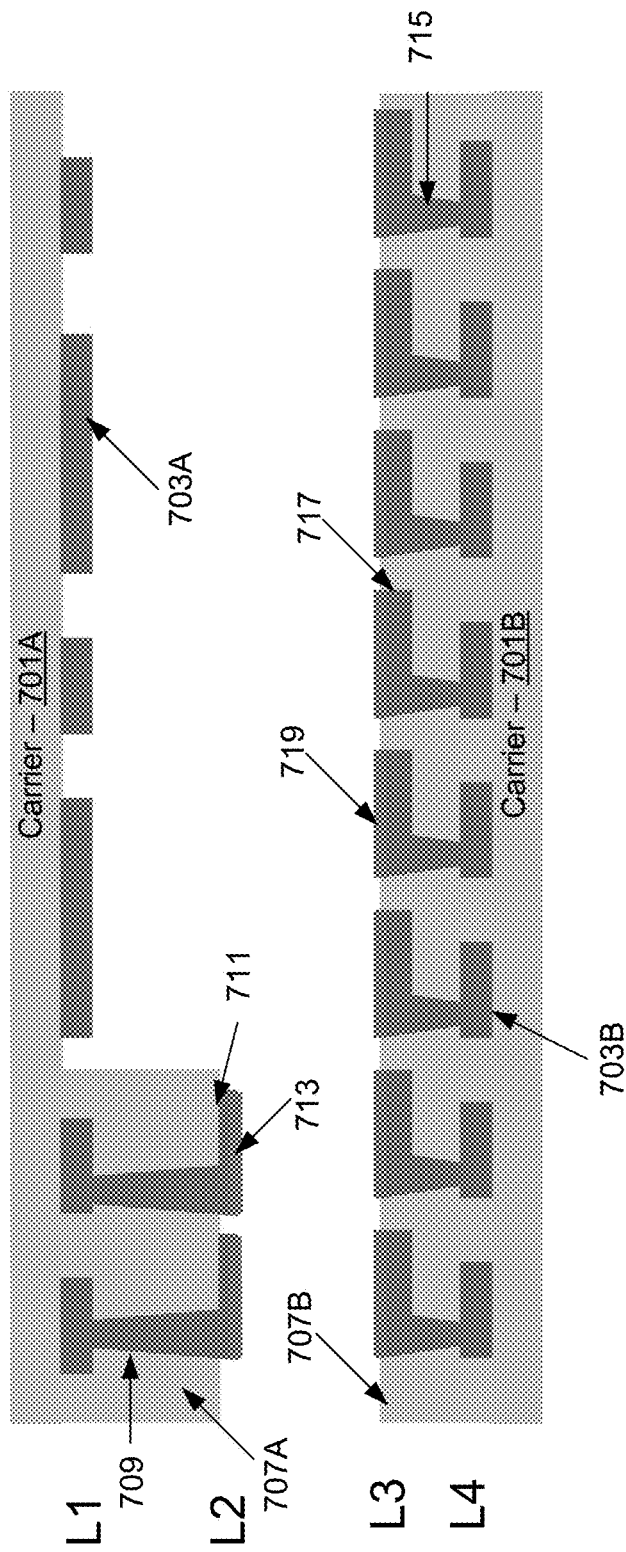
Figure 7K:
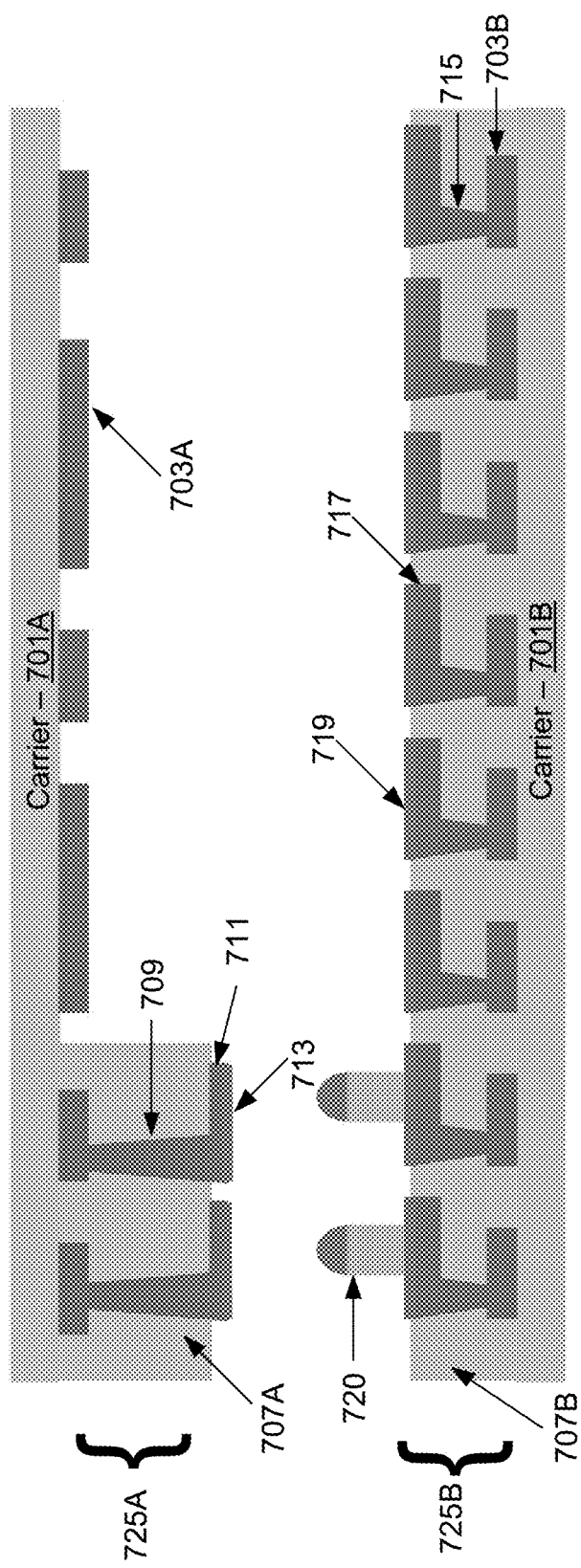
Figure 7L:
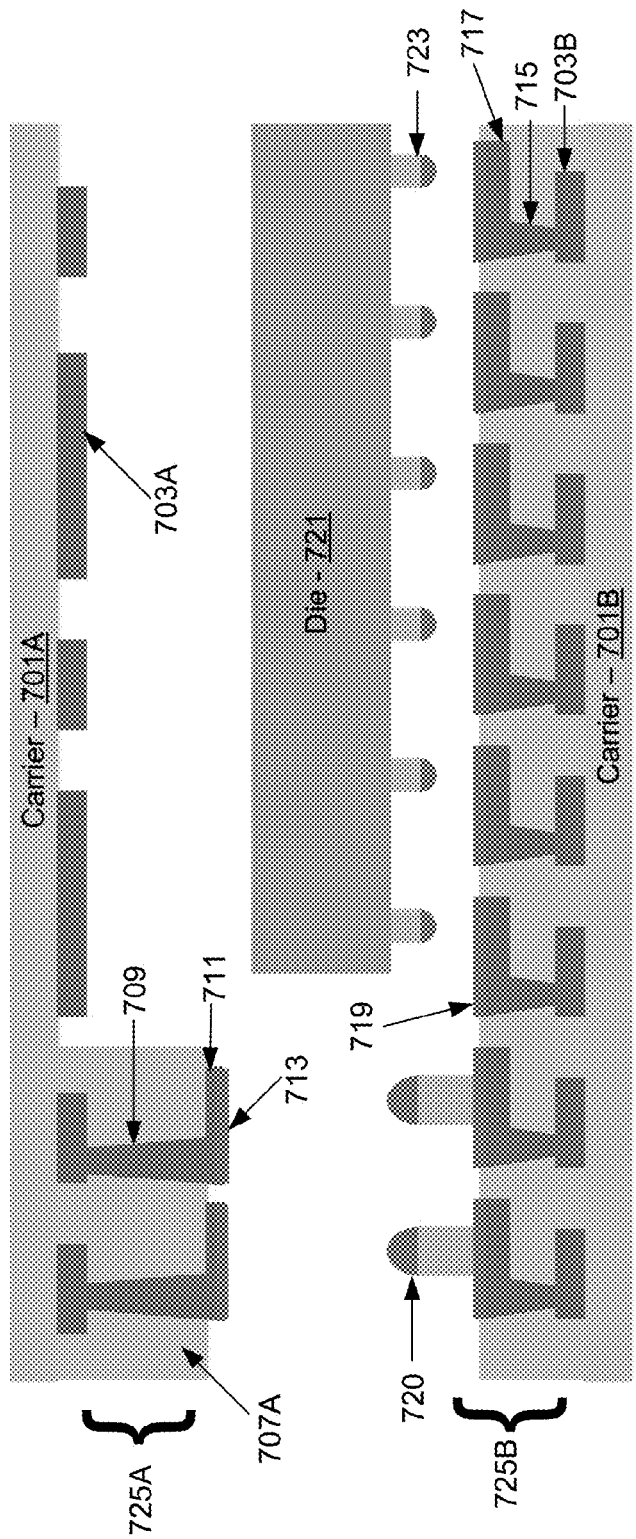
Figure 7M:
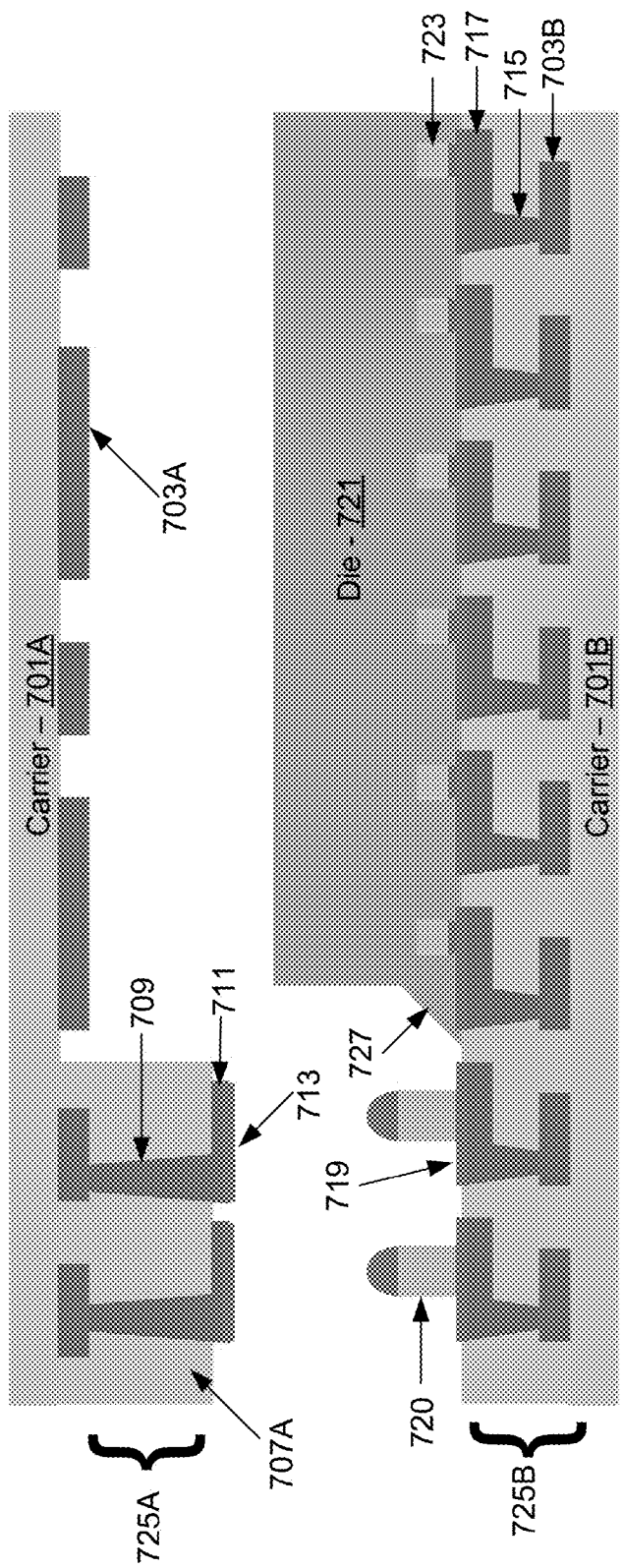
Figure 7N:
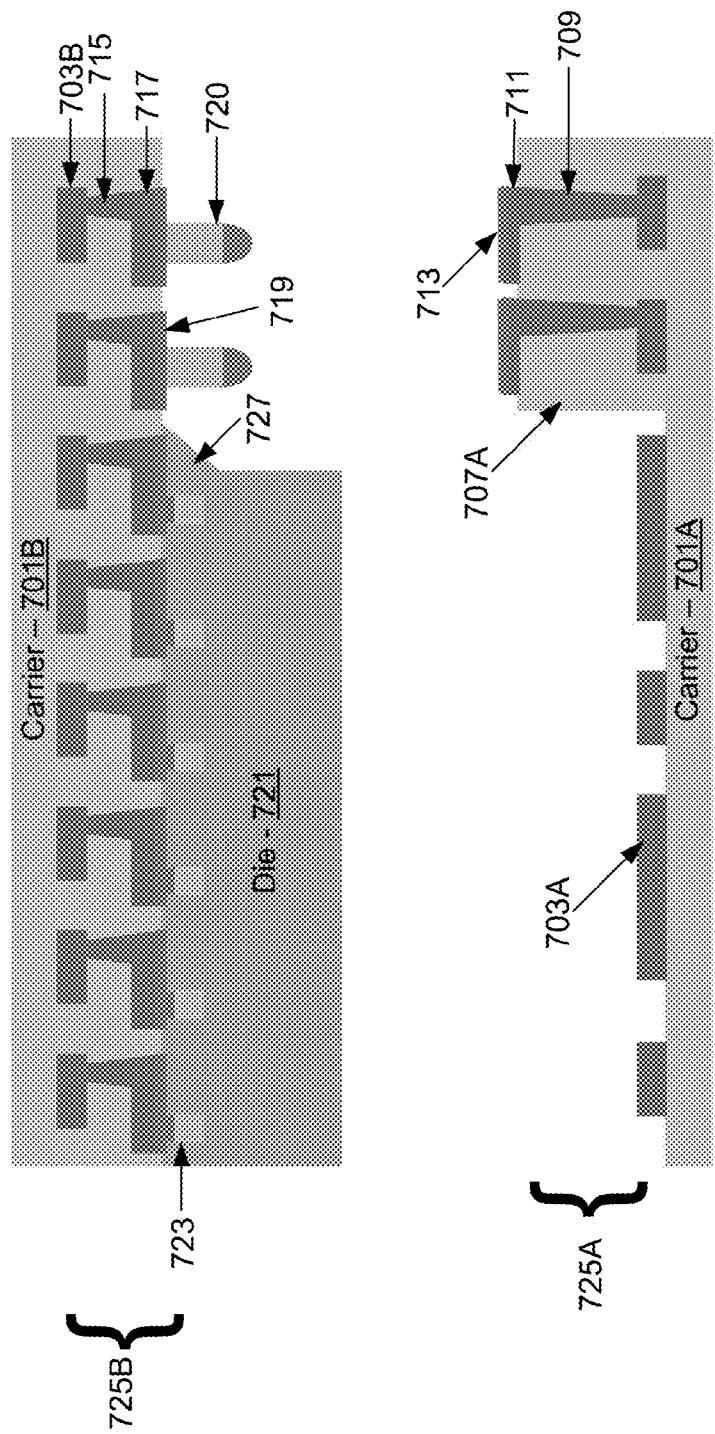
Figure 7O:
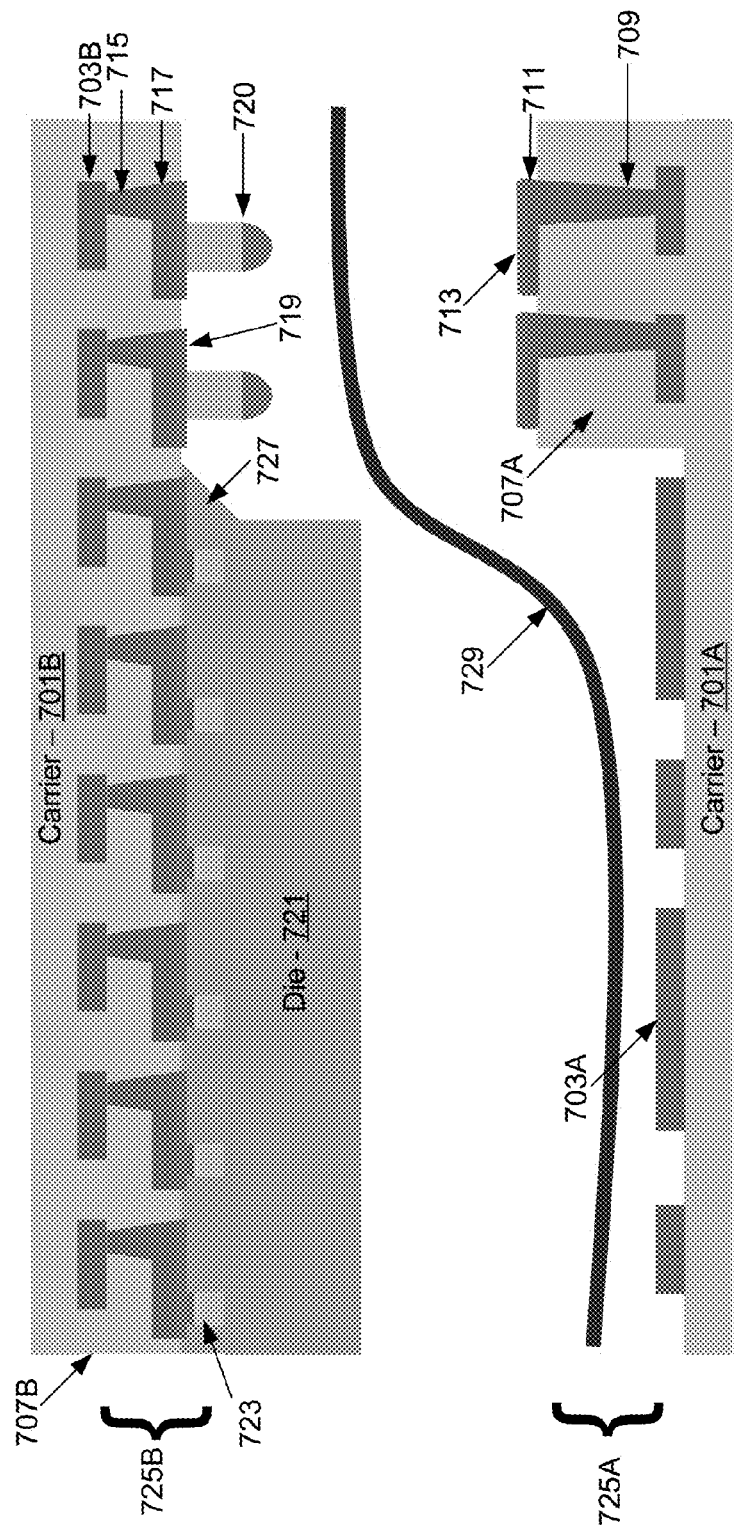
Figures 7P, 7Q:
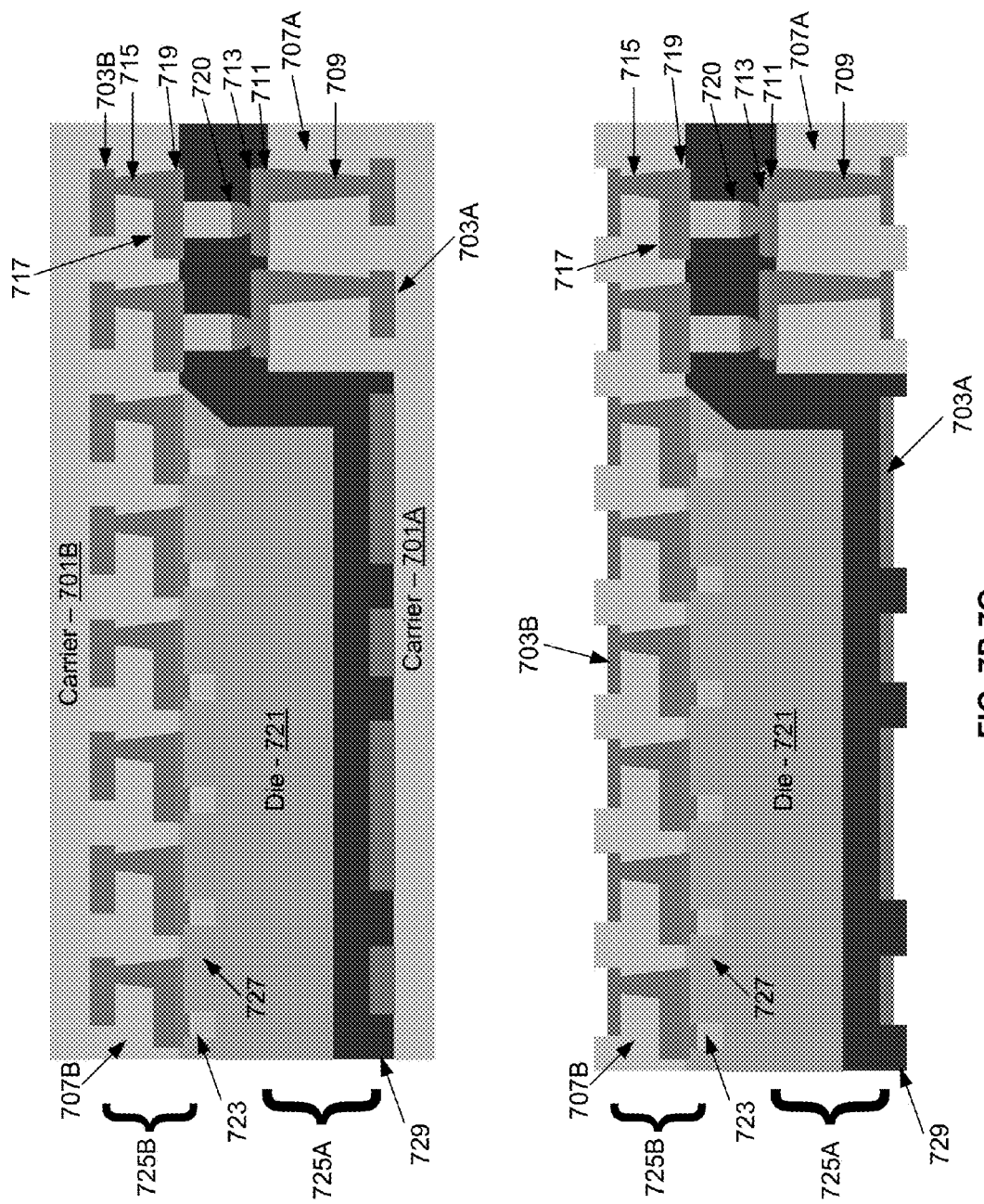
Figure 7R:
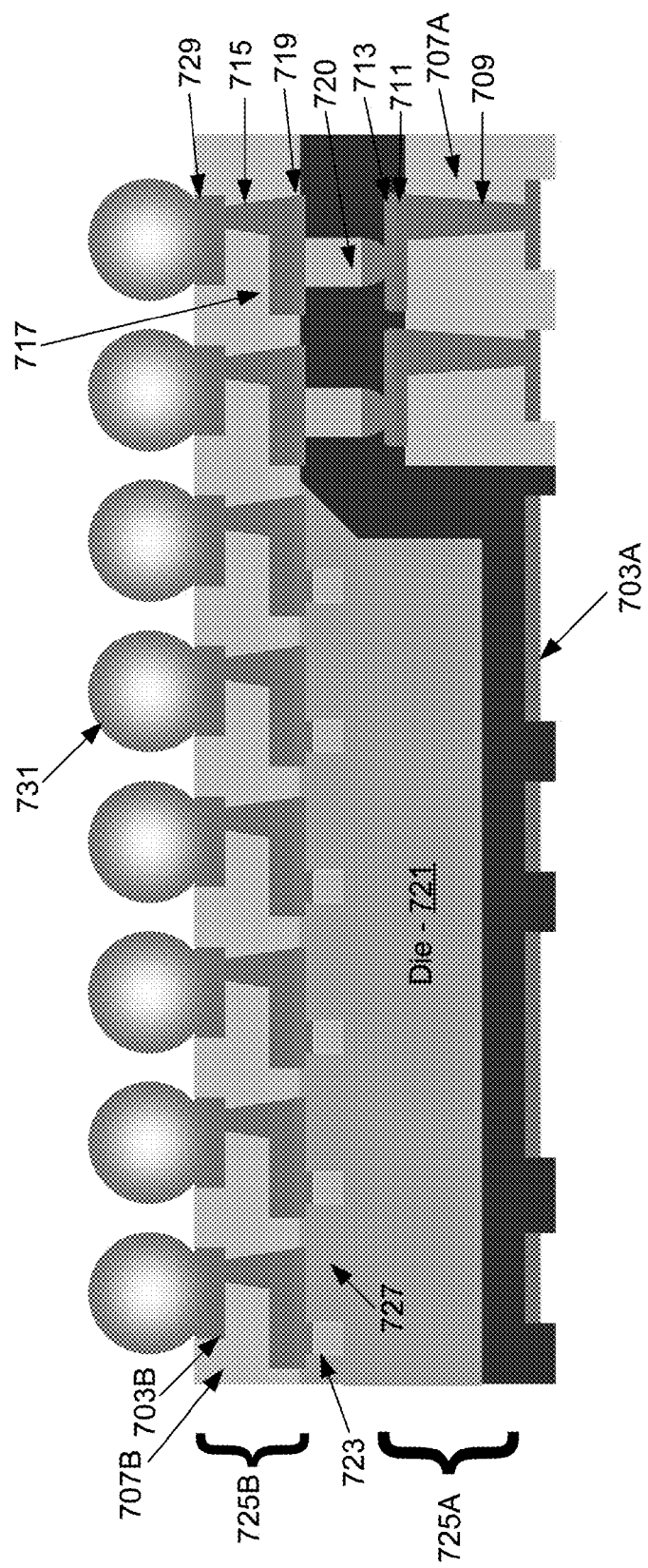
Figure 7S:
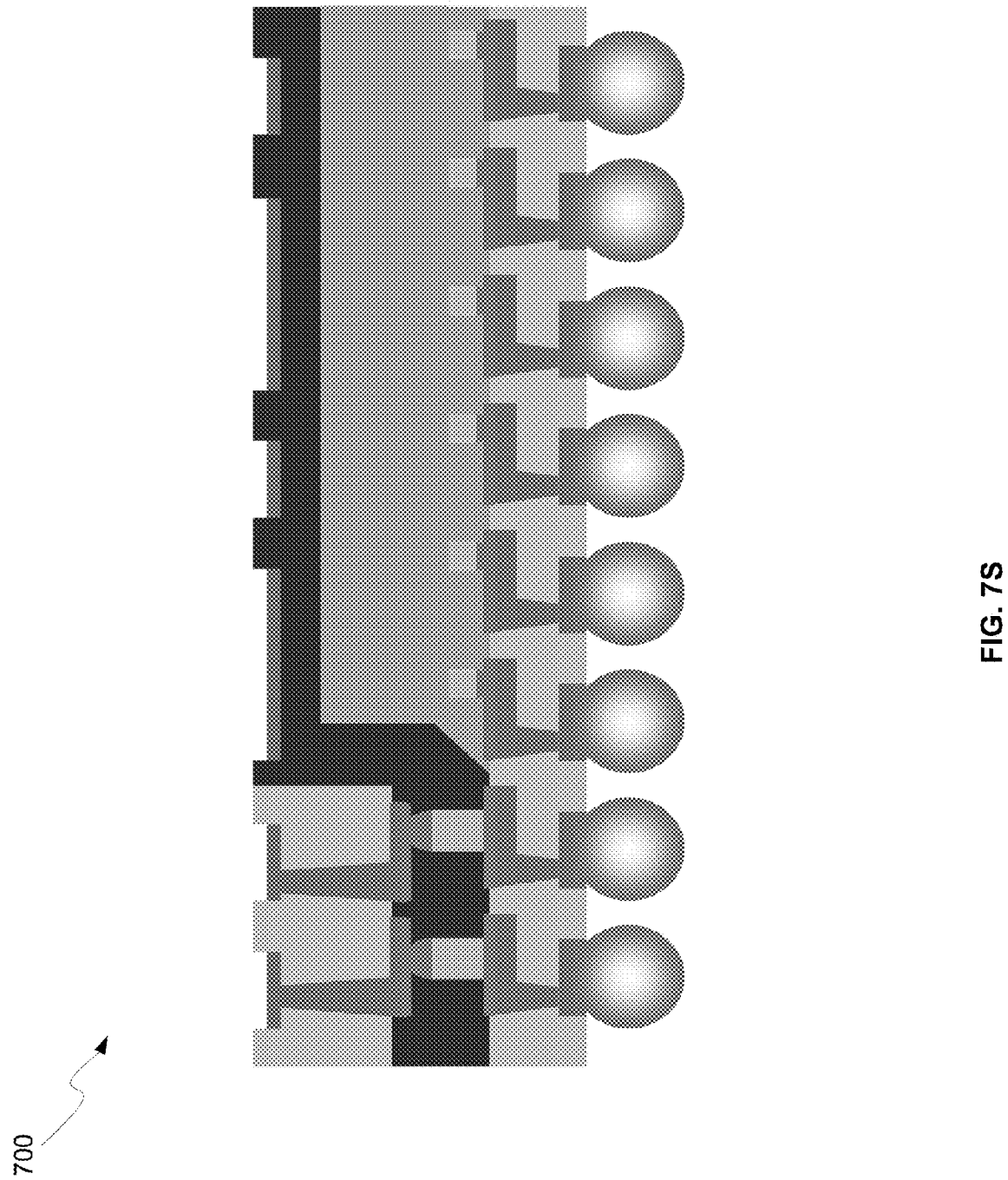

FIGS. 7A-7S illustrate example process steps in fabricating a bottom cavity structure with single top-half dielectric layer, in accordance with an example embodiment of the invention. Referring to FIG. 7A there is shown two carriers 701A and 701B, which may comprise metal carriers, for example, for supporting layered structures during processing.

In FIG. 7B, layer 1 and 4 copper RDLs 703A and 703B may be formed on the metal carriers 701A and 701B. FIG. 7C illustrates a photoresist layer 705 formed on the carrier 701A. The photoresist layer 705 may comprise a laminate structure or a spin-in photoresist material, for example.

FIG. 7D illustrates the patterning of the photoresist layer 705 exposing a subset of the RDL 703A where the remaining portion of the photoresist layer 705 may comprise a block for a subsequently formed cavity. Dielectric films 707A and 707B may be formed on the carriers 701A and 701B, covering the exposed RDLs 703A and 703B, as shown in FIG. 7E. In an example scenario, the dielectric films 707A and 707B may comprise laminate films, where an opening may be punched or ablated in the dielectric layer 707A prior to placement to allow for the photoresist layer 705 remaining on the carrier 701A.

FIG. 7F illustrates vias 709 and 7DLs 511 formed in and on the dielectric film 707A. In an example scenario, the vias 709 may be formed by drilling or ablating the dielectric film 707A and depositing copper to fill the hole and form the RDLs 711. In addition, the RDLs may be formed after plating the entire surface and then patterning and etching the copper into RDL traces.

FIG. 7G illustrates the formation of solderable surface plate layer 713 on the RDLs 711. The solderable surface plate layer 713 may provide good electrical contact to copper bumps subsequently formed on RDLs and vias formed on the RDLs 703B when the two structures supported by the carriers 701A and 701B are bonded together. The photoresist layer 705 may then be stripped to open a cavity for subsequent die placement, resulting in the structure shown in FIG. 7H.

As with the vias 709 and RDLs 711, trenches and vias in the dielectric film 707B may be formed via lasing and drilling, respectively, followed by copper plating to form the vias 715 and the RDLs 717, as shown in FIG. 7I. The RDLs 717 may provide electrical contact to one or more semiconductor die to be affixed to the layered structure being formed on the carrier 701B.

FIG. 7J illustrates the layered structure on the carrier 701B with a solderable surface plate layer 719 formed thereon to provide good contact with subsequently placed copper bumps, as illustrated in FIG. 7K, and one or more semiconductor die to be subsequently affixed, as illustrated in FIG. 7L.

FIG. 7K illustrates the layered structures 725A and 725B fabricated by the steps shown in FIGS. 7A-7J, with solder bumps 720 formed on the solderable surface plate layer 719 on layered structure 725B.

FIG. 7L illustrates the layered structures 725A and 725B formed on the carriers 701A and 701B, respectively, with a semiconductor die 721 with copper pillars 723 to be affixed to the lower layered structure making electrical contact to the RDLs 717 via the solderable surface plate layer 719. FIG. 7M illustrates the die 721 bonded to the layered structure on the carrier 701B utilizing thermal compression and with non-conductive paste 727.

FIG. 7N illustrates the layered structures 725A and 725B in an inverted orientation before bonding together. To enable bonding, a non-conductive film 729 may be placed between the layered structures 725A and 725B, as shown in FIG. 7O. The non-conductive film 729 is shown as a thin curved line in FIG. 7O merely for illustration purposes, and in application comprises a layer thick enough to fill the space between the layered structures 725A and 725B, as shown in FIG. 7P.

The metal carriers 701A and 701B may be removed, such as by etching or peeling away, for example, resulting in the bonded layered structures 725A and 725B with exposed RDLs 703A and 703B, as shown in FIG. 7Q.

FIG. 7R illustrates the bonded layered structures 725A and 725B with solder balls 731 bonded to the RDLs 703B utilizing flux print layer 729, solder attach, reflow, and clean processes, followed by a singulation step where the substrate may be diced into individual packages, each comprising a die and layered structures 725A and 725B. The resulting structure 700 is shown in FIG. 7S. FIGS. 8A-8T illustrate example process steps in fabricating a bottom cavity structure with dual top-half dielectric layer, in accordance with an example embodiment of the invention. Referring to FIG. 8A there is shown two carriers 801A and 801B, which may comprise metal carriers, for example, for supporting layered structures during processing.

Figures 8C, 8D:
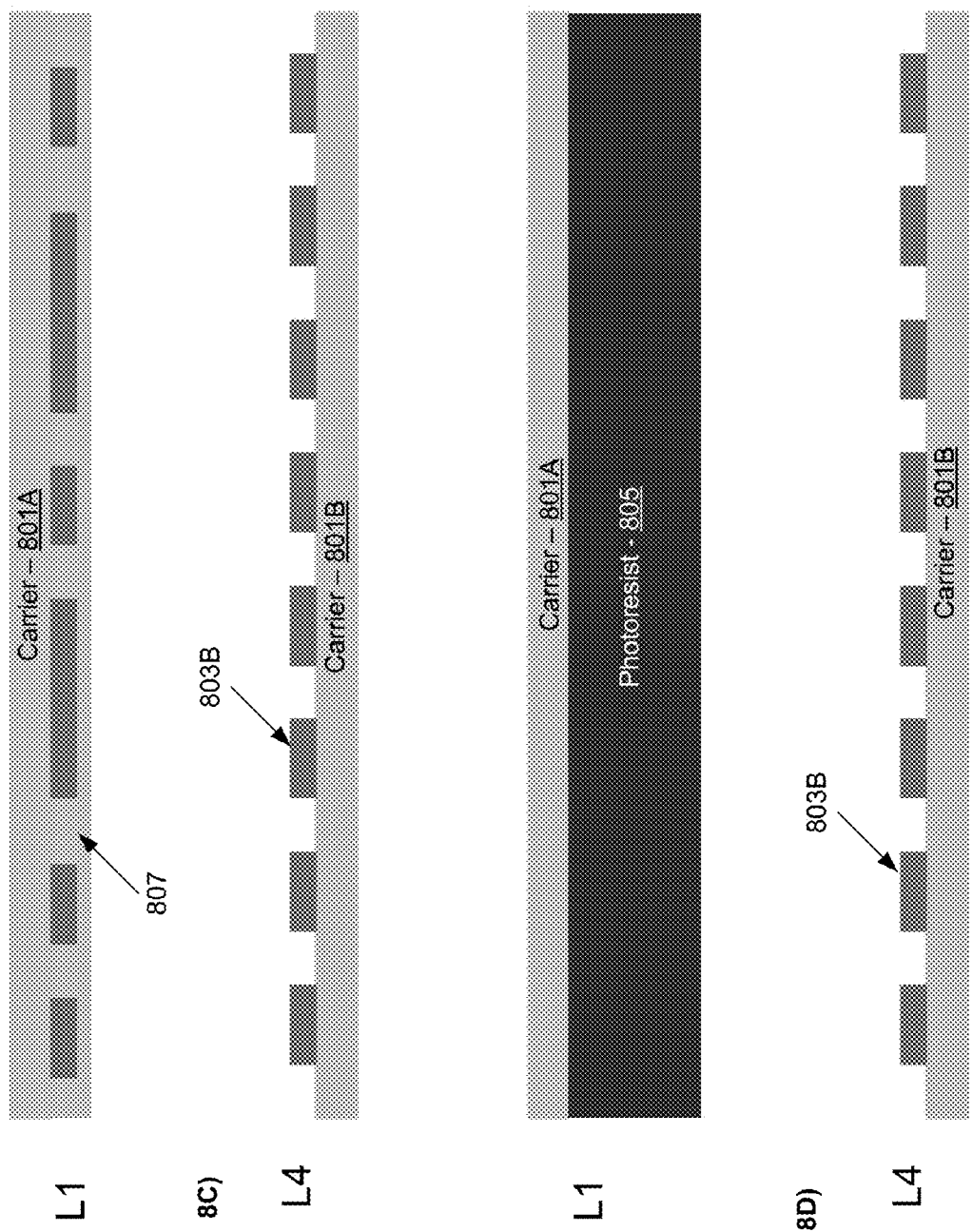
FIGS. 8A-8T illustrate example process steps in fabricating a bottom cavity structure with dual top-half dielectric layer, in accordance with an example embodiment of the invention.

In FIG. 8B, layer 1 and 4 copper RDLs 803A and 803B may be formed on the metal carriers 801A and 801B. FIG. 8C illustrates a dielectric layer 807A formed on the carrier 801A. The dielectric layer 807A may comprise a laminate structure or deposited film, for example.

FIG. 8D illustrates a photoresist layer 805 formed on the carrier 801A and covering the dielectric layer 807. The photoresist layer 805 may be patterned exposing a subset of the RDL 803A, as shown in FIG. 8E, where the remaining portion of the photoresist layer 805 may comprise a block for a subsequently formed cavity.

Figures 8E, 8F:
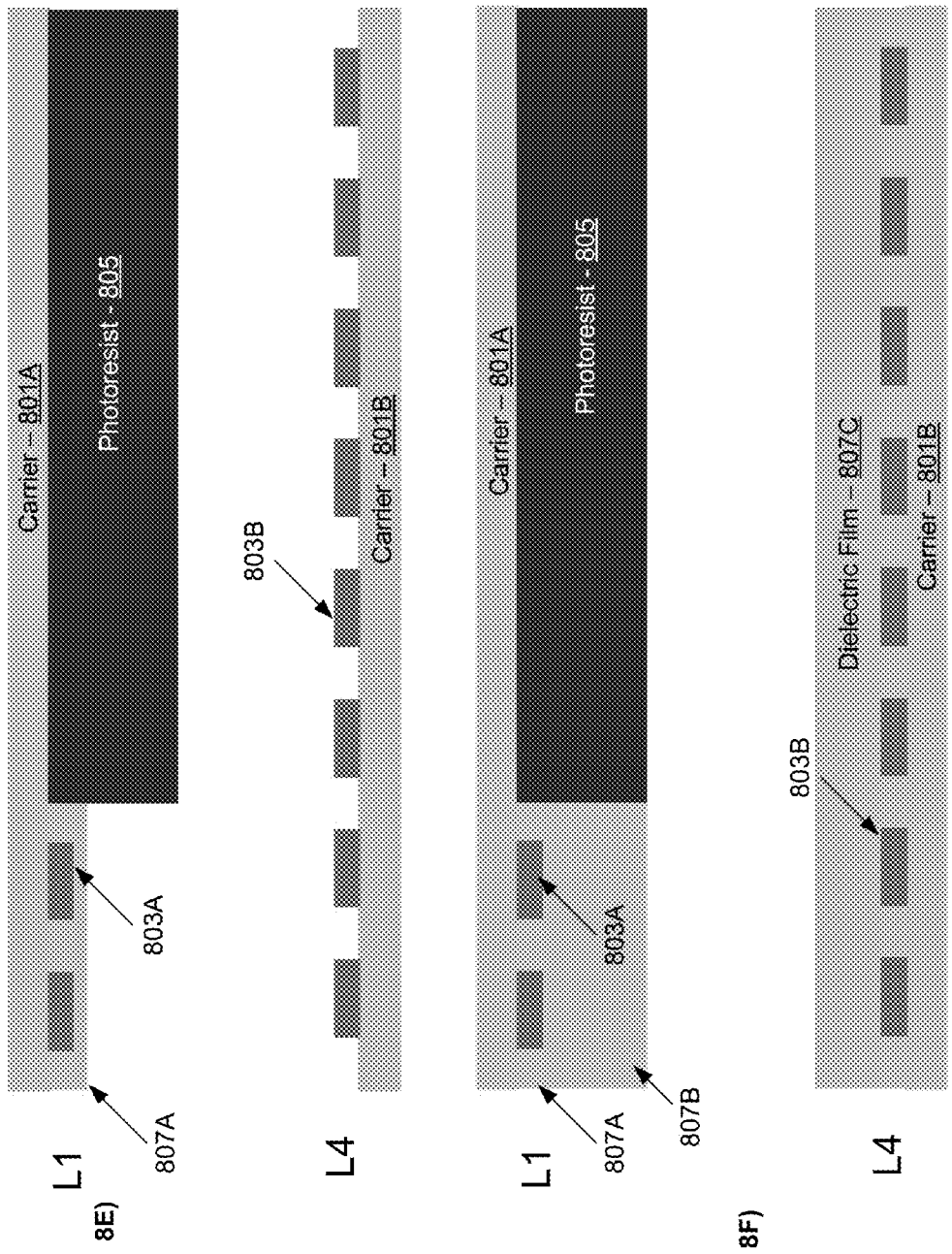

Additional dielectric films 807B and 807C may be formed on the carriers 801A and 801B, covering the exposed RDLs 803A and 803B, as shown in FIG. 8F. In an example scenario, the dielectric films 807B and 807C may comprise laminate films, where an opening may be punched or ablated in the dielectric layer 807B prior to placement to allow for the photoresist layer 805 remaining on the carrier 801A.

Figure 8G:
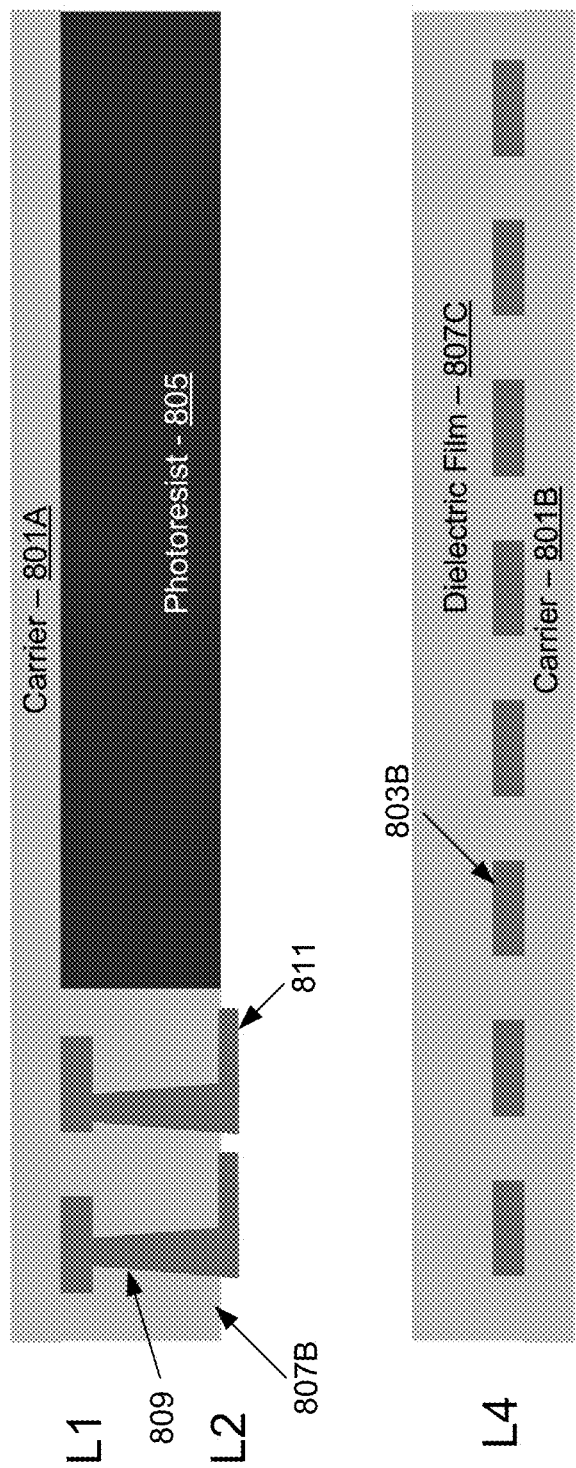

FIG. 8G illustrates vias 809 and RDLs 811 formed in and on the dielectric film 807B. In an example scenario, the vias 809 may be formed by drilling or ablating the dielectric film 807A and depositing copper to fill the hole and form the RDLs 811. In addition, the RDLs may be formed after plating the entire surface and then patterning and etching the copper into RDL traces.

Figure 8H:
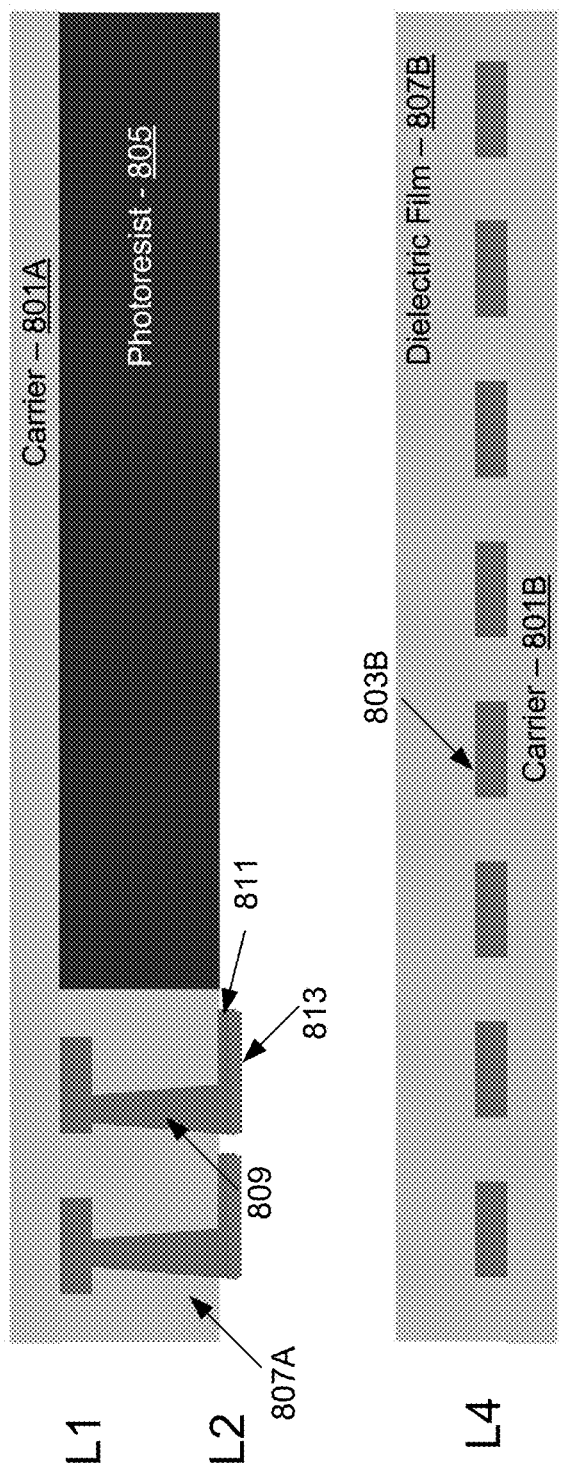
Figure 8I:
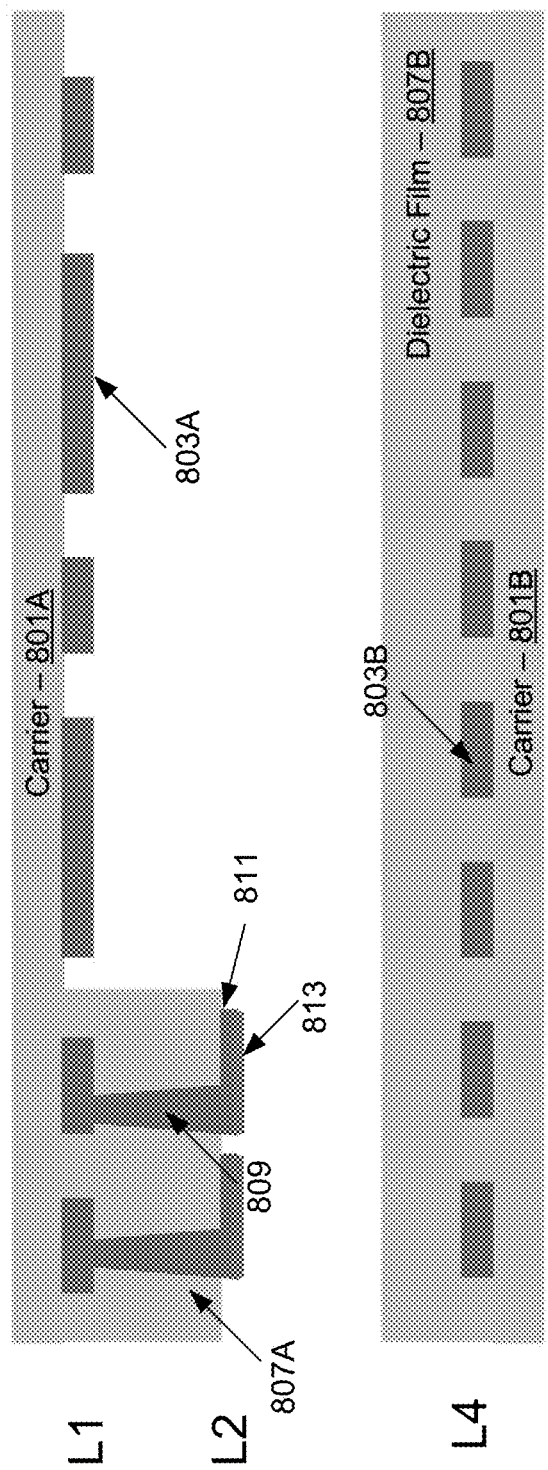

FIG. 8H illustrates the formation of solderable surface plate layer 813 on the RDLs 811. The solderable surface plate layer 813 may provide good electrical contact to copper bumps subsequently formed on RDLs and vias formed on the RDLs 803B when the two structures supported by the carriers 801A and 801B are bonded together. The photoresist layer 805 may then be stripped to open a cavity for subsequent die placement, resulting in the structure shown in FIG. 8I.

Figure 8J:
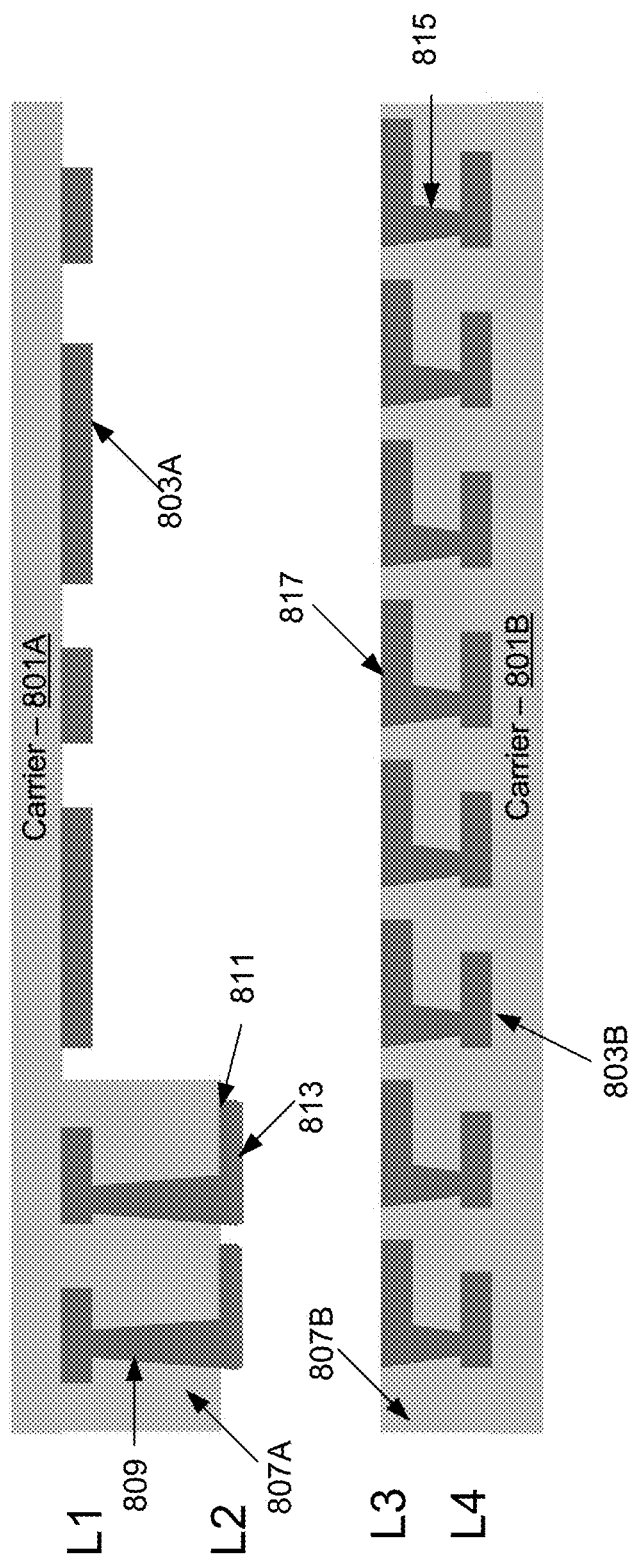

As with the vias 809 and RDLs 811, trenches and vias in the dielectric film 807B may be formed via lasing and drilling, respectively, followed by copper plating to form the vias 815 and the RDLs 817, as shown in FIG. 8J. The RDLs 817 may provide electrical contact to one or more semiconductor die to be affixed to the layered structure being formed on the carrier 801B.

Figure 8K:
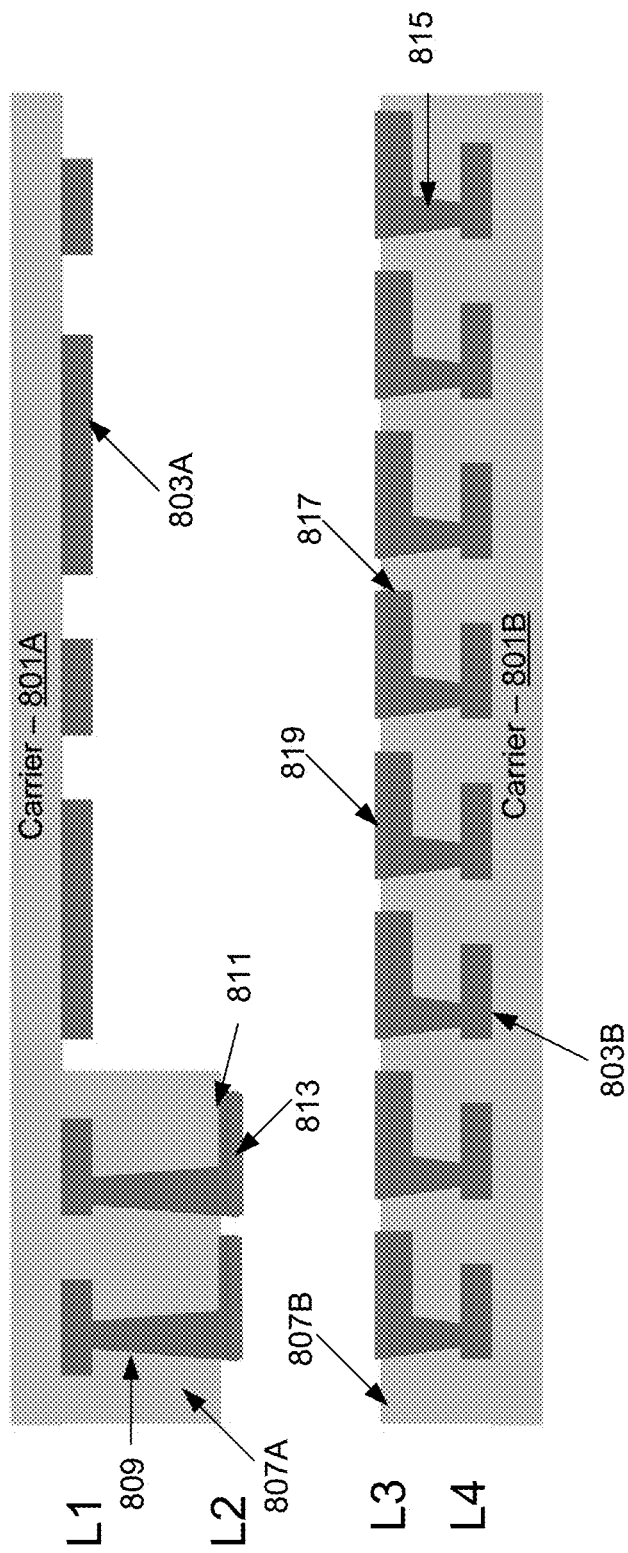
Figure 8L:
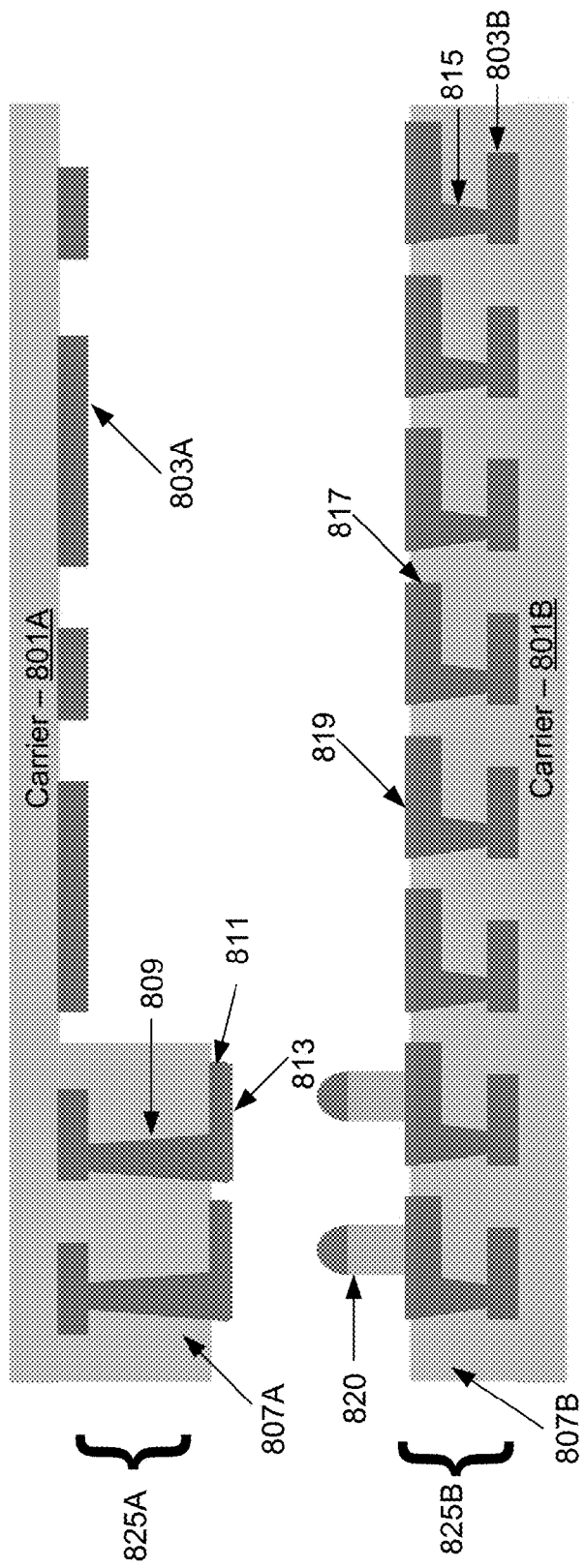
Figure 8M:
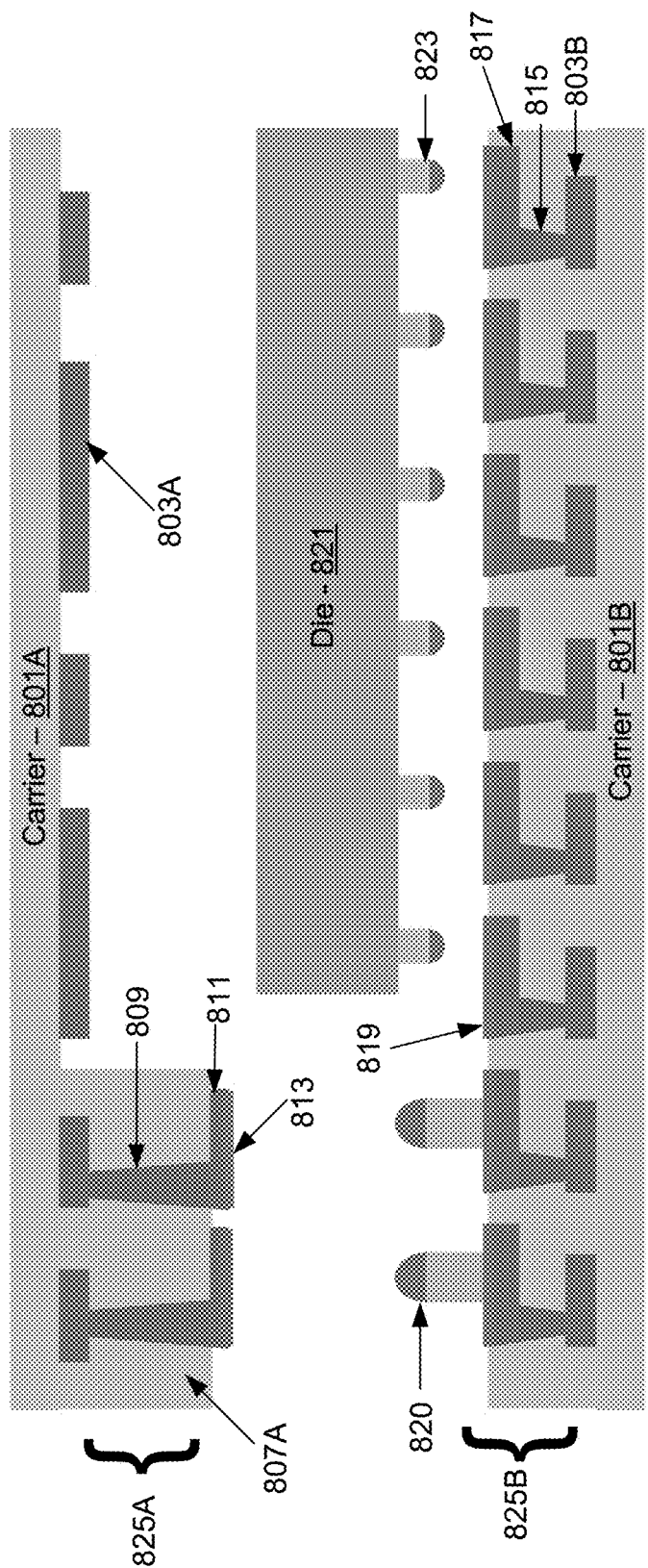

FIG. 8K illustrates the layered structure on the carrier 801B with a solderable surface plate layer 819 formed thereon to provide good contact with subsequently placed copper bumps, as illustrated in FIG. 8L, and one or more semiconductor die to be subsequently affixed, as illustrated in FIG. 8M.

FIG. 8L illustrates the layered structures 825A and 825B fabricated by the steps shown in FIGS. 8A-8K, with solder bumps 820 formed on the solderable surface plate layer 819 on layered structure 825B.

Figure 8N:
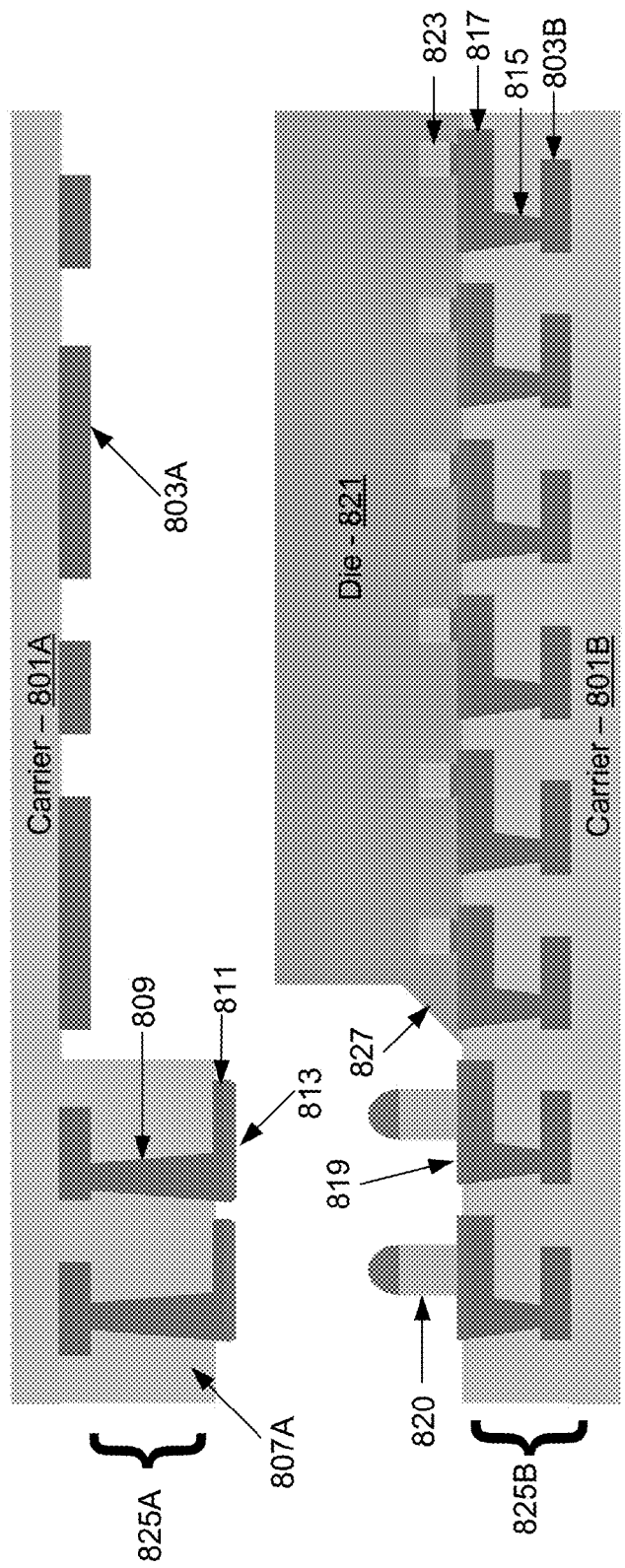

FIG. 8M illustrates the layered structures 825A and 825B formed on the carriers 801A and 801B, respectively, with a semiconductor die 821 with copper pillars 823 to be affixed to the lower layered structure making electrical contact to the RDLs 817 via the solderable surface plate layer 819. FIG. 8N illustrates the die 821 bonded to the layered structure on the carrier 801B utilizing thermal compression and with non-conductive paste 827.

Figure 8O:
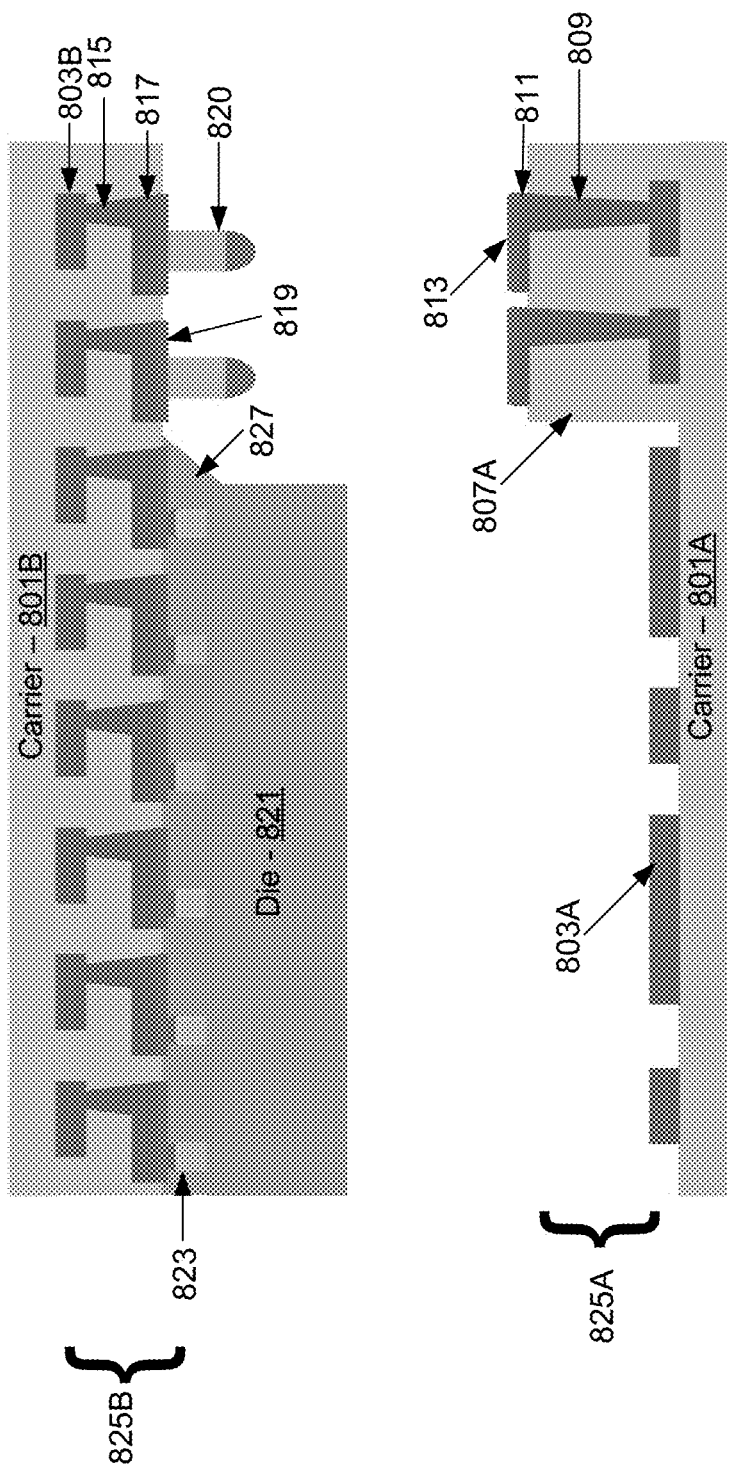
Figure 8P:
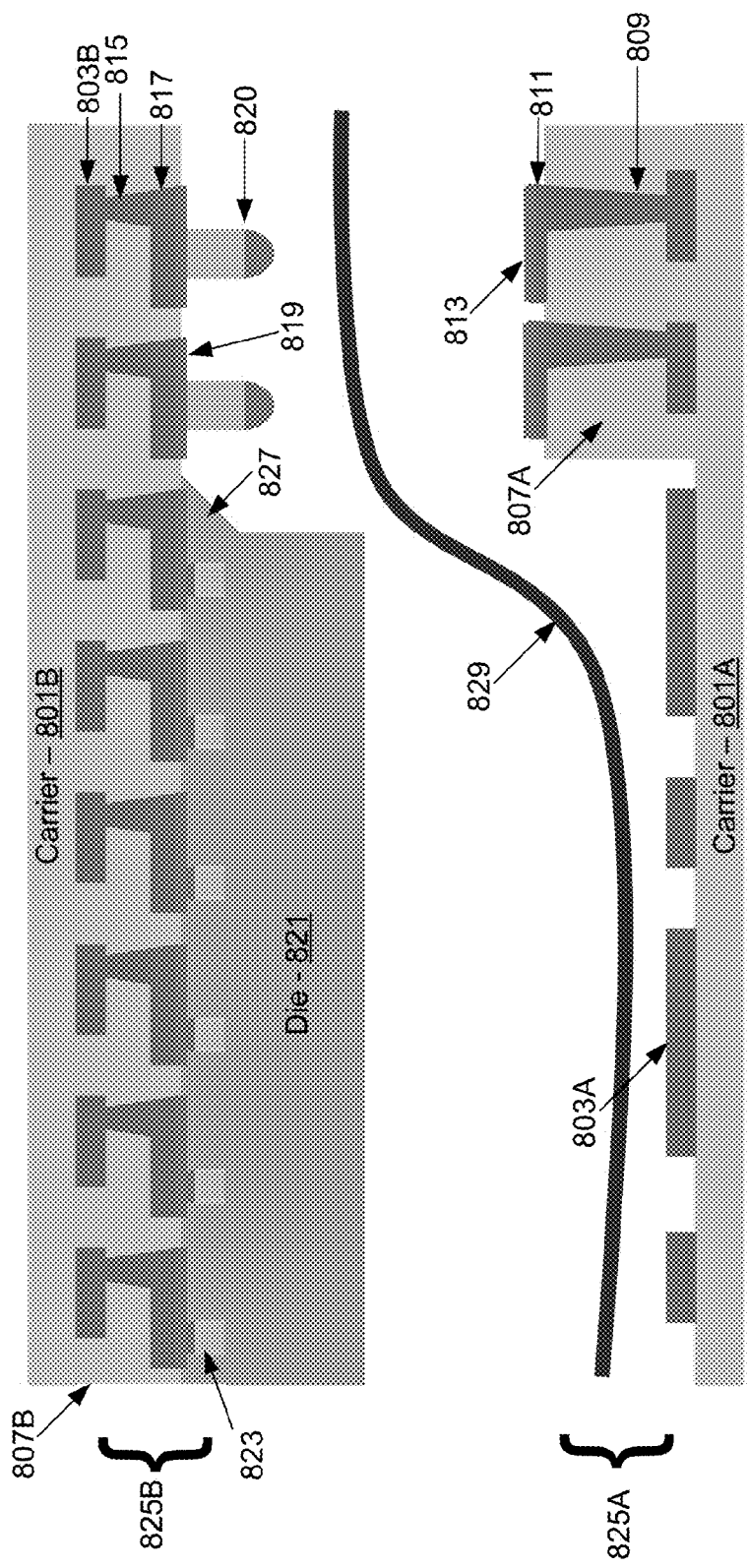

FIG. 8O illustrates the layered structures 825A and 825B in an inverted orientation before being bonding together. To enable bonding, a non-conductive film 829 may be placed between the layered structures 825A and 825B, as shown in FIG. 8P. The non-conductive film 829 is shown as a thin curved line in FIG. 8P merely for illustration purposes, and in application comprises a layer thick enough to fill the space between the layered structures 825A and 825B, as shown in FIG. 8Q.

Figures 8Q, 8R:
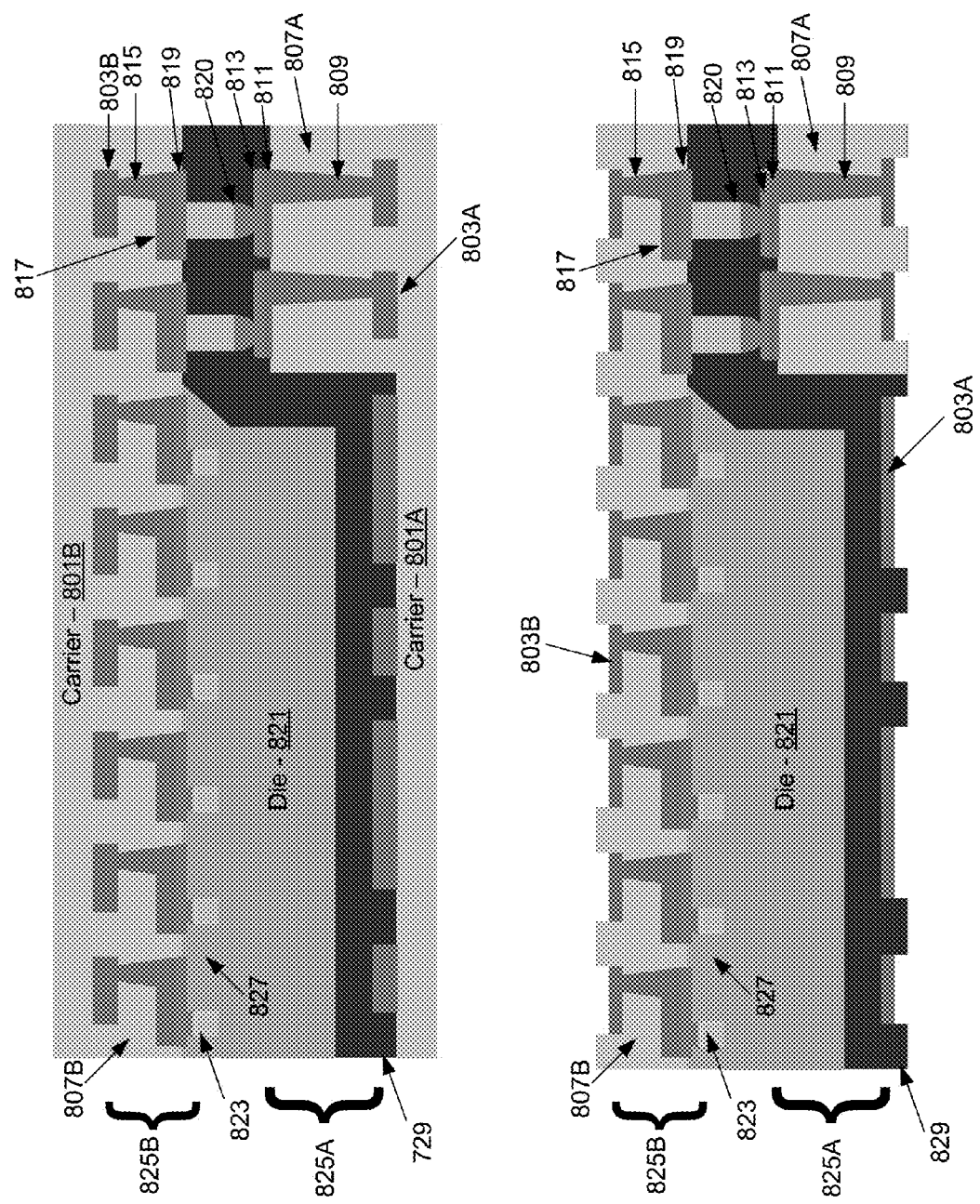

The metal carriers 801A and 801B may be removed, such as by etching or peeling away, for example, resulting in the bonded layered structures 825A and 825B with exposed RDLs 803A and 803B, as shown in FIG. 8R.

Figure 8S:
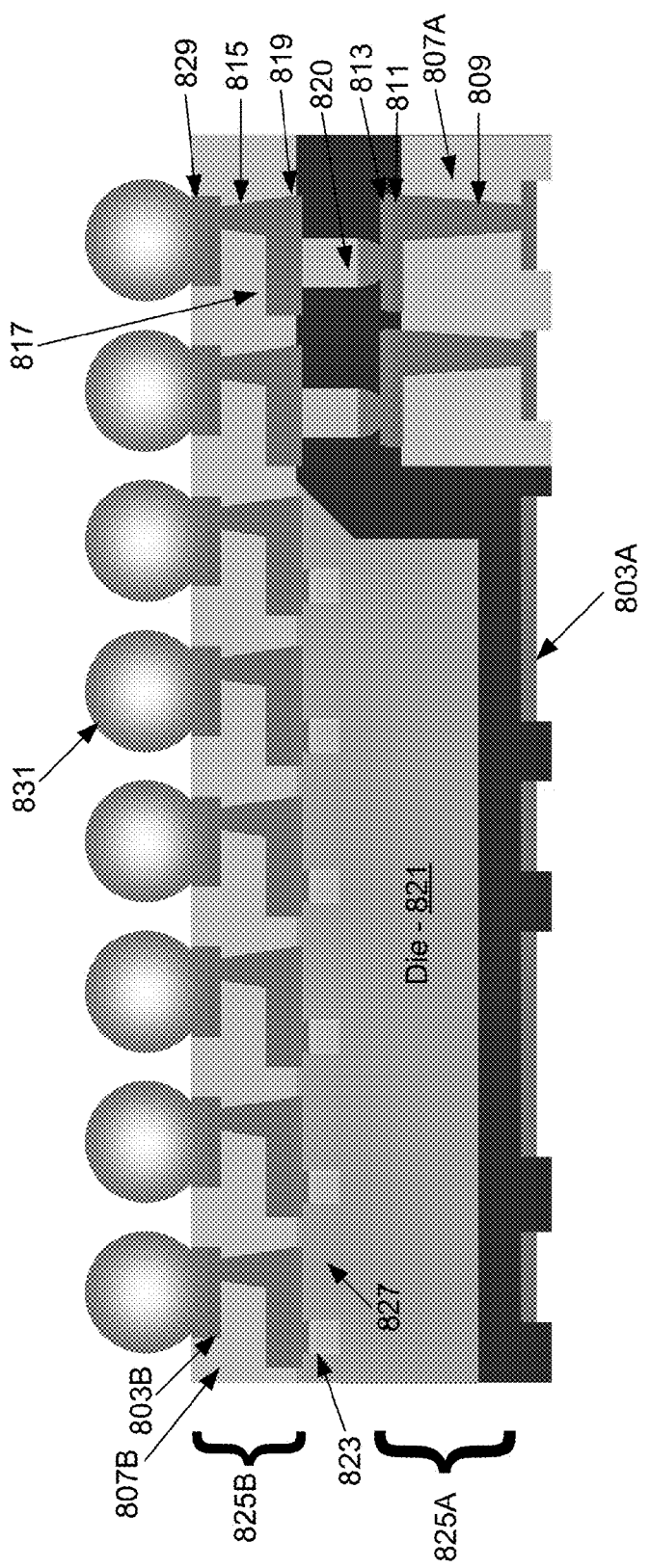
Figure 8T:
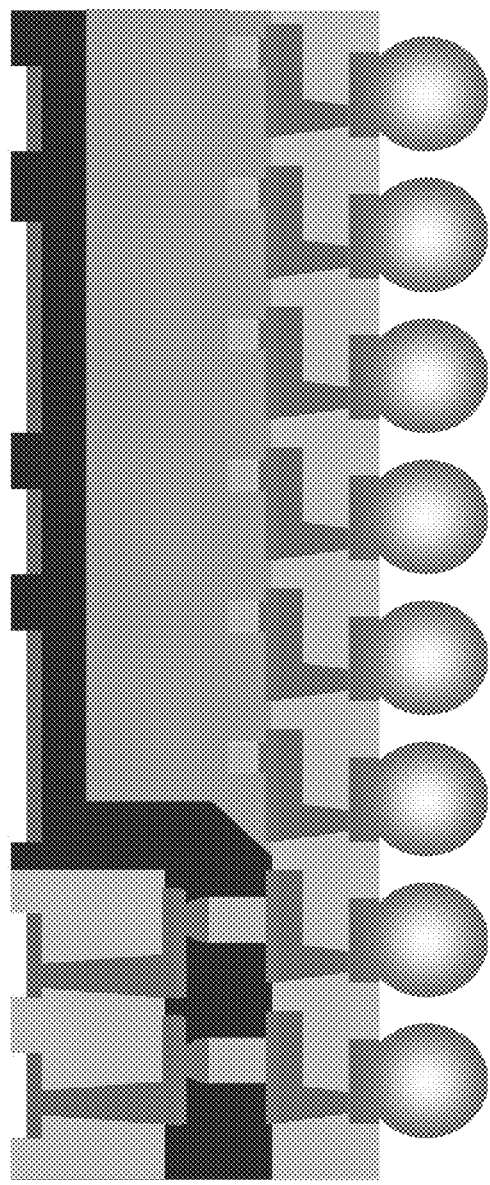

FIG. 8S illustrates the bonded layered structures 825A and 825B with solder balls 831 bonded to the RDLs 803B utilizing flux print layer 829, solder attach, reflow, and clean processes, followed by a singulation step where the substrate may be diced into individual packages, each comprising a die and layered structures 825A and 825B. The final completed structure 800 is shown in FIG. 8T.

Figure 9:
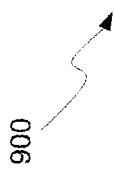
FIG. 9 is a chart illustrating the various fabrication processes for embedded die panels, in accordance with an example embodiment of the invention.

FIG. 9 is a chart illustrating the various fabrication processes for embedded die panels, in accordance with an example embodiment of the invention. The chart 900 illustrates the varied processes, such as a top or bottom cavity, top or bottom copper pillars, and 1 or 2 layer dielectrics. The corresponding figures that illustrates the various combinations is also shown in the chart 900.

In an embodiment of the invention, methods are disclosed for an embedded die panel and may comprise fabricating a first layered structure by: forming first redistribution layers on a first carrier, forming a first dielectric layer on the first redistribution layers and carrier, forming a mask pattern on the first dielectric layer exposing a portion of the first dielectric layer, forming a second dielectric layer on the exposed portion of the first dielectric layer, forming vias in the first and second dielectric layers, forming second redistribution layers on the second dielectric layer, wherein the vias couple the first redistribution layers to the second redistribution layers; and removing the mask pattern thereby forming a die cavity defined by the second dielectric layer.

A second layered structure may be formed comprising a second carrier, a third dielectric layer, third redistribution layers on a first surface of the third dielectric layer and fourth redistribution layers on a second surface of the third dielectric layer. A semiconductor die may be bonded to the second layered structure. The first layered structure may be coupled to the second layered structure, thereby embedding the semiconductor die in the formed cavity in the first layered structure. The carrier may be removed from the first layered structure and the second carrier may be removed from the second layered structure. The semiconductor die may be electrically coupled to the second layered structure utilizing the third redistribution layers on the third dielectric layer.

The second layered structure may be bonded to the first layered structure utilizing an adhesive layer. The first layered structure may be electrically coupled to the second layered structure utilizing copper pillars formed on the second redistribution layers on the first layered structure. The first layered structure may be electrically coupled to the second layered structure utilizing copper pillars formed on the third redistribution layers on the second layered structure. The first and second carriers may comprise a conductive plate, or an etchable or peelable material. The first, second, and third dielectric layers may be ablated to form the vias and second and third redistribution layers. The first and third dielectric layers may comprise one or more of a glass cloth film and a deposited dielectric material. The second dielectric layer may comprise a pre-formed dielectric film. The redistribution layers may comprise electroless copper.

While the invention has been described with reference to certain embodiments, it will be understood by those skilled in the art that various changes may be made and equivalents may be substituted without departing from the scope of the present invention. In addition, many modifications may be made to adapt a particular situation or material to the teachings of the present invention without departing from its scope. Therefore, it is intended that the present invention not be limited to the particular embodiments disclosed, but that the present invention will include all embodiments falling within the scope of the appended claims.

What is claimed is:

1. A method for semiconductor packaging, the method comprising:
    fabricating a first layered structure by:
        forming a first redistribution layer on a first carrier;
        forming a first dielectric layer on the first redistribution layer and first carrier;
        forming a second dielectric layer on a portion of the first dielectric layer thereby defining a die cavity;
        forming a via in the first and second dielectric layers; and
        forming a second redistribution layer on the second dielectric layer, wherein the via couples the first redistribution layer to the second redistribution layer;
    forming a second layered structure comprising a second carrier, a third dielectric layer, a third redistribution layer on a first surface of the third dielectric layer and a fourth redistribution layer on a second surface of the third dielectric layer;
    bonding a semiconductor die to the second layered structure;
    coupling the first layered structure to the second layered structure, thereby embedding the semiconductor die in the die cavity in the first layered structure, and
    removing the first carrier from the first layered structure and the second carrier from the second layered structure.

2. The method according to claim 1, wherein the semiconductor die is electrically coupled to the second layered structure utilizing the third redistribution layer on the third dielectric layer.

3. The method according to claim 1, comprising bonding the second layered structure to the first layered structure utilizing an adhesive layer.

4. The method according to claim 1, comprising electrically coupling the first layered structure to the second layered structure utilizing a copper pillar formed on the second redistribution layer on the first layered structure.

5. The method according to claim 1, wherein the first and second carriers comprise a conductive plate.

6. The method according to claim 1, wherein the first and second carriers comprise an etchable or peelable material.

7. The method according to claim 1, comprising ablating the first, second, and third dielectric layers to form the via and second and third redistribution layers.

8. The method according to claim 1, wherein the first and third dielectric layers comprise one or more of a glass cloth film, a pre-formed dielectric film, and a deposited dielectric material.

9. The method according to claim 1, wherein the second dielectric layer comprises a pre-formed dielectric film.

10. The method according to claim 1, wherein one or more of the first, second, third, and fourth redistribution layers comprise electroless copper.

11. The method according to claim 1, comprising forming a solderable surface plate layer on one or more of the first, second, third, and fourth redistribution layers.

12. A method for semiconductor packaging, the method comprising:
   providing a first layered structure comprising:
      a first redistribution layer;
      a first dielectric layer on the first redistribution layer;
      a second dielectric layer on a portion of the first dielectric layer,
   the first and second dielectric layers defining a die cavity;
      a via in the first and second dielectric layers; and
      a second redistribution layer on the second dielectric layer;
      wherein the via couples the first redistribution layer to the second redistribution layer;
   providing a second layered structure comprising:
      a third dielectric layer,
      a third redistribution layer at a first surface of the third dielectric layer; and
      a fourth redistribution layer at a second surface of the third dielectric layer;
   bonding a semiconductor die to the second layered structure; and
   coupling the first layered structure to the second layered structure, thereby embedding the semiconductor die in the die cavity in the first layered structure.

13. The method according to claim 12, wherein the semiconductor die is electrically coupled to the second layered structure utilizing the third redistribution layer on the third dielectric layer.

14. The method according to claim 12, comprising bonding the second layered structure to the first layered structure utilizing an adhesive layer.

15. The method according to claim 12, comprising electrically coupling the first layered structure to the second layered structure utilizing a copper pillar formed on the second redistribution layer on the first layered structure.

16. The method according to claim 12, wherein the first, second, and third dielectric layers are ablated to form the via and second and third redistribution layers.

17. The method according to claim 12, wherein the first and third dielectric layers comprise one or more of a glass cloth film, a pre-formed dielectric film, and a deposited dielectric material.

18. The method according to claim 12, wherein the second dielectric layer comprises a pre-formed dielectric film.

19. The method according to claim 12, wherein one or more of the first, second, third, and fourth redistribution layers comprise electroless copper.

20. The method according to claim 12, comprising wherein a solderable surface plate layer is formed on one or more of the first, second, third, and fourth redistribution layers.

* * * * *